US010968387B2

(12) United States Patent
Hirosaki et al.

(10) Patent No.: US 10,968,387 B2
(45) Date of Patent: Apr. 6, 2021

(54) PHOSPHOR, METHOD FOR PRODUCTION SAME, LIGHT EMITTING DEVICE, IMAGE DISPLAY, PIGMENT AND ULTRAVIOLET LIGHT ABSORBER

(71) Applicant: National Institute for Materials Science, Ibaraki (JP)

(72) Inventors: Naoto Hirosaki, Ibaraki (JP); Yuichi Michiue, Ibaraki (JP); Shiro Funahashi, Ibaraki (JP); Takashi Takeda, Ibaraki (JP)

(73) Assignee: National Institute for Materials Science, Tsukuba (JP)

( * ) Notice: Subject to any disclaimer, the term of this patent is extended or adjusted under 35 U.S.C. 154(b) by 341 days.

(21) Appl. No.: 16/090,112

(22) PCT Filed: Mar. 27, 2017

(86) PCT No.: PCT/JP2017/012480
§ 371 (c)(1),
(2) Date: Sep. 28, 2018

(87) PCT Pub. No.: WO2017/170453
PCT Pub. Date: Oct. 5, 2017

(65) Prior Publication Data
US 2019/0112526 A1    Apr. 18, 2019

(30) Foreign Application Priority Data

Mar. 28, 2016  (JP) .............................. JP2016-064759
Mar. 28, 2016  (JP) .............................. JP2016-064760
(Continued)

(51) Int. Cl.
*C09K 11/64*     (2006.01)
*C09C 1/40*      (2006.01)
(Continued)

(52) U.S. Cl.
CPC ................ *C09K 11/64* (2013.01); *C09C 1/28* (2013.01); *C09C 1/40* (2013.01); *C09K 3/00* (2013.01);
(Continued)

(58) Field of Classification Search
CPC ............ C09K 11/7706; C09K 11/7721; C09K 11/7734; C09K 11/7749; C09K 11/7758; C09K 11/7764
See application file for complete search history.

(56) References Cited

U.S. PATENT DOCUMENTS

| 7,431,864 B2* | 10/2008 | Hirosaki | ............... C04B 35/597 252/301.4 R |
| 9,828,547 B2* | 11/2017 | Hirosaki | ............ C09K 11/7734 |

(Continued)

FOREIGN PATENT DOCUMENTS

| JP | 3668770 | 7/2005 |
| JP | 3837551 | 10/2006 |

(Continued)

OTHER PUBLICATIONS

X.W. Zhu et al: "Synthesis and photoluminescence of blue-emitting 15R-sialon: Eu2+ phosphors". Journal of Alloys and Compounds., vol. 496, No. 1-2, Apr. 1, 2010 (Apr. 1, 2010). pp. 407-412. XP055560949, CH ISSN: 0925-8388, DOI: 10.1016/j.jallcom 2010 02.0361.*

(Continued)

*Primary Examiner* — C Melissa Koslow
(74) *Attorney, Agent, or Firm* — Trojan Law Offices

(57) ABSTRACT

A phosphor, combined with LED having not exceeding 470 nm, of high emission intensity and with chemical and thermal stability is provided. The phosphor according to the present invention comprises an inorganic compound in which element A (A is one or two or more kinds of elements (Continued)

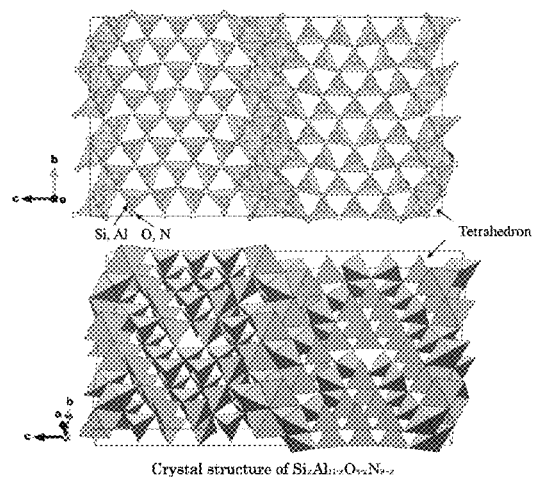

Crystal structure of $Si_zAl_{12-z}O_{z}N_{16-z}$ selected from Mn, Ce, Pr, Nd, Sm, Eu, Tb, Dy, and Yb) is solid solved in an inorganic crystal including at least metal element M and non-metal element X and represented by $M_nX_{n+1}$ ($3 \leq n \leq 52$), an inorganic crystal having the same crystal structure, or an inorganic crystal including a solid solution thereof. Here, M comprises at least Al and Si, and if necessary element L (L is a metal element other than Al and Si) and X comprises N, O if necessary, and element Z if necessary (Z is a non-metal element other than N and O).

10 Claims, 14 Drawing Sheets

(30) Foreign Application Priority Data

| Mar. 28, 2016 | (JP) | JP2016-064761 |
|---|---|---|
| Mar. 28, 2016 | (JP) | JP2016-064762 |
| Mar. 28, 2016 | (JP) | JP2016-064763 |

(51) Int. Cl.

| C09K 3/00 | (2006.01) |
|---|---|
| C09C 1/28 | (2006.01) |
| H01L 33/50 | (2010.01) |
| H01J 1/60 | (2006.01) |
| C09K 11/77 | (2006.01) |
| C09K 11/57 | (2006.01) |
| H01L 33/26 | (2010.01) |
| H01J 1/63 | (2006.01) |

(52) U.S. Cl.
CPC ......... *C09K 11/57* (2013.01); *C09K 11/7706* (2013.01); *C09K 11/7715* (2013.01); *C09K 11/7721* (2013.01); *C09K 11/7728* (2013.01); *C09K 11/7734* (2013.01); *C09K 11/7743* (2013.01); *C09K 11/7749* (2013.01); *C09K 11/7756* (2013.01); *C09K 11/7758* (2013.01); *C09K 11/7759* (2013.01); *C09K 11/7764* (2013.01); *H01J 1/63* (2013.01); *H01L 33/26* (2013.01); *H01L 33/50* (2013.01); *H01L 33/502* (2013.01); *Y02B 20/00* (2013.01)

(56) References Cited

U.S. PATENT DOCUMENTS

| 10,479,935 | B2* | 11/2019 | Hirosaki | C01F 17/30 |
|---|---|---|---|---|
| 2006/0192178 | A1 | 8/2006 | Hirosaki | |
| 2007/0007494 | A1 | 1/2007 | Hirosaki | |
| 2007/0018567 | A1 | 1/2007 | Hirosaki | |
| 2007/0108896 | A1 | 5/2007 | Hirosaki | |
| 2009/0236969 | A1 | 9/2009 | Hirosaki | |
| 2011/0121234 | A1 | 5/2011 | Hirosaki | |
| 2013/0240943 | A1 | 9/2013 | Schmidt et al. | |
| 2015/0146408 | A1 | 5/2015 | Hirosaki | |
| 2016/0096991 | A1 | 4/2016 | Hirosaki | |

FOREIGN PATENT DOCUMENTS

| JP | 4524368 | | 8/2010 |
|---|---|---|---|
| JP | 2012-046625 | | 3/2012 |
| JP | 2012-046625 | * | 8/2012 |
| JP | 2015-110708 | | 6/2015 |
| WO | WO 2014/185415 | * | 11/2014 |

OTHER PUBLICATIONS

Supplemental European Search Report (SESR) of the equivalent European patent application No. 17 774 990.0.

* cited by examiner

Crystal structure of $Si_xAl_{11-x}O_{3-x}N_{9+x}$

Powder XRD pattern of $Si_xAl_{11-x}O_{3-x}N_{9+x}$ calculated from single crystal structure analysis result Crystal structure of $Si_xAl_{12-x}O_{3-x}N_{10+x}$ Powder XRD pattern of $Si_xAl_{12-x}O_{3-x}N_{10+x}$ calculated from single crystal structure analysis result Crystal structure of $Si_xAl_{13-x}O_{3-x}N_{11+x}$ Powder XRD pattern of $Si_xAl_{13-x}O_{3-x}N_{11+x}$ calculated from single crystal structure analysis result Crystal structure of $Si_xAl_{14-x}O_{3-x}N_{12+x}$ Powder XRD pattern of $Si_xAl_{14-x}O_{3-x}N_{12+x}$ calculated from single crystal structure analysis result Crystal structure of $Si_xAl_{15-x}O_{3-x}N_{13+x}$ Powder XRD pattern of $Si_xAl_{15-x}O_{3-x}N_{13+x}$ calculated from single crystal structure analysis result Powder XRD pattern of Example A48 (actual measurement)

Excitation and emission spectrum of Example A48

Powder XRD pattern of Example B53 (actual measurement)

Excitation and emission spectrum of Example B53

Powder XRD pattern of Example C51 (actual measurement)

Excitation and emission spectrum of Example C51

Powder XRD pattern of Example D51 (actual measurement)

Excitation and emission spectrum of Example D51

Powder XRD pattern of Example E51 (actual measurement)

Excitation and emission spectrum of Example E51

PHOSPHOR, METHOD FOR PRODUCTION SAME, LIGHT EMITTING DEVICE, IMAGE DISPLAY, PIGMENT AND ULTRAVIOLET LIGHT ABSORBER

TECHNICAL FIELD

The present invention relates to a phosphor, a manufacture thereof, and an application thereof, wherein the phosphor comprises: an inorganic crystal including at least a metal element M and a non-metal element X and being represented by $M_nX_{n+1}$, an inorganic crystal having the same crystal structure thereof, or an inorganic crystal including a solid solution of these crystals, as a host crystal.

BACKGROUND ART

The phosphor is utilized in a fluorescent display tube (VFD: Vacuum-Fluorescent Display), a field emission display (FED: Field Emission Display or SED: Surface-Conduction Electron-Emitter Display), a plasma display panel (PDP: Plasma Display Panel), a cathode-ray tube (CRT: Cathode-Ray Tube), a liquid-crystal display backlight (Liquid-Crystal Display Backlight), a white light-emitting diode (LED: Light-Emitting Diode), and so on. In any of these applications, it is necessary to provide the phosphor with energy to excite the phosphor in order to make the phosphor emit fluorescence and the phosphor is excited by an excitation source with high energy such as a vacuum ultraviolet ray, an ultraviolet ray, an electron beam, and blue light so as to emit a visible light ray such as blue light, green light, yellow light, orange light, and red light. However, as a result of the phosphor being exposed to such excitation source, the luminance of the phosphor tends to decrease and a phosphor having little degradation in the brightness is desired. Therefore, a phosphor having an inorganic crystal containing nitrogen in a crystal structure thereof as a host crystal, instead a phosphor such as a silicate phosphor, a phosphate phosphor, an aluminate phosphor, and a sulfide phosphor, has been proposed, as exemplified by a sialon phosphor, an oxynitride phosphor, or a nitride phosphor, which is characterized by low brightness deterioration caused by high energy excitation.

An example of the sialon phosphors is manufactured by a manufacturing process as generally described below. First, silicon nitride ($Si_3N_4$), aluminum nitride (AlN), and europium oxide ($Eu_2O_3$) are mixed in predetermined molar ratios and the resultant mixture is fired by a hot press method in one atmospheric pressure (0.1 MPa) of nitrogen atmosphere at 1700° C. for one hour (for example, refer to Patent Reference 1). It was reported that α-sialon activated with an $Eu^{2+}$ ion manufactured by the above process had become a phosphor emitting light of a yellow color in a wavelength range of 550 nm to 600 nm if excited by blue light having a wavelength range of 450 to 500 nm. And it is known that an emission wavelength may vary as a ratio of Si to Al or a ratio of oxygen to nitrogen is changed while the α-sialon crystal structure is maintained (for example, refer to Patent References 2 and 3).

As another example of the sialon phosphor, a green phosphor in which R type sialon is activated by $Eu^{2+}$ is known (refer to Patent Reference 4). It is known that, in the phosphor, an emission wavelength thereof may shift to a shorter wavelength by changing the oxygen content while the crystal structure remains the same (for example, refer to Patent Reference 5). Moreover, it is known that a blue phosphor is to be formed when activated by $Ce^{3+}$ (for example, refer to Patent Reference 6).

As an example of an oxynitride phosphor, a blue phosphor having a JEM phase ($LaAl(Si_{6-z}Al_z)N_{10-z}O_z$) as a host crystal, which is activated by Ce (refer to Patent Reference 7), is known. It is known that, in the phosphor, an emission wavelength thereof may shift to a longer wavelength as well as an excitation wavelength thereof may shift to a longer wavelength by substituting part of La with Ca while the crystal structure remains the same.

As another example of the oxynitride phosphor, a blue phosphor having a La—N crystal $La_3Si_8N_{11}O_4$ as a host crystal, which is activated by Ce, is known (refer to Patent Reference 8).

As an example of the nitride phosphor, a red phosphor having a crystal of $CaAlSiN_3$ as a host crystal, which is activated by $Eu^{2+}$, is known (refer to Patent Reference 9) Color rendering properties of a white LED are improved by utilizing this phosphor. A phosphor to which Ce was added as the optically activating element was reported to be an orange phosphor.

Thus, an emission color of the phosphor is determined by a combination of the crystal to act as the host crystal and a metal ion (activating ion) being incorporated into the crystal. Further, the combination of the host crystal and the activating ion determines emission characteristics such as an emission spectrum and an excitation spectrum, chemical stability, and thermal stability such that a phosphor is regarded as another different phosphor when a host crystal thereof or an activating ion thereof is different. Moreover, a material having a different crystal structure is different in the emission characteristics or in the stability because the host crystal is different even if the material has the same chemical composition such that the material is regarded as another different phosphor.

Further, kinds of constituent elements can be substituted in many phosphors while the same crystal structure of the host crystal is maintained, thereby changing the emission color. For example, although a phosphor having a YAG crystal to which Ce is added emits light of a green color, a phosphor having a YAG crystal in which Y is partially substituted with Gd and Al is partially substituted with Ga exhibits emission of a yellow color. Further, in a phosphor having $CaAlSiN_3$ to which Eu is added, it is known that a composition thereof varies by partially substituting Ca with Sr while the same crystal structure is maintained such that the emission wavelength shifts to a shorter wavelength. In this way, such a phosphor in which element substitution is performed while the same crystal structure is maintained is regarded as a material of the same group.

From the described above, it is important to find a host crystal having a new crystal structure in developing a new phosphor and it is possible to propose a new phosphor by activating such a host crystal with an emission-causing metal ion to make the host crystal exhibit luminescence characteristics.

PRIOR ART REFERENCES

Patent References

[Patent Reference 1] Japanese Patent No. 3668770, Specification
[Patent Reference 2] Japanese Patent No. 3837551, Specification.
[Patent Reference 3] Japanese Patent No. 4524368, Specification.

[Patent Reference 4] Japanese Patent No. 3921545, Specification.
[Patent Reference 5] International Publication No. WO2007/066733.
[Patent Reference 6] International Publication No. WO2006/101096.
[Patent Reference 7] International Publication No. WO2005/019376.
[Patent Reference 8] Japanese Patent Application Publication No. 2005-112922.
[Patent Reference 9] Japanese Patent No. 3837588, Specification.

SUMMARY OF THE INVENTION

Problem to be Solved by the Invention

The present invention aims to satisfy such demand and it is one of the objects to provide an inorganic phosphor that has emission characteristics (emission color and excitation characteristics, emission spectrum) different from those of a conventional phosphor, exhibits high emission intensity even when combined with an LED with a wavelength of 470 nm or less, and is chemically and thermally stable. It is another object of the present invention to provide a light-emitting device that utilizes such a phosphor and is excellent in durability and an image display device that utilizes such a phosphor and is excellent in durability. Further, it is also an object of the present invention to provide a pigment and an ultraviolet absorber utilizing the above phosphor.

Means to Solve the Problem

Under such a situation, the present inventors investigated in detail a phosphor having, as a host, a new crystal containing nitrogen and a crystal in which a metal element or N in the crystal structure is substituted by another kind of element, so as to find out that an inorganic compound in which a light-emitting ion is solid solved in an inorganic crystal having, as a host crystal, an inorganic crystal including at least a metal element M and a non-metal element X and being represented by $M_nX_{n+1}$ (Here, n is a value in the range of $3 \leq n \leq 52$), an inorganic crystal having the same crystal structure thereof, or an inorganic crystal including a solid solution of these crystals might be a new phosphor.

In particular, it was found out that a phosphor having, as a host crystal, an inorganic crystal represented by $(Si,Al)_n(O,N)_{n+1}$, an inorganic crystal having the same crystal structure thereof, or an inorganic crystal including a solid solution of these might be a phosphor to emit fluorescence of high intensity. Further, it was found out that a phosphor having, as a host crystal, an inorganic crystal represented by $Si_xAl_{11-x}O_{3-x}N_{9+x}$ ($0<x\leq3$), an inorganic crystal having the same crystal structure thereof, or an inorganic crystal including a solid solution of these might be a phosphor to emit fluorescence of high intensity. And, it was found out that a phosphor having, as a host crystal, an inorganic crystal represented by $Si_xAl_{12-x}O_{3-x}N_{10+x}$ ($0<x\leq3$), an inorganic crystal having the same crystal structure thereof, or an inorganic crystal including a solid solution of these might be a phosphor to emit fluorescence of high intensity. And, it was found out that a phosphor having, as a host crystal, an inorganic crystal represented by $Si_xAl_{13-x}O_{3-x}N_{11+x}$ ($0<x\leq3$), an inorganic crystal having the same crystal structure thereof, or an inorganic crystal including a solid solution of these might be a phosphor to emit fluorescence of high intensity. And, it was found out that a phosphor having, as a host crystal, an inorganic crystal represented by $Si_xAl_{14-x}O_{3-x}N_{12+x}$ ($0<x\leq3$), an inorganic crystal having the same crystal structure thereof, or an inorganic crystal including a solid solution of these might be a phosphor to emit fluorescence of high intensity. And, it was found out that a phosphor having, as a host crystal, an inorganic crystal represented by $Si_xAl_{15-x}O_{3-x}N_{13+x}$ ($0<x\leq3$), an inorganic crystal having the same crystal structure thereof, or an inorganic crystal including a solid solution of these might be a phosphor to emit fluorescence of high intensity. Further, it was also found out that the phosphor having a specific composition emitted fluorescence of a blue color to a green color.

Further, it was found that a white color light-emitting diode (light-emitting device) with a high emission efficiency and a small temperature fluctuation, an illuminating device with the same diode, and an image display device rendering bright coloring could be obtained by utilizing such a phosphor.

The present inventors conducted an intensive investigation in consideration of the above-mentioned background so as to successfully provide a phosphor rendering emission with a high intensity of a specific wavelength region by implementing configurations as described below. Further, a phosphor having excellent emission characteristics was successfully manufactured by employing a method described below. Further, by utilizing such a phosphor and implementing configurations as described below, a light-emitting device, an illuminating device, an image display device, a pigment, and an ultraviolet absorber having excellent features were also successfully provided and such configurations are as follows.

A phosphor according to the present invention includes an inorganic compound in which an A element (Here, A is one or two or more kinds of elements selected from the group consisting of Mn, Ce, Pr, Nd, Sm, Eu, Tb, Dy, and Yb.) is solid solved in an inorganic crystal including at least a metal element M and a non-metal element X and being represented by $M_nX_{n+1}$ (Here, n is a value in the range of $3\leq n\leq52$), an inorganic crystal having the same crystal structure thereof, or an inorganic crystal including a solid solution of these, thereby solving the above issue. Here, the metal element M includes at least Al (aluminum) and Si (silicon), and, if necessary, an element L (Here, the element L is a metal element other than Al and Si) and the non-metal element X includes at least N (nitrogen) and, if necessary, O (oxygen), and, if necessary, an element Z (Here, the element Z is a non-metal element other than N and O). The inorganic crystal represented by $M_nX_{n+1}$ may include an inorganic crystal represented by $Si_xAl_{m+2-x}O_{3-x}N_{m+x}$ (Here, m=n-2, $0<x\leq3$, and $1\leq m\leq50$). The inorganic crystal represented by $M_nX_{n+1}$ may have a homologous structure. The value of x may be in the range of $1.5\leq x\leq3$. The value of x may be in the range of $2\leq x\leq2.9$. The value of m may be in the range of $5\leq m\leq20$. The value of n may be a value of integer. The value of n may be in the range of $9\leq n\leq15$. The inorganic crystal may be a crystal in the orthorhombic crystal system. The inorganic crystal may be a crystal represented by the space group Cmcm.

The inorganic crystal may be a crystal in the orthorhombic crystal system and have a symmetry in a space group Cmcm, and lattice constants a1, b1 and c1 may have values in the ranges:
a1=0.31±0.05 nm;
b1=1.87±0.2 nm; and
c1=0.275×(n+1)±0.1 nm (Here, $3\leq n\leq52$).

(1) In the case where n is an even number, the atomic coordinates Mi of the element M included in the unit cell may be:

(0, (4+6i−3n)/16±0.05, (¼+(i−1)/(2n))±0.05), wherein 1≤i≤n+1 (It is n+1 in all), and the atomic coordinates Xi of the element X may be:

(0, (4+6i−3n)/16±0.05, (¼+(i−1)/(2n+1))±0.05), wherein 1≤i≤n+2 (It is n+2 in all);

(2) In the case where n is an odd number, the atomic coordinates Mj of the element M included in the unit cell may be:

(0, (8+6j−3n)/16±0.05, (¼+(j−1)/(2n))±0.05), wherein 1≤j≤n+1 (It is n+1 in all), and the atomic coordinates Xj of the element X may be:

(0, (4+6j−3n)/16±0.05, (¼+(j−1)/(2n+1))±0.05), wherein 1≤j≤n+2 (It is n+2 in all).

The inorganic crystal having the same crystal structure may be an inorganic crystal represented by $(Si, Al)_{11}(O, N)_{12}$. The inorganic crystal represented by $Si_xAl_{11-x}O_{3-x}N_{9+x}$, the inorganic crystal having the same crystal structure as the above-mentioned inorganic crystal, or the inorganic crystal including a solid solution of these may be a crystal in the orthorhombic crystal system and have a symmetry in a space group Cmcm, and lattice constants a1, b1 and c1 may have values in the ranges:
a1=0.30697±0.05 nm;
b1=1.86460±0.05 nm; and
c1=3.29300±0.05 nm.

And the inorganic crystal represented by $M_nX_{n+1}$ may be an inorganic crystal represented by $Si_xAl_{12-x}O_{3-x}N_{10+x}$ (Here, 0<x≤3). The inorganic crystal having the same crystal structure may be an inorganic crystal represented by $(Si,Al)_{12}(O,N)_{13}$. The inorganic crystal represented by $Si_xAl_{12-x}O_{3-x}N_{10+x}$, the inorganic crystal having the same crystal structure as the above-mentioned inorganic crystal, or the inorganic crystal including a solid solution of these may be a crystal in the orthorhombic crystal system and have a symmetry in the space group Cmcm, and lattice constants a1, b1 and c1 may have values in the ranges:
a1=0.30745±0.05 nm;
b1=1.86919±0.05 nm; and
c1=3.57830±0.05 nm.

The inorganic crystal having the same crystal structure may be an inorganic crystal represented by $(Si,Al)_{13}(O,N)_{14}$. The inorganic crystal represented by $Si_xAl_{13-x}O_{3-x}N_{11+x}$, the inorganic crystal having the same crystal structure as the above-mentioned inorganic crystal, or the inorganic crystal including a solid solution of these may be a crystal in the orthorhombic crystal system and have a symmetry in the space group Cmcm, and lattice constants a1, b1 and c1 may have values in the ranges:
a1=0.30749±0.05 nm;
b1=1.87065±0.05 nm; and
c1=3.85432±0.05 nm.

The inorganic crystal having the same crystal structure may be an inorganic crystal represented by $(Si,Al)_{14}(O,N)_{15}$. The inorganic crystal represented by $Si_xAl_{14-x}O_{3-x}N_{12+x}$, the inorganic crystal having the same crystal structure as the above-mentioned inorganic crystal, or the inorganic crystal including a solid solution of these may be a crystal in the orthorhombic crystal system and have a symmetry in the space group Cmcm, and lattice constants a1, b1 and c1 may have values in the ranges:
a1=0.30722±0.05 nm;
b1=1.87210±0.05 nm; and
c1=4.14890±0.05 nm.

The inorganic crystal having the same crystal structure may be an inorganic crystal represented by $(Si,Al)_{15}(O,N)_{16}$. The inorganic crystal represented by $Si_xAl_{15-x}O_{3-x}N_{13+x}$, the inorganic crystal having the same crystal structure as the above-mentioned inorganic crystal, or the inorganic crystal including a solid solution of these may be a crystal in the orthorhombic crystal system and have a symmetry in the space group Cmcm, and lattice constants a1, b1 and c1 may have values in the ranges:
a1=0.30810±0.05 nm;
b1=1.87354±0.05 nm; and
c1=4.41775±0.05 nm.

The inorganic compound may be represented by the composition formula of $Si_aAl_bO_cN_dA_eQ_f$ (Here, a+b+c+d+e+f=1 in the formula and A may be one or two or more kinds of elements selected from the group consisting of Mn, Ce, Pr, Nd, Sm, Eu, Tb, Dy, and Yb (Here, the element A may be Eu.) and Q may be one or two or more kinds of elements selected from the group consisting of elements other than Al, Si, O, N, and the element A.) and parameters a, b, c, d, e, and f may satisfy every condition recited below:
0.0117≤a≤0.3472,
0.0694≤b≤0.4812,
0≤c≤0.2283,
0.3261≤d≤0.53,
0.0001≤e≤0.03, and
0≤f≤0.3 (Here, if the element Q includes a plurality of elements, f is the sum of respective parameters of the plurality of elements).

The parameters a, b, c, d, e, and f may be values in the ranges that satisfy all conditions recited below:
0.015≤a≤0.1299,
0.3463≤b<0.48,
0≤c<0.125,
0.39<d<0.52,
0.0001≤e≤0.03, and
0≤f≤0.3.

The parameters a, b, c, d, e, and f may be values in the ranges that satisfy all conditions recited below:
0.0216≤a≤0.1299,
0.3463≤b≤0.4545,
0≤c≤0.1082,
0.4113≤d≤0.5195,
0.0001≤e≤0.0196, and
0≤f≤0.0233.

The parameters a, b, c, d, e, and f may be values in the ranges that satisfy all conditions recited below:
0.0647≤a≤0.1299,
0.3463≤b≤0.4095,
0≤c≤0.0647,
0.4526≤d≤0.5195,
0.0001≤e≤0.0196, and
0≤f≤0.0233.

The parameters a, b, c, d, e, and f may be values in the ranges that satisfy all conditions recited below:
0.0866≤a≤0.1299,
0.3463≤b≤0.3896,
0≤c≤0.0433,
0.4762≤d≤0.5195,
0.0004≤e≤0.0196, and
0≤f≤0.0233.

The parameters a, b, c, d, e, and f may be values in the ranges that satisfy all conditions recited below:
0.015≤a≤0.12,
0.35≤b<0.48,
0≤c<0.123,
0.3968<d<0.52, $0.0001 \leq e \leq 0.03$, and
$0 \leq f \leq 0.3$.

The parameters a, b, c, d, e, and f may be values in the ranges that satisfy all conditions recited below:
$0.0199 \leq a \leq 0.1195$,
$0.3586 \leq b \leq 0.4582$,
$0 \leq c \leq 0.0996$,
$0.4183 \leq d \leq 0.5179$,
$0.0001 \leq e \leq 0.0196$, and
$0 \leq f \leq 0.0233$.

The parameters a, b, c, d, e, and f may be values in the ranges that satisfy all conditions recited below:
$0.078 \leq a \leq 0.1195$,
$0.3586 \leq b \leq 0.4$,
$0 \leq c \leq 0.045$,
$0.475 \leq d \leq 0.5179$,
$0.0004 \leq e \leq 0.0196$, and
$0 \leq f \leq 0.0233$.

The parameters a, b, c, d, e, and f may be values in the ranges that satisfy all conditions recited below:
$0.014 \leq a \leq 0.111$,
$0.369 \leq b < 0.48$,
$0 \leq c < 0.111$,
$0.406 < d < 0.517$,
$0.0001 \leq e \leq 0.03$, and
$0 \leq f \leq 0.3$.

The parameters a, b, c, d, e, and f may be values in the ranges that satisfy all conditions recited below:
$0.0185 \leq a \leq 0.1107$,
$0.369 \leq b \leq 0.4613$,
$0 \leq c \leq 0.0923$,
$0.4244 \leq d \leq 0.5166$,
$0.0001 \leq e \leq 0.0196$, and
$0 \leq f \leq 0.0233$.

The parameters a, b, c, d, e, and f may be values in the ranges that satisfy all conditions recited below:
$0.05 \leq a \leq 0.1107$,
$0.369 \leq b \leq 0.43$,
$0 \leq c \leq 0.056$,
$0.45 \leq d \leq 0.5166$,
$0.0001 \leq e \leq 0.0196$, and
$0 \leq f \leq 0.0233$.

The parameters a, b, c, d, e, and f may be values in the ranges that satisfy all conditions recited below:
$0.0738 \leq a \leq 0.1107$,
$0.369 \leq b \leq 0.4059$,
$0 \leq c \leq 0.0369$,
$0.4797 \leq d \leq 0.5166$,
$0.0004 \leq e \leq 0.0196$, and
$0 \leq f \leq 0.0233$.

The parameters a, b, c, d, e, and f may be values in the ranges that satisfy all conditions recited below:
$0.012 \leq a \leq 0.1031$,
$0.378 \leq b < 0.48$,
$0 \leq c < 0.103$,
$0.412 < d < 0.516$,
$0.0001 \leq e \leq 0.03$, and
$0 \leq f \leq 0.3$.

The parameters a, b, c, d, e, and f may be values in the ranges that satisfy all conditions recited below:
$0.0172 \leq a \leq 0.1031$,
$0.378 \leq b \leq 0.4639$,
$0 \leq c \leq 0.0859$,
$0.4296 \leq d \leq 0.5155$,
$0.0001 \leq e \leq 0.0196$, and
$0 \leq f \leq 0.0233$.

The parameters a, b, c, d, e, and f may be values in the ranges that satisfy all conditions recited below:
$0.0515 \leq a \leq 0.1031$,
$0.378 \leq b \leq 0.4296$,
$0 \leq c \leq 0.0515$,
$0.4639 \leq d \leq 0.5155$,
$0.0001 \leq e \leq 0.0196$, and
$0 \leq f \leq 0.0233$.

The parameters a, b, c, d, e, and f may be values in the ranges that satisfy all conditions recited below:
$0.0687 \leq a \leq 0.1031$,
$0.378 \leq b \leq 0.4124$,
$0 \leq c \leq 0.0344$,
$0.4811 \leq d \leq 0.5155$,
$0.0004 \leq e \leq 0.0196$, and
$0 \leq f \leq 0.0233$.

The parameters a, b, c, d, e, and f may be values in the ranges that satisfy all conditions recited below:
$0.009 \leq a \leq 0.0965$,
$0.3859 \leq b < 0.48$,
$0 \leq c < 0.096$,
$0.418 < d < 0.515$,
$0.0001 \leq e \leq 0.03$, and
$0 \leq f \leq 0.3$.

The parameters a, b, c, d, e, and f may be values in the ranges that satisfy all conditions recited below:
$0.0161 \leq a \leq 0.0965$,
$0.3859 \leq b \leq 0.4662$,
$0 \leq c \leq 0.0804$,
$0.4341 \leq d \leq 0.5145$,
$0.0001 \leq e \leq 0.0196$, and
$0 \leq f \leq 0.0233$.

The parameters a, b, c, d, e, and f may be values in the ranges that satisfy all conditions recited below:
$0.0482 \leq a \leq 0.0965$,
$0.3859 \leq b \leq 0.4341$,
$0 \leq c \leq 0.0482$,
$0.4662 \leq d \leq 0.5145$,
$0.0001 \leq e \leq 0.0196$, and
$0 \leq f \leq 0.0233$.

The parameters a, b, c, d, e, and f may be values in the ranges that satisfy all conditions recited below:
$0.0643 \leq a \leq 0.0965$,
$0.3859 \leq b \leq 0.418$,
$0 \leq c \leq 0.0322$,
$0.4823 \leq d \leq 0.5145$,
$0.0004 \leq e \leq 0.0196$, and
$0 \leq f \leq 0.0233$.

The parameters a, b, c, d, e, and f may be values in the ranges that satisfy all conditions recited below:
$0.08660 \leq a \leq 0.09650$,
$0.38590 \leq b < 0.38960$,
$0 \leq c < 0.03220$,
$0.48230 < d < 0.51450$,
$0.00040 \leq e \leq 0.01960$, and
$0 \leq f \leq 0.02330$.

The inorganic compound comprises a single crystal particle or an aggregate of single crystal particles having a mean particle diameter of at least 0.1 μm and not exceeding 40 μm. The inorganic compound may comprise a mixture of a phosphor including the above-mentioned inorganic compound and another crystal phase or an amorphous phase and the content of the phosphor may be at least 20 mass %. The above-mentioned phosphor may emit fluorescence having a peak at the wavelength in the range from 460 nm to 500 nm upon irradiation by an excitation source. The excitation source may comprise a vacuum ultraviolet ray, an ultraviolet ray, or visible light having a wavelength that is at least 100 nm and not exceeding 420 nm, or an electron beam or an X-ray. A method of manufacturing the above-mentioned phosphor of the present invention comprises the step of firing a raw material mixture, which is a mixture of metal compounds and could constitute the above-mentioned phosphor by firing, in an inert atmosphere including nitrogen at a temperature range of at least 1200° C. and not exceeding 2200° C., thereby solving the above problem. The mixture of metal compounds may include AlN and/or $Al_2O_3$, $Si_3N_4$ and an oxide or a nitride of the element A (Here, the element A may be one or two or more kinds of elements selected from the group consisting of Mn, Ce, Pr, Nd, Sm, Eu, Tb, Dy, and Yb.). The metal compounds in a state of powder or aggregate may be fired after the metal compounds are filled in a container with a filling rate kept at the bulk density of 40% or lower. A light emitting device comprising at least a light-emitting body and a phosphor according to the present invention includes at least the above-mentioned phosphor, thereby solving the above problem. The light-emitting body may be an organic EL light-emitting body (OLED), a semiconductor laser, a laser diode (LD), or a light-emitting diode (LED), which emits light of wavelength of 330~500 nm. The light-emitting device may be a white color light-emitting diode, an illuminating device including a plurality of white color light-emitting diodes, or a backlight for a liquid-crystal display panel. The light-emitting body may emit an ultraviolet ray or visible light having a peak wavelength of 300~450 nm, and light of a white color or another color other than the white color may be emitted by mixing light of a blue color or a green color emitted by the above-mentioned phosphor and light having the wavelength of 450 nm or longer emitted by another phosphor. An image display device comprising: an excitation source and a phosphor according to the present invention include at least the above-mentioned phosphor as the phosphor, thereby solving the above problem. The image display device may comprise any one of a fluorescent display (VFD), a field emission display (FED), a plasma display panel (PDP), a cathode-ray tube (CRT), and a liquid crystal display (LCD). The pigment according to the present invention comprises the above-described phosphor. The ultraviolet absorber according to the present invention comprises the above-described phosphor.

Effect of the Invention

A phosphor according to the present invention comprises a multinary nitride including Si and Al or a multinary oxynitride or, in particular, an inorganic crystal represented by $M_nX_{n+1}$ ($3 \leq n \leq 52$), an inorganic crystal having the same crystal structure as the above-mentioned inorganic crystal, or an inorganic crystal including a solid solution of these crystals, as a host crystal. More preferably, since the phosphor includes, as the inorganic crystal represented by $M_nX_{n+1}$ ($3 \leq n \leq 52$), an inorganic crystal represented by $Si_xAl_{11-x}O_{3-x}N_{9+x}$ ($0<x\leq3$) wherein n=11, an inorganic crystal having the same crystal structure as the inorganic crystal represented by $Si_xAl_{11-x}O_{3-x}N_{9+x}$, or an inorganic crystal including a solid solution of these, as the main component, the phosphor renders brighter emission than the conventional oxide phosphor or the conventional oxynitride phosphor does and the phosphor having a specific composition is excellent as a phosphor of a blue color to a green color. And since the phosphor includes, as the inorganic crystal represented by $M_nX_{n+1}$ ($3 \leq n \leq 52$), an inorganic crystal represented by $Si_xAl_{12-x}O_{3-x}N_{10+x}$ ($0<x\leq3$) wherein n=12, an inorganic crystal having the same crystal structure as the inorganic crystal represented by $Si_xAl_{12-x}O_{3-x}N_{10+x}$, or an inorganic crystal including a solid solution of these, as the main component, the phosphor renders brighter emission than the conventional oxide phosphor or the conventional oxynitride phosphor does and the phosphor having a specific composition is excellent as a phosphor of a blue color to a green color. And since the phosphor includes, as the inorganic crystal represented by $M_nX_{n+1}$ ($3 \leq n \leq 52$), an inorganic crystal represented by $Si_xAl_{13-x}O_{3-x}N_{11+x}$ ($0<x\leq3$) wherein n=13, an inorganic crystal having the same crystal structure as the inorganic crystal represented by $Si_xAl_{13-x}O_{3-x}N_{11+x}$, or an inorganic crystal including a solid solution of these, as the main component, the phosphor renders brighter emission than the conventional oxide phosphor or the conventional oxynitride phosphor does and the phosphor having a specific composition is excellent as a phosphor of a blue color to a green color.

And since the phosphor includes, as the inorganic crystal represented by $M_nX_{n+1}$ ($3 \leq n \leq 52$), an inorganic crystal represented by $Si_xAl_{14-x}O_{3-x}N_{12+x}$ ($0<x\leq3$) wherein n=14, an inorganic crystal having the same crystal structure as the inorganic crystal represented by $Si_xAl_{14-x}O_{3-x}N_{12+x}$, or an inorganic crystal including a solid solution of these, as the main component, the phosphor renders brighter emission than the conventional oxide phosphor or the conventional oxynitride phosphor does and the phosphor having a specific composition is excellent as a phosphor of a blue color to a green color. And since the phosphor includes, as the inorganic crystal represented by $M_nX_{n+1}$ ($3 \leq n \leq 52$), an inorganic crystal represented by $Si_xAl_{15-x}O_{3-x}N_{13+x}$ ($0<x\leq3$) wherein n=15, an inorganic crystal having the same crystal structure as the inorganic crystal represented by $Si_xAl_{15}O_{3-x}N_{13+x}$, or an inorganic crystal including a solid solution of these, as the main component, the phosphor renders brighter emission than the conventional oxide phosphor or the conventional oxynitride phosphor does and the phosphor having a specific composition is excellent as a phosphor of a blue color to a green color. Since the brightness of the phosphor does not decrease even when exposed to the excitation source, the present invention provides a useful phosphor suitably used for a light-emitting device such as a white light-emitting diode, an illuminating device, a backlight source for a liquid crystal, VFD, FED, PDP or CRT. Further, the phosphor absorbs ultraviolet light, and thus the phosphor is suitable for a pigment and ultraviolet absorber.

EMBODIMENT FOR CARRYING OUT THE INVENTION

Figure 1:
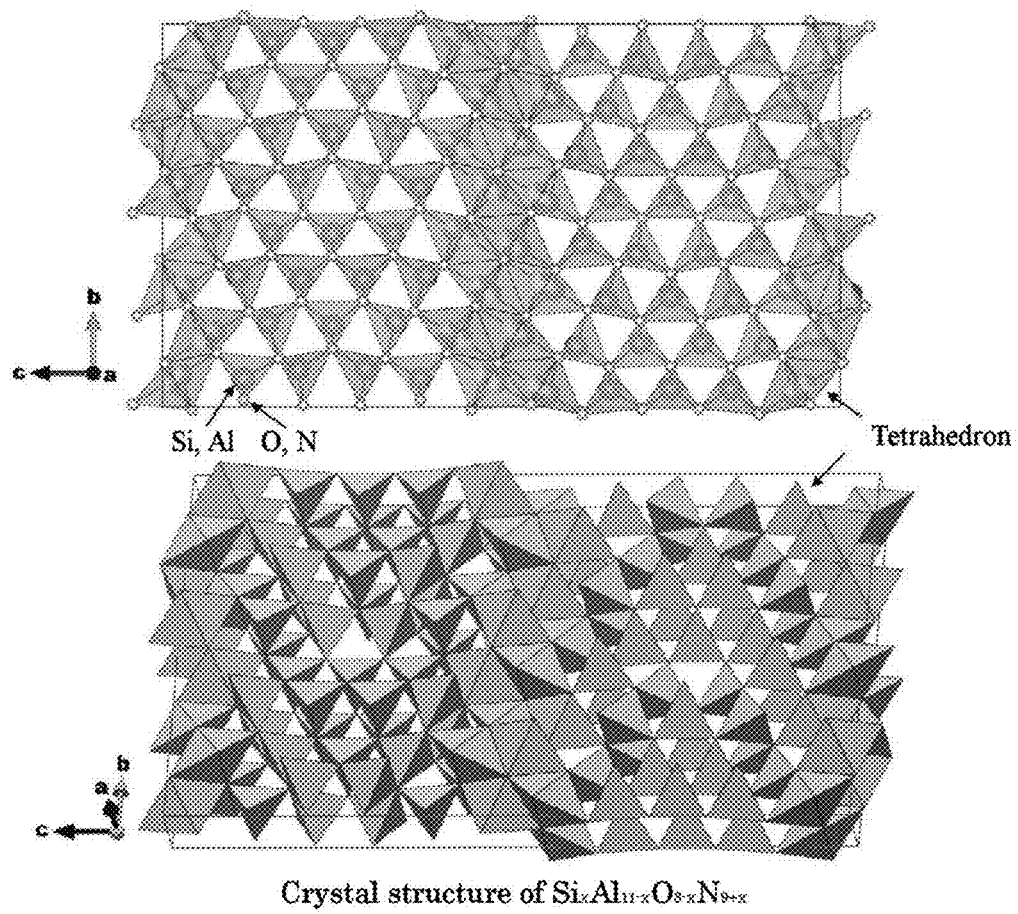
FIG. 1 shows a diagram illustrating a crystal structure of $Si_xAl_{11-x}O_{3-x}N_{9+x}$ ($0<x\leq3$) crystal.

Hereafter, a phosphor according to the present invention is described in detail with reference to the drawings.

A phosphor according to the present invention includes, as the main component, an inorganic compound in which an A element (Here, A is one or two or more kinds of elements selected from the group consisting of Mn, Ce, Pr, Nd, Sm, Eu, Tb, Dy, and Yb.) is solid solved in an inorganic crystal including at least a metal element M and a non-metal element X and being represented by $M_nX_{n+1}$ (Here, n is a value in the range of 3≤n≤52.), an inorganic crystal having the same crystal structure thereof, or an inorganic crystal including a solid solution of these, thereby rendering high intensity. Here, the metal element M includes at least Al (aluminum) and Si (silicon), and, if necessary, an element L (Here, the element L is a metal element other than Al and Si.) and the non-metal element X includes at least N (nitrogen) and, if necessary, O (oxygen), and, if necessary, an element Z (Here, the element Z is a non-metal element other than N and O.).

In particular, a phosphor including, as a host, an inorganic crystal represented by a general formula of $Si_xAl_{m+2-x}O_{3-x}N_{m+x}$ (Here, m=n−2, 0<x≤3, and 1≤m≤50.) renders high emission intensity and is a phosphor in which a color tone thereof can be controlled by changing the composition.

And an inorganic crystal represented by $M_nX_{n+1}$ has a homologous structure. As the value of n increases, the longest lattice axis (If expressed in the general way, it is a c-axis.) extends. The rest two axes (a-axis and b-axis) tend to have approximately comparable values.

Preferably, if the value of x is 1.5≤x≤2.9, the phosphor renders high emission intensity. More preferably, if the value of x is 2≤x≤2.9, the phosphor renders particularly high emission intensity.

If the value of m is 5≤m≤20, the phosphor renders particularly high emission intensity.

And the value of n is represented by a numerical number of the integer type.

And if the value of n is 9≤n≤15, the phosphor renders particularly high emission intensity.

Since an inorganic crystal represented by $M_nX_{n+1}$, and an inorganic crystal having the same crystal structure, or an inorganic crystal including a solid solution of these is in the orthorhombic crystal system and stable, the phosphor having any of them as the host crystal renders high emission intensity. In the present specification, based on the resolution made in the grand conference of the Crystallographic Society of Japan in 2014, it should be understood that the term of "chokuhoushou kei (shahoushou kei)" in Japanese is used as the intended term of "Orthorhombic" (refer to Journal of the Crystallographic Society of Japan, vol 57, 131-133 (2015)).

An inorganic crystal represented by $M_nX_{n+1}$, an inorganic crystal having the same crystal structure as the above-mentioned inorganic crystal, or an inorganic crystal including a solid solution of these is a crystal in the orthorhombic crystal system and in particular stable if the crystal is represented by the space group Cmcm and the phosphor including any of these as the host crystal renders high emission intensity.

The inorganic crystal represented by the $M_nX_{n+1}$, the inorganic crystal having the same crystal structure as the above-mentioned inorganic crystal, or the inorganic crystal including a solid solution of these is a crystal in the orthorhombic crystal system and having a symmetry in the space group Cmcm, and lattice constants a1, b1 and c1 have values in the ranges:

a1=0.31±0.05 nm,
b1=1.87±0.2 nm, and
c1=0.275×(n+1)±0.1 nm (Here, 3≤n≤52) and
such an inorganic crystal is in particular stable and the phosphor having any of these as the host crystal renders high emission intensity. If the crystal is prepared out of the above-mentioned ranges, the crystal may become unstable and the emission intensity may occasionally decrease.

The inorganic crystal represented by the $M_nX_{n+1}$, the inorganic crystal having the same crystal structure as the above-mentioned inorganic crystal, or the inorganic crystal including a solid solution of these is a crystal in the orthorhombic crystal system and having a symmetry in the space group Cmcm, and lattice constants a1, b1 and c1 have values in the ranges:

a1=0.31±0.05 nm,
b1=1.87±0.2 nm, and
c1=0.275×(n+1)±0.1 nm (Here, 3≤n≤52); and
(1) in the case where n is an even number,
the atomic coordinates Mi of the element M included in the unit cell are:
(0, (4+6i−3n)/16±0.05, (¼+(i−1)/(2n))±0.05), wherein 1≤i≤n+1 (It is n+1 in all), and
the atomic coordinates Xi of the element X are:
(0, (4+6i−3n)/16±0.05, (¼+(i−1)/(2n+1))±0.05), wherein 1≤i≤n+2 (It is n+2 in all);
(2) in the case where n is an odd number,
the atomic coordinates Mj of the element M included in the unit cell are:
(0, (8+6j−3n)/16±0.05, (¼+(j−1)/(2n))±0.05), wherein 1≤j≤n+1 (It is n+1 in all), and
the atomic coordinates Xj of the element X are:
(0, (4+6j−3n)/16±0.05, (¼+(j−1)/(2n+1))±0.05), wherein 1≤j≤n+2 (It is n+2 in all);
such that the above-mentioned crystal is in particular stable and the phosphor having any of these as the host crystal renders high emission intensity.

Such an inorganic compound is represented by a composition formula of $Si_aAl_bO_cN_dA_eQ_f$ (Here, a+b+c+d+e+f=1 in the formula, and A is one or two or more elements selected from the group consisting of Mn, Ce, Pr, Nd, Sm, Eu, Tb, Dy, and Yb, and Q is one or two or more kinds of elements selected from the group consisting of elements other than Al, Si, O, N, and A), and parameters a, b, c, d, e, and f satisfy every condition recited below:
0.0117≤a≤0.3472,
0.0694≤b≤0.4812,
0≤c≤0.2283,
0.3261≤d≤0.53,
0.0001≤e≤0.03, and
0≤f≤0.3 (Here, if the element Q includes a plurality of elements, f is the sum of respective parameters of the plurality of elements.)
such that the phosphor having the above-mentioned inorganic compound in the composition range renders in particular high emission intensity.

The parameter a represents a constituent amount of the Si element and if it is less than 0.0117 or higher than 0.3472, the crystal structure may become unstable so as to cause the emission intensity to decrease. The parameter b represents a constituent amount of the Al element and if it is less than 0.0694 or more than 0.4812, the crystal structure may become unstable so as to cause the emission intensity to decrease. The parameter c is a parameter representing a constituent amount of the O element and if the amount is higher than 0.2283, the crystal structure may become unstable so as to cause the emission intensity to decrease. And, if impurity oxygen contained in the powder raw material is considered, it could be tolerable to contain oxygen within the range not exceeding 0.2283 (For example, c is more than 0 and more preferably at least 0.001.) such that the emission intensity could be improved. The parameter d is a parameter representing a constituent amount of the N element, and if the amount is less than 0.3261 or higher than 0.53, the crystal structure may become unstable so as to cause the emission intensity to decrease. The parameter e represents an additive amount of the activating element A, and if the amount is less than 0.0001, the amount of light-emitting ions is insufficient so as to cause brightness to decrease. If the amount is more than 0.03, the emission intensity may be decreased due to the concentration quenching by a mutual interaction between light-emitting ions. The parameter f is a parameter representing a constituent amount of a Q element other than Al, Si, O, N, and the A element and if the amount is higher than 0.3, the crystal structure may become unstable so as to cause the emission intensity to decrease. A parameter of each element is determined such that the charge neutrality of Al, Si, and the A element as the cation and O, N, and the Q element as the anion may be maintained.

Preferably, the parameters a, b, c, d, e, and f are values in the ranges that satisfy all conditions recited below:
0.0199≤a≤0.2747,
0.1648≤b≤0.4642,
0≤c≤0.0996,
0.4183≤d≤0.5213,
0.0004≤e≤0.0196, and
0≤f≤0.0233,
such that the crystal with the above-mentioned parameters has a stable crystal structure so as to render in particular high emission intensity.

Among the phosphor having, as the host crystal, an inorganic crystal represented by $M_nX_{n+1}$, in particular, an inorganic crystal represented by $Si_xAl_{m+2-x}O_{3-x}N_{m+x}$ (m=n−2, 0<x≤3, and 1≤m≤50), a phosphor comprising an inorganic compound including an inorganic crystal represented by $Si_xAl_{11-x}O_{3-x}N_{9+x}$ (0<x≤3) with m=9 (n=11) (Here, it is also referred to as simply $Si_xAl_{11-x}O_{3-x}N_{9+x}$ crystal), a crystal having the same crystal structure as the inorganic crystal represented by $Si_xAl_{11-x}O_{3-x}N_{9+x}$ (0<x≤3), or an inorganic crystal including a solid solution of these, in which an A element (Here, A is one or two or more kinds of elements selected from the group consisting of Mn, Ce, Pr, Nd, Sm, Eu, Tb, Dy, and Yb.) is solid solved therein, renders in particular high emission intensity.

The inorganic crystal represented by $Si_xAl_{11-x}O_{3-x}N_{9+x}$ (0<x≤3), which was newly synthesized and confirmed to be a new crystal through the crystal structure analysis by the present inventors, is a crystal which has not been reported prior to the present invention.

FIG. 1 is a diagram showing a crystal structure of $Si_xAl_{11-x}O_3N_{9+x}$ crystal.

According to the single crystal structure analysis performed with respect to the $Si_xAl_{11-x}O_{3-x}N_{9+x}$ crystal synthesized by the present inventors, the $Si_xAl_{11-x}O_{3-x}N_{9+x}$ crystal belongs to the orthorhombic crystal system and the Cmcm space group (space group No. 63 in the International Tables for Crystallography), and having crystal parameters and occupancy of the atomic coordinate positions as shown in Table 1.

In Table 1, lattice constants a1, b1, and c1 signify respective lengths of the axes of the unit cell, and α, β, and γ signify respective angles between axes of the unit cell. The atomic coordinates indicate a position of each atom in the unit cell in terms of a value from 0 to 1 using the unit cell as a unit. In this crystal, there are respective atoms of Si, Al, O, and N and the analysis result showed that Si and Al interexchangeably existed in sixteen (16) kinds of sites from (SiAl(1)) to (SiAl(8)), from (SiAl(9A)) to (SiAl(12A)), and from (SiAl(9B)) to (SiAl(12B)). Further, the analysis result showed that O and N existed in thirteen (13) kinds of sites of ON(1) to ON(13).

TABLE 1

Crystal structure data of $Si_xAl_{11-x}O_{3-x}N_{9+x}$ crystal

| Crystal composition | $Si_x Al_{11-x} O_{3-x} N_{9+x}$ (x = 3) | | |
|---|---|---|---|
| Formula mass (Z) | 8 | | |
| Crystal system | Orthorhombic | | |
| Space group | Cmcm | | |
| Space group number | 63 | | |
| Lattice constants | a1 | 3.0697 | Angstrom |
|  | b1 | 18.6460 | Angstrom |
|  | c1 | 32.9300 | Angstrom |
|  | α | 90 | Degree |
|  | β | 90 | Degree |
|  | γ | 90 | Degree |

| Atoms | Atomic coordinates | | | Site occupancy rate |
|---|---|---|---|---|
|  | x | y | z |  |
| Si, Al (1) | 0 | 0.6575 | 0.1105 | 1.00 |
| Si, Al (2) | 0 | 0.2883 | 0.2500 | 1.00 |
| Si, Al (3) | 0 | 0.6668 | 0.2041 | 1.00 |
| Si, Al (4) | 0 | 0.2782 | 0.1557 | 1.00 |
| Si, Al (5) | 0 | 0.1001 | 0.7005 | 1.00 |
| Si, Al (6) | 0 | 0.0464 | 0.1604 | 1.00 |
| Si, Al (7) | 0 | 0.4258 | 0.1195 | 1.00 |
| Si, Al (8) | 0 | 0.0477 | 0.2500 | 1.00 |
| Si, Al (9A) | 0 | 0.0564 | 0.0511 | 0.24 |
| Si, Al (9B) | 0 | 0.0347 | 0.0693 | 0.76 |
| Si, Al (10A) | 0 | 0.1944 | 0.5765 | 0.77 |
| Si, Al (10B) | 0 | 0.1741 | 0.5575 | 0.23 |
| Si, Al (11A) | 0 | 0.2059 | 0.0163 | 0.35 |
| Si, Al (11B) | 0 | 0.1857 | 0.0332 | 0.65 |
| Si, Al (12A) | 0 | 0.4147 | 0.0267 | 0.55 |
| Si, Al (12B) | 0 | 0.4356 | 0.0080 | 0.45 |
| O, N (1) | 0 | 0.0049 | 0.7078 | 1.00 |
| O, N (2) | 0 | 0.6033 | 0.1597 | 1.00 |
| O, N (3) | 0 | 0.2243 | 0.2047 | 1.00 |
| O, N (4) | 0 | 0.8482 | 0.2500 | 1.00 |
| O, N (5) | 0 | 0.1149 | 0.5039 | 1.00 |
| O, N (6) | 0 | 0.3739 | 0.1713 | 1.00 |
| O, N (7) | 0 | 0.5074 | 0.0439 | 1.00 |
| O, N (8) | 0 | 0.6075 | 0.2500 | 1.00 |
| O, N (9) | 0 | 0.1301 | 0.0841 | 1.00 |
| O, N (10) | 0 | 0.2477 | 0.6276 | 1.00 |
| O, N (11) | 0 | 0.0191 | 0.6196 | 1.00 |
| O, N (12) | 0 | 0.2628 | 0.5373 | 1.00 |
| O, N (13) | 0 | 0.3582 | 0.0799 | 1.00 |

As a result of the analysis using data in Table 1, the $Si_xAl_{11-x}O_{3-x}N_{9+x}$ crystal was found to have the structure as shown in FIG. 1, in which a skeleton structure formed by linking tetrahedrons constituted of bonds of Si or Al with O or N was configured. In this crystal, it is plausible that the A element to serve as an activating ion such as Eu might have been incorporated into the crystal by substituting locally four of Si or Al having been bonded to O or N and one of O or N.

As the crystal having the same crystal structure as the $Si_xAl_{11-x}O_{3-x}N_{9+x}$ crystal having been synthesized and analyzed for a structure thereof, there is a $(Si, Al)_{11}(O, N)_{12}$ crystal. In the $(Si, Al)_{11}(O, N)_{12}$ crystal, and in the $Si_xAl_{11-x}O_{3-x}N_{9+x}$ crystal, Si and Al can occupy sites which Si and Al are supposed to occupy without distinguishing the sites mutually, and O and N can occupy sites which O and N are supposed to occupy without distinguishing the sites mutually. Thus, a relative ratio of numbers of atoms can be adjusted to eleven (11) for the sum of Si and Al and twelve (12) for the sum of O and N while the crystal structure remains the same. Here, it is desirable to have a ratio of Si/Al and a ratio of O/N satisfy the electrical neutrality condition in the crystal.

In the following, for the simplicity, the inorganic crystal represented by $Si_xAl_{11-x}O_{3-x}N_{9+x}$, the inorganic crystal having the same structure as the $Si_xAl_{11-x}O_{3-x}N_{9+x}$ crystal, and the inorganic crystal including a solid solution of these are called collectively as the $Si_xAl_{11-x}O_{3-x}N_{9+x}$ system crystal.

The $Si_xAl_{11-x}O_{3-x}N_{9+x}$ system crystal of the present invention can be identified by means of the X-ray diffraction or the neutron diffraction. As the substance rendering the same diffraction pattern as the X-ray diffraction pattern result of the $Si_xAl_{11-x}O_{3-x}N_{9+x}$ crystal, as shown with respect to the present invention, there is a crystal having the same crystal structure as the $Si_xAl_{11-x}O_{3-x}N_{9+x}$ crystal and, by way of example, there is an inorganic crystal represented by $(Si, Al)_{11}(O, N)_{12}$. Further, there is a crystal in which a lattice constant and/or an atomic position is changed by substituting a constituent element with another element with respect to the $Si_xAl_{11-x}O_{3-x}N_{9+x}$ crystal. Here, the crystal in which another element substitutes a constituent element includes, for example, a crystal in which an L element other than Si and Al substitutes part of Si or part of Al in the $Si_xAl_{11-x}O_{3-x}N_{9+x}$ crystal (Here, L is a metal element other than Si and Al). Further, there is a crystal in which a Z element other than O and N substitutes part or all of O or part of N in the crystal (Here, Z is a non-metal element other than O and N). These substitutions are performed such that the neutrality of charges in the whole crystal is maintained. It is the $Si_xAl_{11-x}O_{3-x}N_{9+x}$ system crystal that would not change its crystal structure as a result of such element substitutions. Since emission characteristics, chemical stability, and thermal stability of the phosphor are changed by the substitution of elements, the substitution of elements may be selectively utilized at an appropriate time for each application thereof as far as the crystal structure remains the same.

In the $Si_xAl_{11-x}O_{3-x}N_{9+x}$ system crystal, the lattice constants change as the constituent components are substituted with other elements or as an activating element such as Eu is solid-solved therein, but the atomic positions given by the crystal structure, sites to be occupied by atoms, and coordinates thereof do not significantly change to an extent in which a chemical bond between skeleton atoms is broken. In the present invention, a crystal structure is defined to be identical (the same) if lengths of chemical bonds (distance of neighboring atoms) of Al—N, Al—O, SiN, and Si—O calculated from the lattice constants and atomic coordinates obtained by conducting Rietveld analysis of the results from the X-ray diffraction or the neutron diffraction in the space group of Cmcm are compared with lengths of chemical bonds calculated from the lattice constants and atomic coordinates of the $Si_xAl_{11-x}O_{3-x}N_{9+x}$ crystal (x=3) as shown in Table 1 such that the difference between the lengths is within ±5%, and using the definition it is determined whether the crystal having the crystal structure belongs to the $Si_xAl_{11-x}O_{3-x}N_{9+x}$ system crystal or not. This determination criterion is employed herein since it was once observed that a crystal in the $Si_xAl_{11-x}O_{3-x}N_{9+x}$ system crystal was changed to become another crystal due to breakage of chemical bonds when lengths of the chemical bonds were changed beyond ±5% according to the prior experiments.

Further, in case an amount of solid-solution is small, a simple method for determining whether it belongs to the $Si_xAl_{11-x}O_{3-x}N_{9+x}$ system crystal or not is described as follows. A new substance can be identified to have the same crystal structure if main peaks of the resultant X-ray diffraction pattern measured with the new substance are respectively located at diffraction peak positions, which agree with the peak positions (2θ) of the diffraction pattern calculated using the crystal structure data of Table 1 and the lattice constants calculated from the resultant X-ray diffraction pattern.

Figure 2:
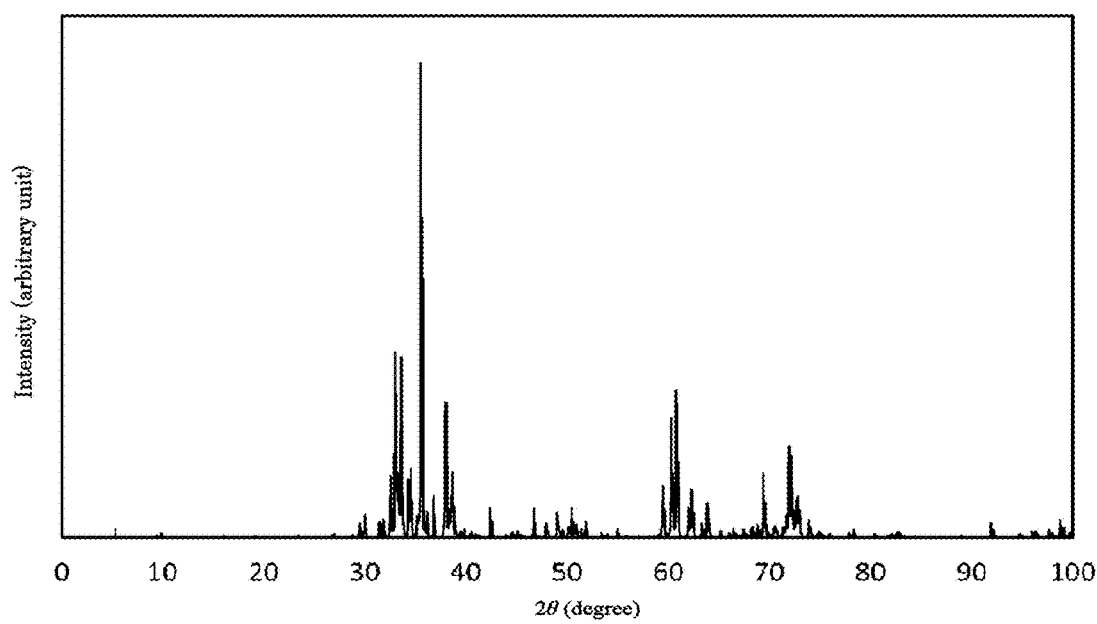
FIG. 2 is a diagram showing a powder X-ray diffraction patter using Cu Kα-line, calculated from a crystal structure of $Si_xAl_{11-x}O_{3-x}N_{9+x}$ ($0<x\leq3$) crystal.

FIG. 2 shows a diagram showing a powder X-ray diffraction pattern using Cu Kα-line calculated from the crystal structure of $Si_xAl_{11-x}O_{3-x}N_{9+x}$ crystal.

It is possible to make a simple determination whether a subject substance belongs to the $Si_xAl_{11-x}O_{3-x}N_{9+x}$ system crystal or not by comparing FIG. 2 and that of the subject substance. It may be good to make a judgment using approximately ten (10) peaks of the highest intensity in the diffraction pattern as the main peaks of the $Si_xAl_{11-x}O_{3-x}N_{9+x}$ system crystal. Table 1 is important in this sense since it could be referenced when the identification of the $Si_xAl_{11-x}O_{3-x}N_{9+x}$ system crystal is conducted. Further, it is also possible to define a crystal structure of the $Si_xAl_{11-x}O_{3-x}N_{9+x}$ system crystal as an approximate structure using another crystal system of the orthorhombic crystal system and, in such a case, the crystal structure is expressed using a different space group, different lattice constants, and different plane indices, but the X-ray diffraction results (for example, FIG. 2) and the crystal structure (for example, FIG. 1) remain unchanged such that an identification method and an identification result thereof are the same. Therefore, in the present invention, it is to perform an X-ray diffraction analysis using the orthorhombic crystal system. The method of identifying the substance based on Table 1 will be concretely described in Examples to be described later, and the explanation of the method described herein is just in general.

A phosphor can be obtained if the $Si_xAl_{11-x}O_{3-x}N_{9+x}$ system crystal is activated by, as the A element, one or two or more kinds of elements selected from the group consisting of Mn, Ce, Pr, Nd, Sm, Eu, Tb, Dy, and Yb. Since emission characteristics such as an excitation wavelength, an emission wavelength, and emission intensity may vary depending on the composition of the $Si_xAl_{11-x}O_{3-x}N_{9+x}$ system crystal, and the kind and quantity of the activating element, such conditions may be chosen in accordance with an application thereof.

The inorganic crystal represented by $Si_xAl_{11-x}O_{3-x}N_{9+x}$ the inorganic crystal having the same crystal structure as the inorganic crystal represented by $Si_xAl_{11-x}O_{3-x}N_{9+x}$, or the inorganic crystal including a solid solution of these is a crystal in the orthorhombic crystal system and having a symmetry in the space group Cmcm, and lattice constants a1, b1 and c1 have values in the ranges:
a1=0.30697±0.05 nm,
b1=1.86460±0.05 nm, and
c1=3.29300±0.05 nm,
such that the inorganic crystal is a particularly stable crystal and the phosphor comprising such an inorganic crystal as the host crystal renders high emission intensity. If the crystal is prepared out of the above ranges, the crystal may become unstable and the emission intensity may occasionally decrease.

Preferably, in the case of $1.5 \leq x \leq 3$, the phosphor renders high emission intensity. More preferably, in the case of $1.8 \leq x \leq 3$, the phosphor renders further high emission intensity and yet preferably, in the case of $2 \leq x \leq 3$, the phosphor renders particularly high emission intensity. In the case where the impurity oxygen contained in the raw material is considered, a phosphor of high emission intensity can be preferably obtained if the upper limit of x is set not exceeding 2.9

An activating element A includes at least Eu. Therefore, a phosphor rendering particularly high emission intensity may be obtained.

Preferably, the phosphor represented by the composition formula of $Si_aAl_bO_cN_dA_eQ_f$ (Here, a+b+c+d+e+f=1 in the formula, and A is one or two or more elements selected from the group consisting of Mn, Ce, Pr, Nd, Sm, Eu, Tb, Dy, and Yb, and Q is one or two or more kinds of elements selected from the group consisting of elements other than Al, Si, O, N, and A) and expressed in the composition in the ranges in which parameters a, b, c, d, e, and f satisfy every condition as recited below:
$0.015 \leq a \leq 0.1299$,
$0.3463 \leq b < 0.48$,
$0 \leq c < 0.125$,
$0.39 < d < 0.52$,
$0.0001 \leq e \leq 0.03$, and
$0 \leq f \leq 0.3$ (Here, if the element Q includes a plurality of elements, f is the sum of respective parameters of the plurality of elements), renders particularly high emission intensity.

The parameter a is a parameter representing the constituent amount of the Si element and if it is less than 0.015 or higher than 0.01299, the crystal structure may become unstable so as to cause the emission intensity to decrease. The parameter b is a parameter representing the constituent amount of the Al element and if it is less than 0.3463 or at least 0.48, the crystal structure may become unstable so as to cause the emission intensity to decrease. The parameter c is a parameter representing the constituent amount of the O element and if it is at least 0.125, the crystal structure may become unstable so as to cause the emission intensity to decrease. And, if impurity oxygen contained in the powder raw material is considered, it could be tolerable to contain oxygen within the range less than 0.125 (For example, c is more than 0 and more preferably at least 0.001.) such that the emission intensity could be improved. The parameter d is a parameter representing the constituent amount of the N element, and if the amount is not exceeding 0.39 or at least 0.52, the crystal structure may become unstable so as to cause the emission intensity to decrease. The parameter e represents an additive amount of the activating element A, and if the amount is less than 0.0001, an amount of light-emitting ions is insufficient so as to cause brightness to decrease. If the amount is more than 0.03, the emission intensity may be decreased due to the concentration quenching by a mutual interaction between light-emitting ions. The parameter f is a parameter representing the constituent amount of the Q element other than Al, Si, O, N, and the A element and if the amount is higher than 0.3, the crystal structure may become unstable so as to cause the emission intensity to decrease. A parameter of each element is determined in order to fix the composition such that the charge neutrality of Al, Si, and the A element as the cation and O, N, and the Q element as the anion may be maintained.

Further, it is preferable that the phosphor having the crystal, in which parameters a, b, c, d, e, and f are values in the ranges that satisfy all conditions recited below:
$0.0216 \leq a \leq 0.1299$,
$0.3463 \leq b \leq 0.4545$,
$0 \leq c \leq 0.1082$,
$0.4113 \leq d \leq 0.5195$,
$0.0001 \leq e \leq 0.0196$, and
$0 \leq f \leq 0.0233$,
has a stable crystal structure and renders high emission intensity.

Further, it is preferable that the phosphor having the crystal, in which parameters a, b, c, d, e, and f are values in the ranges that satisfy all conditions recited below:
$0.0647 \leq a \leq 0.1299$,
$0.3463 \leq b \leq 0.4095$,
$0 \leq c \leq 0.0647$, 0.4526≤d≤0.5195,
0.0001≤e≤0.0196, and
0≤f≤0.0233,
has a stable crystal structure and renders particularly high emission intensity.

Yet, it is preferable that the phosphor having the crystal, in which parameters a, b, c, d, e, and f are values in the ranges that satisfy all conditions recited below:
0.0866≤a≤0.1299,
0.3463≤b≤0.3896,
0≤c≤0.0433,
0.4762≤d≤0.5195,
0.0004≤e≤0.0196, and
0≤f≤0.0233,
has a stable crystal structure and renders particularly high emission intensity.

Among the phosphor having, as the host crystal, an inorganic crystal represented by $M_nX_{n+1}$, in particular, an inorganic crystal represented by $Si_xAl_{m+2-x}O_{3-x}N_{m+x}$ (m=n−2, 0<x≤3, and 1≤m≤50), a phosphor comprising: an inorganic compound including an inorganic crystal represented by $Si_xAl_{12-x}O_{3-x}N_{10+x}$ (0<x≤3) with m=10 (n=12) (Here, it is also referred to as simply $Si_xAl_{12-x}O_{3-x}N_{10+x}$ crystal), a crystal having the same crystal structure as the inorganic crystal represented by $Si_xAl_{12-x}O_{3-x}N_{10+x}$ (0<x≤3), or an inorganic crystal including a solid solution of these, in which an A element (Here, A is one or two or more kinds of elements selected from the group consisting of Mn, Ce, Pr, Nd, Sm, Eu, Tb, Dy, and Yb.) is solid solved therein, renders in particular high emission intensity.

The inorganic crystal represented by $Si_xAl_{12-x}O_{3-x}N_{10+x}$ (0<x≤3), which was newly synthesized and confirmed to be a new crystal through the crystal structure analysis by the present inventors, is a crystal which has not been reported prior to the present invention.

Figure 3:
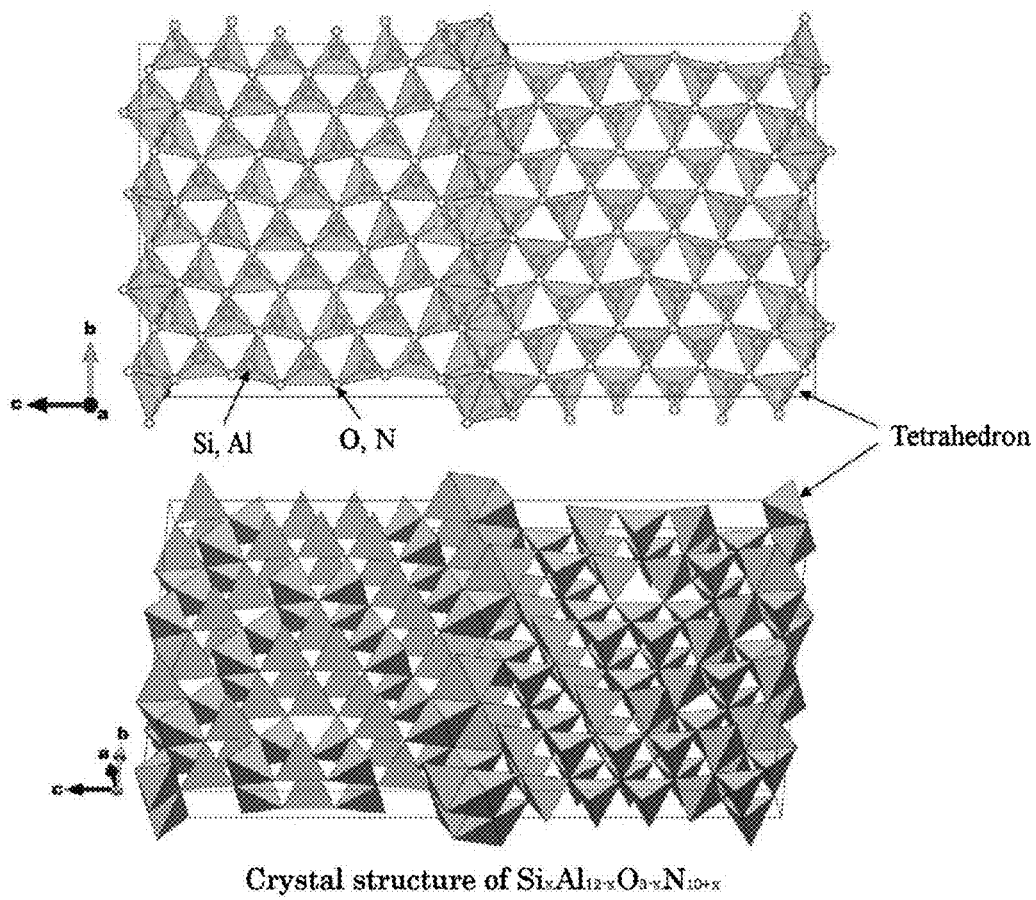
FIG. 3 is a diagram illustrating a crystal structure of $Si_xAl_{12-x}O_{3-x}N_{10+x}$ ($0<x\leq3$) crystal.

FIG. 3 is a diagram showing a crystal structure of $Si_xAl_{12-x}O_{3-x}N_{10+x}$ (x=2.5) crystal.

According to the single crystal structure analysis performed with respect to the $Si_xAl_{12-x}O_{3-x}N_{10+x}$ crystal synthesized by the present inventors, the $Si_xAl_{12-x}O_{3-x}N_{10+x}$ crystal belongs to the orthorhombic crystal system and the Cmcm space group (space group No. 63 in the International Tables for Crystallography), and has crystal parameters and occupancy of the atomic coordinate positions as shown in Table 2.

In Table 2, lattice constants a1, b1, and c1 signify respective lengths of the axes of the unit cell, and α, β, and γ signify respective angles between axes of the unit cell. The atomic coordinates indicate a position of each atom in the unit cell in terms of a value between 0 and 1 using the unit cell as a unit. In this crystal, there are respective atoms of Si, Al, O, and N and the obtained analysis result showed that Si and Al interexchangeably existed in nineteen (19) kinds of sites from (SiAl(1)) to (SiAl(7)), from (SiAl(8A)) to (SiAl(13A)), and from (SiAl(8B)) to (SiAl(13B)). Further, the obtained analysis result showed that O and N existed in fourteen (14) kinds of sites of ON(1) to ON(14).

TABLE 2

| Crystal structure data of $Si_xAl_{12-x}O_{3-x}N_{10+x}$ crystal | | |
|---|---|---|
| Crystal composition | $Si_x Al_{12-x} O_{3-x} N_{10+x}$ (x = 2.5) | |
| Formula mass (Z) | 8 | |
| Crystal system | Orthorhombic | |
| Space group | Cmcm | |

TABLE 2-continued

| Crystal structure data of $Si_xAl_{12-x}O_{3-x}N_{10+x}$ crystal | | | | |
|---|---|---|---|---|
| Space group number | | 63 | | |
| Lattice constants | a1 | 3.0745 | | Angstrom |
| | b1 | 18.6919 | | Angstrom |
| | c1 | 35.7830 | | Angstrom |
| | α | 90 | | Degree |
| | β | 90 | | Degree |
| | γ | 90 | | Degree |

| | Atomic coordinates | | | Site occupancy |
|---|---|---|---|---|
| Atoms | x | y | z | rate |
| Si, Al (1) | 0 | 0.53200 | 0.12170 | 1.000 |
| Si, Al (2) | 0 | 0.90145 | 0.25000 | 1.000 |
| Si, Al (3) | 0 | 0.52288 | 0.20755 | 1.000 |
| Si, Al (4) | 0 | 0.08848 | 0.66306 | 1.000 |
| Si, Al (5) | 0 | 0.28900 | 0.20433 | 1.000 |
| Si, Al (6) | 0 | 0.14223 | 0.25000 | 1.000 |
| Si, Al (7) | 0 | 0.14293 | 0.16754 | 1.000 |
| Si, Al (8A) | 0 | 0.62567 | 0.01134 | 0.535 |
| Si, Al (8B) | 0 | 0.39491 | 0.00516 | 0.465 |
| Si, Al (9A) | 0 | 0.00457 | 0.05018 | 0.693 |
| Si, Al (9B) | 0 | 0.01564 | 0.53468 | 0.307 |
| Si, Al (10A) | 0 | 0.22489 | 0.54470 | 0.681 |
| Si, Al (10B) | 0 | 0.24575 | 0.52748 | 0.319 |
| Si, Al (11A) | 0 | 0.15459 | 0.08340 | 0.822 |
| Si, Al (11B) | 0 | 0.13732 | 0.06782 | 0.178 |
| Si, Al (12A) | 0 | 0.38394 | 0.09023 | 0.854 |
| Si, Al (12B) | 0 | 0.36337 | 0.07353 | 0.146 |
| Si, Al (13A) | 0 | 0.23573 | 0.63037 | 0.932 |
| Si, Al (13B) | 0 | 0.25446 | 0.61366 | 0.068 |
| O, N (1) | 0 | 0.19468 | 0.21029 | 1.000 |
| O, N (2) | 0 | 0.34049 | 0.25000 | 1.000 |
| O, N (3) | 0 | 0.58557 | 0.16677 | 1.000 |
| O, N (4) | 0 | 0.58353 | 0.25000 | 1.000 |
| O, N (5) | 0 | 0.18432 | 0.67663 | 1.000 |
| O, N (6) | 0 | 0.03563 | 0.70848 | 1.000 |
| O, N (7) | 0 | 0.30395 | 0.02204 | 1.000 |
| O, N (8) | 0 | 0.43688 | 0.13722 | 1.000 |
| O, N (9) | 0 | 0.20773 | 0.12905 | 1.000 |
| O, N (10) | 0 | 0.45174 | 0.05387 | 1.000 |
| O, N (11) | 0 | 0.05903 | 0.09701 | 1.000 |
| O, N (12) | 0 | 0.17076 | 0.59205 | 1.000 |
| O, N (13) | 0 | 0.31850 | 0.55909 | 1.000 |
| O, N (14) | 0 | 0.07366 | 0.01521 | 1.000 |

As a result of the analysis using data in Table 2, the $Si_xAl_{12-x}O_{3-x}N_{10+x}$ crystal was found to have the structure as shown in FIG. 3, in which a skeleton structure formed by linking tetrahedrons constituted of bonds of Si or Al with O or N was configured. In this crystal, it is plausible that the A element to serve as an activating ion such as Eu might have been incorporated into the crystal by substituting locally four of Si or Al having been bonded to O or N and one of O or N.

As the crystal having the same crystal structure as the $Si_xAl_{12-x}O_{3-x}N_{10+x}$ crystal having been synthesized and analyzed for a structure thereof, there is a $(Si, Al)_{12}(O, N)_{13}$ crystal. In the $(Si,Al)_{12}(O,N)_{13}$ crystal, and in the $Si_xAl_{12-x}O_{3-x}N_{10+x}$ crystal, Si and Al can occupy sites which Si and Al are supposed to occupy without distinguishing the sites mutually, and O and N can occupy sites which O and N are supposed to occupy without distinguishing the sites mutually. Thus, a relative ratio of numbers of atoms can be adjusted to twelve (12) for the sum of Si and Al elements and thirteen (13) for the sum of O and N while the crystal structure remains the same. Here, it is desirable to have a ratio of Si/Al and a ratio of O/N satisfy the electrical neutrality condition in the crystal.

In the following, for the simplicity, the inorganic crystal represented by $Si_xAl_{12-x}O_{3-x}N_{10+x}$, the inorganic crystal having the same structure as the $Si_xAl_{12-x}O_{3-x}N_{10+x}$ crystal, and the inorganic crystal including a solid solution of these are called collectively as the $Si_xAl_{12-x}O_{3-x}N_{10+x}$ system crystal.

The $Si_xAl_{12-x}O_{3-x}N_{10+x}$ system crystal of the present invention can be identified by means of the X-ray diffraction or the neutron diffraction. As the substance rendering the same diffraction pattern as the X-ray diffraction pattern result of the $Si_xAl_{12-x}O_{3-x}N_{10+x}$ crystal, as shown with respect to the present invention, there is a crystal having the same crystal structure as the $Si_xAl_{12-x}O_{3-x}N_{10+x}$ crystal and, by way of example, there is an inorganic crystal represented by $(Si, Al)_{12}(O, N)_{13}$. Further, there is a crystal in which a lattice constant and/or an atomic position is changed by substituting a constituent element with another element with respect to the $Si_xAl_{12-x}O_{3-x}N_{10+x}$ crystal. Here, the crystal in which another element substitutes a constituent element includes, for example, a crystal in which an L element other than Si and Al substitutes part of Si or part of Al in the $Si_xAl_{12-x}O_{3-x}N_{10+x}$ crystal (Here, L is a metal element other than Si and Al). Further, there is a crystal in which a Z element other than O and N substitutes part or all of O or part of N in the crystal (Here, Z is a non-metal element other than O and N). These substitutions are performed such that the neutrality of charges in the whole crystal is maintained. It is the $Si_xAl_{12-x}O_{3-x}N_{10+x}$ system crystal that would not change its crystal structure as a result of such element substitutions. Since emission characteristics, chemical stability, and thermal stability of the phosphor are changed by the substitution of elements, the substitution of elements may be selectively utilized at an appropriate time for each application thereof as far as the crystal structure remains the same.

In the $Si_xAl_{12-x}O_{3-x}N_{10+x}$ system crystal, the lattice constants change as the constituent components are substituted with other elements or as an activating element such as Eu is solid-solved therein, but the atomic positions given by the crystal structure, sites to be occupied by atoms, and coordinates thereof do not significantly change to an extent in which a chemical bond between skeleton atoms is broken. In the present invention, a crystal structure is defined to be identical (the same) if lengths of chemical bonds (distance of neighboring atoms) of Al—N, Al—O, SiN, and Si—O calculated from the lattice constants and atomic coordinates obtained by conducting Rietveld analysis of the results from the X-ray diffraction or the neutron diffraction in the space group of Cmcm are compared with lengths of chemical bonds calculated from the lattice constants and atomic coordinates of the $Si_xAl_{12-x}O_{3-x}N_{10+x}$ crystal (x=2.5) as shown in Table 2 such that the difference between the lengths is within ±5%, and using the definition it is determined whether the crystal having the crystal structure belongs to the $Si_xAl_{12-x}O_{3-x}N_{10+x}$ system crystal or not. This determination criterion is employed herein since it was once observed that a crystal in the $Si_xAl_{12-x}O_{3-x}N_{10+x}$ system crystal was changed to become another crystal due to breakage of chemical bonds when lengths of the chemical bonds were changed beyond ±5% according to the prior experiments.

Further, in case an amount of solid-solution is small, a simple method for determining whether it belongs to the $Si_xAl_{12-x}O_{3-x}N_{10+x}$ system crystal or not is described as follows. A new substance can be identified to have the same crystal structure if main peaks of the resultant X-ray diffraction pattern measured with the new substance are respectively located at diffraction peak positions, which agree with the peak positions (2θ) of the diffraction pattern calculated using the crystal structure data of Table 2 and the lattice constants calculated from the resultant X-ray diffraction pattern.

Figure 4:
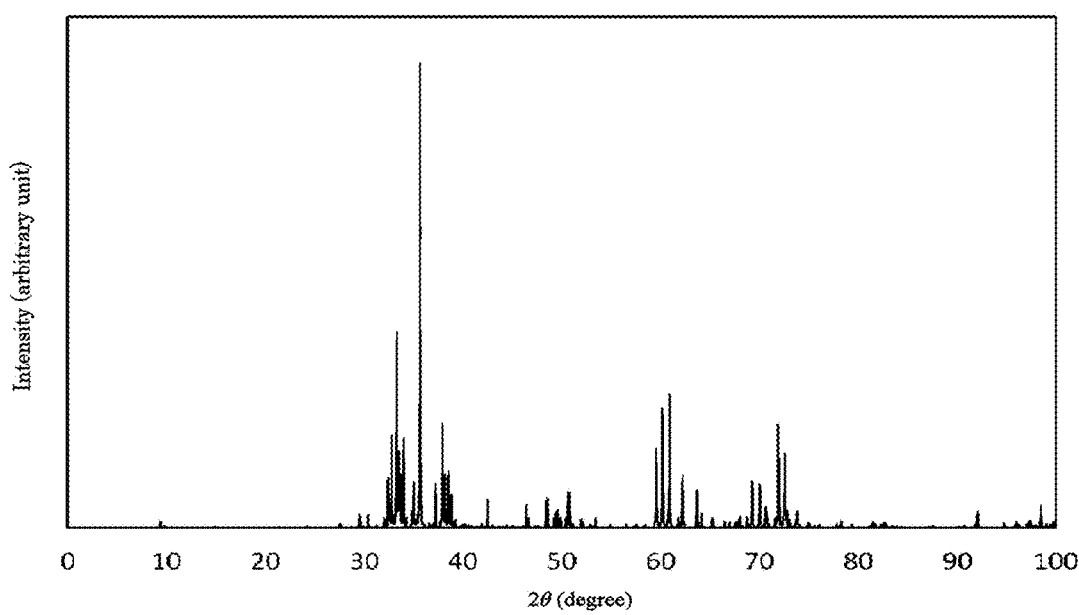
FIG. 4 is a diagram showing a powder X-ray diffraction patter using Cu Kα-line, calculated from a crystal structure of $Si_xAl_{12-x}O_{3-x}N_{10+x}$ ($0<x\leq3$) crystal.

FIG. 4 is a diagram showing a powder X-ray diffraction pattern using Cu Kα-line calculated from the crystal structure of $Si_xAl_{12-x}O_{3-x}N_{10+x}$ crystal.

It is possible to make a simple determination whether a subject substance belongs to the $Si_xAl_{12-x}O_{3-x}N_{10+x}$ system crystal or not by comparing FIG. 4 and that of the subject substance. It may be good to make a judgment using approximately ten (10) peaks of the highest intensity in the diffraction pattern as the main peaks of the $Si_xAl_{12-x}O_{3-x}N_{10+x}$ system crystal. Table 2 is important in this sense since it could be referenced when the identification of the $Si_xAl_{12-x}O_{3-x}N_{10+x}$ system crystal is conducted. Further, it is also possible to define a crystal structure of the $Si_xAl_{12-x}O_{3-x}N_{10+x}$ system crystal as an approximate structure using another crystal system of the orthorhombic crystal system and, in such a case, the crystal structure is expressed using a different space group, different lattice constants, and different plane indices, but the X-ray diffraction results (for example, FIG. 4) and the crystal structure (for example, FIG. 3) remain unchanged such that an identification method and an identification result thereof are the same. Therefore, in the present invention, it is to perform an X-ray diffraction analysis using the orthorhombic crystal system. The method of identifying the substance based on Table 2 will be concretely described in Examples to be described later, and the explanation of the method described herein is just in general.

A phosphor can be obtained if the $Si_xAl_{12-x}O_{3-x}N_{10+x}$ system crystal is activated by, as the A element, one or two or more kinds of elements selected from the group consisting of Mn, Ce, Pr, Nd, Sm, Eu, Tb, Dy, and Yb. Since emission characteristics such as an excitation wavelength, an emission wavelength, and emission intensity may vary depending on the composition of the $Si_xAl_{12-x}O_{3-x}N_{10+x}$ system crystal, and the kind and quantity of the activating element, such conditions may be chosen in accordance with an application thereof.

The inorganic crystal represented by $Si_xAl_{12-x}O_{3-x}N_{10+x}$ the inorganic crystal having the same crystal structure as the inorganic crystal represented by $Si_xAl_{12-x}O_{3-x}N_{10+x}$, or the inorganic crystal including a solid solution of these is a crystal in the orthorhombic crystal system and having a symmetry in the space group Cmcm, and lattice constants a1, b1 and c1 have values in the ranges:
a1=0.30745±0.05 nm,
b1=1.86919±0.05 nm, and
c1=3.57830±0.05 nm,
such that the inorganic crystal is a particularly stable crystal and the phosphor comprising such an inorganic crystal as the host crystal renders high emission intensity. If the crystal is prepared out of the above ranges, the crystal may become unstable and the emission intensity may occasionally decrease.

Preferably, in the case of 1.5≤x≤3, the phosphor renders high emission intensity. More preferably, in the case of 1.8≤x≤3, the phosphor renders further high emission intensity and yet preferably, in the case of 2≤x≤3, the phosphor renders particularly high emission intensity. In the case where the impurity oxygen contained in the raw material is considered, a phosphor of high emission intensity can be preferably obtained if the upper limit of x is set not exceeding 2.9.

An activating element A includes at least Eu. Therefore, a phosphor rendering particularly high emission intensity may be obtained.

Preferably, the phosphor represented by the composition formula of $Si_aAl_bO_cN_dA_eQ_f$ (Here, a+b+c+d+e+f=1 in the formula, and A is one or two or more elements selected from the group consisting of Mn, Ce, Pr, Nd, Sm, Eu, Tb, Dy, and Yb, and Q is one or two or more kinds of elements selected from the group consisting of elements other than Al, Si, O, N, and A) and expressed in the composition in the ranges in which parameters a, b, c, d, e, and f satisfy every condition as recited below:

0.015≤a≤0.12,
0.35≤b<0.48,
0≤c<0.123,
0.3968<d<0.52,
0.0001≤e≤0.03, and
0≤f≤0.3 (Here, if the element Q includes a plurality of elements, f is the sum of respective parameters of the plurality of elements.) renders particularly high emission intensity.

The parameter a is a parameter representing the constituent amount of the Si element and if it is less than 0.015 or higher than 0.12, the crystal structure may become unstable so as to cause the emission intensity to decrease. The parameter b is a parameter representing the constituent amount of the Al element and if it is less than 0.35 or at least 0.48, the crystal structure may become unstable so as to cause the emission intensity to decrease. The parameter c is a parameter representing the constituent amount of the O element and if it is at least 0.123, the crystal structure may become unstable so as to cause the emission intensity to decrease. And, if impurity oxygen contained in the powder raw material is considered, it could be tolerable to contain oxygen within the range less than 0.123 (For example, c is more than 0 and more preferably at least 0.001.) such that the emission intensity could be improved. The parameter d is a parameter representing the constituent amount of the N element, and if the amount is not exceeding 0.3968 or at least 0.52, the crystal structure may become unstable so as to cause the emission intensity to decrease. The parameter e represents an additive amount of the activating element A, and if the amount is less than 0.0001, an amount of light-emitting ions is insufficient so as to cause brightness to decrease. If the amount is more than 0.03, the emission intensity may be decreased due to the concentration quenching by a mutual interaction between light-emitting ions. The parameter f is a parameter representing the constituent amount of the Q element other than Al, Si, O, N, and the A element and if the amount is higher than 0.3, the crystal structure may become unstable so as to cause the emission intensity to decrease. A parameter of each element is determined in order to fix the composition such that the charge neutrality of Al, Si, and the A element as the cation and O, N, and the Q element as the anion may be maintained.

Further, it is preferable that the phosphor having the crystal, in which parameters a, b, c, d, e, and f are values in the ranges that satisfy all conditions recited below:

0.0199≤a≤0.1195,
0.3586 b≤0.4582,
0≤c≤0.0996,
0.4183≤d≤0.5179,
0.0001≤e≤0.0196, and
0≤f≤0.0233, has a stable crystal structure and renders high emission intensity.

Further, it is preferable that the phosphor having the crystal, in which parameters a, b, c, d, e, and f are values in the ranges that satisfy all conditions recited below:

0.058≤a≤0.1195,
0.3586≤b≤0.42,
0≤c≤0.06,
0.45≤d≤0.5179,
0.0001≤e≤0.0196, and
0≤f≤0.0233, has a stable crystal structure and renders particularly high emission intensity.

Yet, it is preferable that the phosphor having the crystal, in which parameters a, b, c, d, e, and f are values in the ranges that satisfy all conditions recited below:

0.078≤a≤0.1195,
0.3586≤b≤0.4,
0≤c≤0.045,
0.475≤d≤0.5179,
0.0004≤e≤0.0196, and
0≤f≤0.0233, has a stable crystal structure and renders particularly high emission intensity.

Among the phosphor having, as the host crystal, an inorganic crystal represented by $M_nX_{n+1}$, in particular, an inorganic crystal represented by $Si_xAl_{m+2-x}O_{3-x}N_{m+x}$ (m=n−2, 0<x≤3, and 1≤m≤50), a phosphor comprising an inorganic compound including an inorganic crystal represented by $Si_xAl_{13-x}O_{3-x}N_{11+x}$ (0<x≤3) with m=1 (n=13) (Here, it is also referred to as simply $Si_xAl_{13-x}O_{3-x}N_{11+x}$ crystal), a crystal having the same crystal structure as the inorganic crystal represented by $Si_xAl_{13-x}O_{3-x}N_{11+x}$ (0<x≤3), or an inorganic crystal including a solid solution of these, in which an A element (Here, A is one or two or more kinds of elements selected from the group consisting of Mn, Ce, Pr, Nd, Sm, Eu, Tb, Dy, and Yb.) is solid solved therein, renders in particular high emission intensity.

The inorganic crystal represented by $Si_xAl_{13-x}O_{3-x}N_{11+x}$ (0<x≤3), which was newly synthesized and confirmed to be a new crystal through the crystal structure analysis by the present inventors, is a crystal which has not been reported prior to the present invention.

Figure 5:
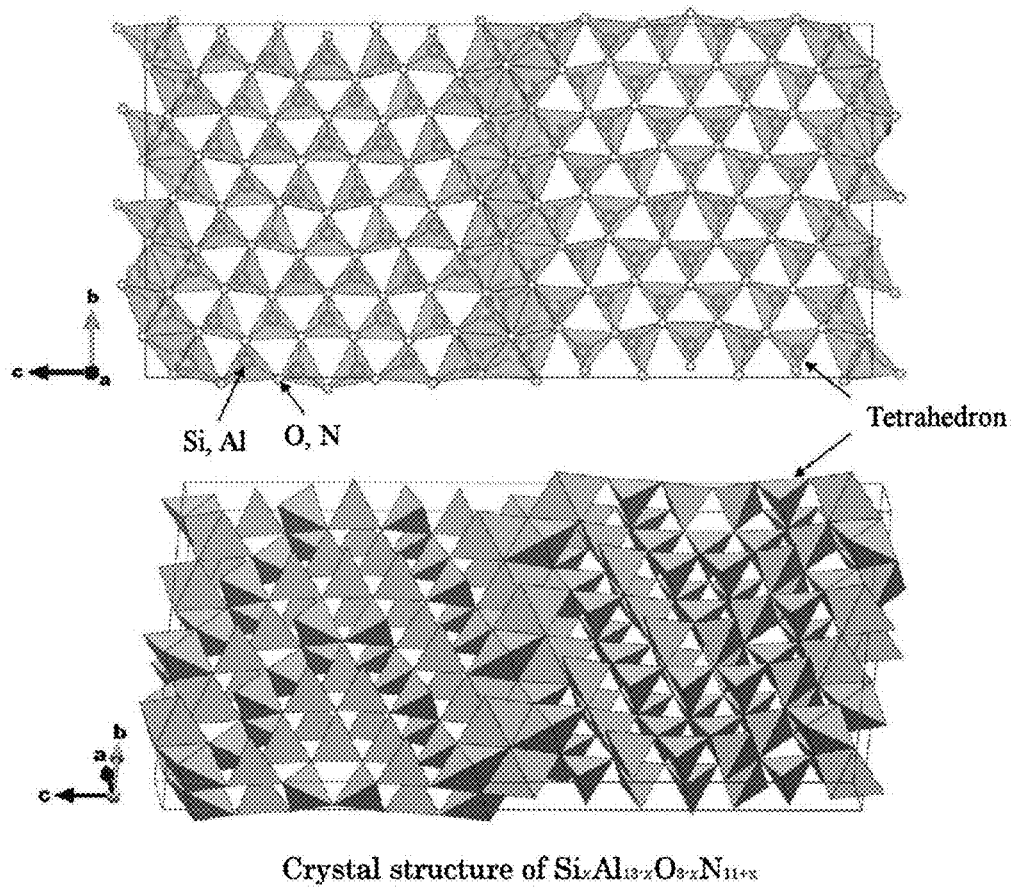
FIG. 5 is a diagram illustrating a crystal structure of $Si_xAl_{13-x}O_{3-x}N_{11+x}$ ($0<x\leq3$) crystal.

FIG. 5 is a diagram showing a crystal structure of $Si_xAl_{13-x}O_{3-x}N_{11+x}$ (x≈2.2) crystal.

According to the single crystal structure analysis performed with respect to the $Si_xAl_{13-x}O_{3-x}N_{11+x}$ crystal synthesized by the present inventors, the $Si_xAl_{13-x}O_{3-x}N_{11+x}$ crystal belongs to the orthorhombic crystal system and the Cmcm space group (space group No. 63 in the International Tables for Crystallography), and has crystal parameters and occupancy of the atomic coordinate positions as shown in Table 3.

In Table 3, lattice constants a1, b1, and c1 signify respective lengths of the axes of the unit cell, and α, β, and γ signify respective angles between axes of the unit cell. The atomic coordinates indicate a position of each atom in the unit cell in terms of a value between 0 and 1 using the unit cell as a unit. In this crystal, there are respective atoms of Si, Al, O, and N and the analysis result showed that Si and Al interexchangeably existed in eighteen (18) kinds of sites from (SiAl(1)) to (SiAl(10)), from (SiAl(11A)) to (SiAl (14A)), and from (SiAl(11B)) to (SiAl(14B)). Further, the analysis result showed that O and N existed in fifteen (15) kinds of sites of ON(1) to ON(15).

TABLE 3

Crystal structure data $Si_xAl_{13-x}O_{3-x}N_{11+x}$ crystal

| Crystal composition | $Si_x Al_{13-x} O_{3-x} N_{11+x}$ (x ≈ 2.2) | | | |
|---|---|---|---|---|
| Formula mass (Z) | 8 | | | |
| Crystal system | Orthorhombic | | | |
| Space group | Cmcm | | | |
| Space group number | 63 | | | |
| Lattice constants | a1 | 3.0749 | | Angstrom |
| | b1 | 18.7065 | | Angstrom |
| | c1 | 38.5432 | | Angstrom |
| | α | 90 | | Degree |
| | β | 90 | | Degree |
| | γ | 90 | | Degree |

| Atoms | Atomic coordinates | | | Site occupancy rate |
|---|---|---|---|---|
| | x | y | z | |
| Si, Al (1) | 0 | 0.3351 | 0.2500 | 1.00 |
| Si, Al (2) | 0 | 0.0901 | 0.2500 | 1.00 |
| Si, Al (3) | 0 | 0.2777 | 0.6320 | 1.00 |
| Si, Al (4) | 0 | 0.1004 | 0.1699 | 1.00 |
| Si, Al (5) | 0 | 0.7112 | 0.2114 | 1.00 |
| Si, Al (6) | 0 | 0.5728 | 0.1014 | 1.00 |
| Si, Al (7) | 0 | 0.3334 | 0.1742 | 1.00 |
| Si, Al (8) | 0 | 0.0466 | 0.6382 | 1.00 |
| Si, Al (9) | 0 | 0.3423 | 0.0947 | 1.00 |
| Si. Al (10) | 0 | 0.4812 | 0.2079 | 1.00 |
| Si, Al (11A) | 0 | 0.1934 | 0.0661 | 0.75 |
| Si, Al (11B) | 0 | 0.1760 | 0.0502 | 0.25 |
| Si, Al (12A) | 0 | 0.2054 | 0.5143 | 0.43 |
| Si, Al (12B) | 0 | 0.1839 | 0.5294 | 0.57 |
| Si, Al (13A) | 0 | 0.5855 | 0.0236 | 0.57 |
| Si, Al (13B) | 0 | 0.5649 | 0.0082 | 0.43 |
| Si, Al (14A) | 0 | 0.0348 | 0.5601 | 0.67 |
| Si, Al (14B) | 0 | 0.0540 | 0.5464 | 0.33 |
| O, N (1) | 0 | 0.4913 | 0.0384 | 1.00 |
| O, N (2) | 0 | 0.3854 | 0.2140 | 1.00 |
| O, N (3) | 0 | 0.5323 | 0.2500 | 1.00 |
| O, N (4) | 0 | 0.1275 | 0.5726 | 1.00 |
| O, N (5) | 0 | 0.7620 | 0.2500 | 1.00 |
| O, N (6) | 0 | 0.2615 | 0.0315 | 1.00 |
| O, N (7) | 0 | 0.1545 | 0.2112 | 1.00 |
| O, N (8) | 0 | 0.1155 | 0.0036 | 1.00 |
| O, N (9) | 0 | 0.2287 | 0.6733 | 1.00 |
| O, N (10) | 0 | 0.6398 | 0.0682 | 1.00 |
| O, N (11) | 0 | 0.3967 | 0.1377 | 1.00 |
| O, N (12) | 0 | 0.0175 | 0.1043 | 1.00 |
| O, N (13) | 0 | 0.2490 | 0.1087 | 1.00 |
| O, N (14) | 0 | 0.0051 | 0.1835 | 1.00 |
| O, N (15) | 0 | 0.6248 | 0.1455 | 1.00 |

As a result of the analysis using data in Table 3, the $Si_xAl_{13-x}O_{3-x}N_{11+x}$ crystal was found to have the structure as shown in FIG. 5, in which a skeleton structure formed by linking tetrahedrons constituted of bonds of Si or Al with O or N was configured. In this crystal, it is plausible that the A element to serve as an activating ion such as Eu might have been incorporated into the crystal by substituting locally four of Si or Al having been bonded to O or N and one of O or N.

As the crystal having the same crystal structure as the $Si_xAl_{13-x}O_{3-x}N_{11+x}$ crystal having been synthesized and analyzed for a structure thereof, there is a $(Si,Al)_{13} (O,N)_{14}$ crystal. In the $(Si,Al)_{13}(O,N)_{14}$ crystal, and in the $Si_xAl_{13-x}O_{3-x}N_{11+x}$ crystal, Si and Al can occupy sites which Si and Al are supposed to occupy without distinguishing the sites mutually, and O and N can occupy sites which O and N are supposed to occupy without distinguishing the sites mutually. Thus, a relative ratio of numbers of atoms can be adjusted to thirteen (13) for the sum of Si and Al and fourteen (14) for the sum of O and N while the crystal structure remains the same. Here, it is desirable to have a ratio of Si/Al and a ratio of O/N satisfy the electrical neutrality condition in the crystal.

In the following, for the simplicity, the inorganic crystal represented by $Si_xAl_{13-x}O_{3-x}N_{11+x}$, the inorganic crystal having the same structure as the $Si_xAl_{13-x}O_{3-x}N_{11+x}$ crystal, and the inorganic crystal including a solid solution of these are called collectively as the $Si_xAl_{13-x}O_{3-x}N_{11+x}$ system crystal.

The $Si_xAl_{13-x}O_{3-x}N_{11+x}$ system crystal of the present invention can be identified by means of the X-ray diffraction or the neutron diffraction. As the substance rendering the same diffraction pattern as the X-ray diffraction pattern result of the $Si_xAl_{13-x}O_{3-x}N_{11+x}$ crystal, as shown with respect to the present invention, there is a crystal having the same crystal structure as the $Si_xAl_{13-x}O_{3-x}N_{11+x}$ crystal and, by way of example, there is an inorganic crystal represented by $(Si,Al)_{13}(O,N)_{14}$. Further, there is a crystal in which a lattice constant and/or an atomic position is changed by substituting a constituent element with another element with respect to the $Si_xAl_{13-x}O_{3-x}N_{11+x}$ crystal. Here, the crystal in which another element substitutes a constituent element includes, for example, a crystal in which an L element other than Si and Al substitutes part of Si or part of Al in the $Si_xAl_{13-x}O_{3-x}N_{11+x}$ crystal (Here, L is a metal element other than Si and Al). Further, there is a crystal in which a Z element other than O and N substitutes part or all of O or part of N in the crystal (Here, Z is a non-metal element other than O and N). These substitutions are performed such that the neutrality of charges in the whole crystal is maintained. It is the $Si_xAl_{13-x}O_{3-x}N_{11+x}$ system crystal that would not change its crystal structure as a result of such element substitutions. Since emission characteristics, chemical stability, and thermal stability of the phosphor are changed by the substitution of elements, the substitution of elements may be selectively utilized at an appropriate time for each application thereof as far as the crystal structure remains the same.

In the $Si_xAl_{13-x}O_{3-x}N_{11+x}$ system crystal, the lattice constants change as the constituent components are substituted with other elements or as an activating element such as Eu is solid-solved therein, but the atomic positions given by the crystal structure, sites to be occupied by atoms, and coordinates thereof do not significantly change to an extent in which a chemical bond between skeleton atoms is broken. In the present invention, a crystal structure is defined to be identical (the same) if lengths of chemical bonds (distance of neighboring atoms) of Al—N, Al—O, SiN and Si—O calculated from the lattice constants and atomic coordinates obtained by conducting Rietveld analysis of the results from the X-ray diffraction or the neutron diffraction in the space group of Cmcm are compared with lengths of chemical bonds calculated from the lattice constants and atomic coordinates of the $Si_xAl_{13-x}O_{3-x}N_{11+x}$ crystal (x≈2.2) as shown in Table 3 such that the difference between the lengths is within ±5%, and using the definition it is determined whether the crystal having the crystal structure belongs to the $Si_xAl_{13-x}O_{3-x}N_{11+x}$ system crystal or not. This determination criterion is employed herein since it was once observed that a crystal in the $Si_xAl_{13-x}O_{3-x}N_{11+x}$ system crystal was changed to become another crystal due to breakage of chemical bonds when lengths of the chemical bonds were changed beyond ±5% according to the prior experiments.

Further, in case an amount of solid-solution is small, a simple method for determining whether it belongs to the $Si_xAl_{13-x}O_{3-x}N_{11+x}$ system crystal or not is described as follows. A new substance can be identified to have the same crystal structure if main peaks of the resultant X-ray diffraction pattern measured with the new substance are respectively located at diffraction peak positions, which agree with the peak positions (2θ) of the diffraction pattern calculated using the crystal structure data of Table 3 and the lattice constants calculated from the resultant X-ray diffraction pattern.

Figure 6:
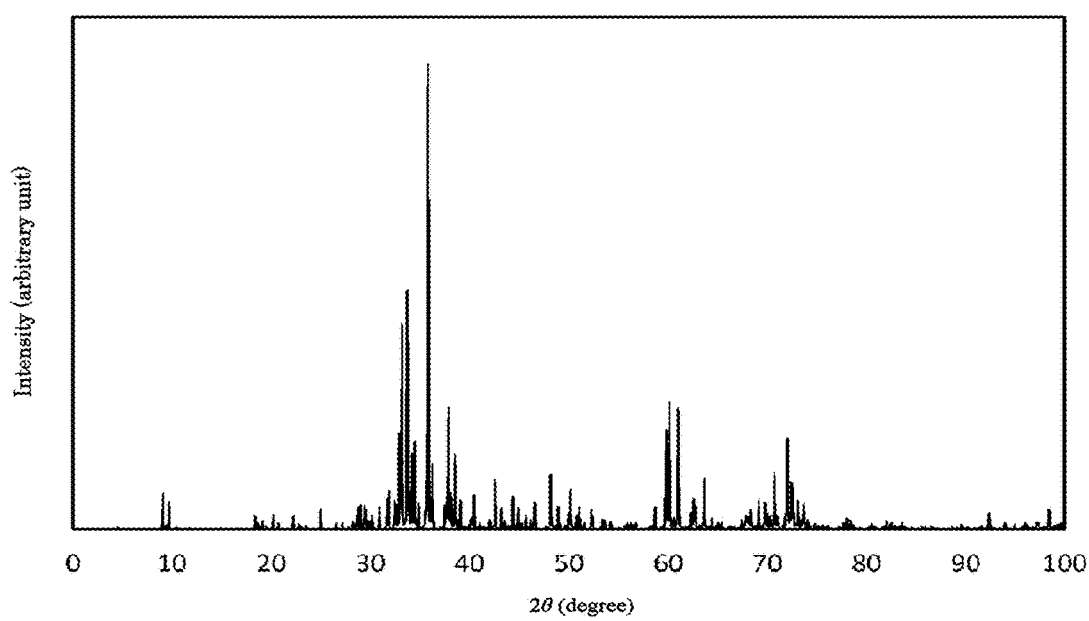
FIG. 6 is a diagram showing a powder X-ray diffraction patter using Cu Kα-line, calculated from a crystal structure of $Si_xAl_{13-x}O_{3-x}N_{11+x}$ ($0<x\leq3$) crystal.

FIG. 6 is a diagram showing a powder X-ray diffraction pattern using Cu Kα-line calculated from the crystal structure of $Si_xAl_{13-x}O_{3-x}N_{11+x}$ crystal.

It is possible to make a simple determination whether a subject substance belongs to the $Si_xAl_{13-x}O_{3-x}N_{11+x}$ system crystal or not by comparing FIG. 6 and that of the subject substance. It may be good to make a judgment using approximately ten (10) peaks of the highest intensity in the diffraction pattern as the main peaks of the $Si_xAl_{13-x}O_{3-x}N_{11+x}$ system crystal. Table 3 is important in this sense since it could be referenced when the identification of the $Si_xAl_{13-x}O_{3-x}N_{11+x}$ system crystal is conducted. Further, it is also possible to define a crystal structure of the $Si_xAl_{13-x}O_{3-x}N_{1+x}$ system crystal as an approximate structure using another crystal system of the orthorhombic crystal system and, in such a case, the crystal structure is expressed using a different space group, different lattice constants, and different plane indices, but the X-ray diffraction results (for example, FIG. 6) and the crystal structure (for example, FIG. 5) remain unchanged such that an identification method and an identification result thereof are the same. Therefore, in the present invention, it is to perform an X-ray diffraction analysis using the orthorhombic crystal system. The method of identifying the substance based on Table 3 will be concretely described in Examples to be described later, and the explanation of the method described herein is just in general.

A phosphor can be obtained if the $Si_xAl_{13-x}O_{3-x}N_{11+x}$ system crystal is activated by, as the A element, one or two or more kinds of elements selected from the group consisting of Mn, Ce, Pr, Nd, Sm, Eu, Tb, Dy, and Yb. Since emission characteristics such as an excitation wavelength, an emission wavelength, and emission intensity may vary depending on the composition of the $Si_xAl_{13-x}O_{3-x}N_{11+x}$ system crystal, and the kind and quantity of the activating element, such conditions may be chosen in accordance with an application thereof.

The inorganic crystal represented by $Si_xAl_{13-x}O_{3-x}N_{11+x}$, the inorganic crystal having the same crystal structure as the inorganic crystal represented by $Si_xAl_{13-x}O_{3-x}N_{11+x}$, or the inorganic crystal including a solid solution of these is a crystal in the orthorhombic crystal system and having a symmetry in the space group Cmcm, and lattice constants a1, b1 and c1 have values in the ranges:
a1=0.30749±0.05 nm,
b1=1.87065±0.05 nm, and
c1=3.85432±0.05 nm,
such that the inorganic crystal is a particularly stable crystal and the phosphor comprising such an inorganic crystal as the host crystal renders high emission intensity. If the crystal is prepared out of the above ranges, the crystal may become unstable and the emission intensity may occasionally decrease.

Preferably, in the case of 1.5≤x≤3, the phosphor renders high emission intensity. More preferably, in the case of 1.8≤x≤3, the phosphor renders further high emission intensity and yet preferably, in the case of 2≤x≤3, the phosphor renders particularly high emission intensity. In the case where the impurity oxygen contained in the raw material is considered, a phosphor of high emission intensity can be preferably obtained if the upper limit of x is set not exceeding 2.9.

An activating element A includes at least Eu. Therefore, a phosphor rendering particularly high emission intensity may be obtained.

Preferably, the phosphor represented by the composition formula of $Si_aAl_bO_cN_dA_eQ_f$ (Here, a+b+c+d+e+f=1 in the formula, and A is one or two or more elements selected from the group consisting of Mn, Ce, Pr, Nd, Sm, Eu, Tb, Dy, and Yb, and Q is one or two or more kinds of elements selected from the group consisting of elements other than Al, Si, O, N, and A) and expressed in the composition in the ranges in which parameters a, b, c, d, e, and f satisfy every condition as recited below:
0.014≤a≤0.111,
0.369≤b<0.48,
0≤c<0.111,
0.406<d<0.517,
0.0001≤e≤0.03, and
0≤f≤0.3 (Here, if the element Q includes a plurality of elements, f is the sum of respective parameters of the plurality of elements.) renders particularly high emission intensity.

The parameter a is a parameter representing the constituent amount of the Si element and if it is less than 0.014 or higher than 0.111, the crystal structure may become unstable such so as to cause the emission intensity to decrease. The parameter b is a parameter representing the constituent amount of the Al element and if it is less than 0.369 or at least 0.48, the crystal structure may become unstable so as to cause the emission intensity to decrease. The parameter c is a parameter representing the constituent amount of the O element and if it is at least 0.111, the crystal structure may become unstable so as to cause the emission intensity to decrease. And, if impurity oxygen contained in the powder raw material is considered, it could be tolerable to contain oxygen within the range less than 0.111 (For example, c is more than 0 and more preferably at least 0.001.) such that the emission intensity could be improved. The parameter d is a parameter representing the constituent amount of the N element, and if the amount is not exceeding 0.406 or at least 0.517, the crystal structure may become unstable so as to cause the emission intensity to decrease. The parameter e represents an additive amount of the activating element A, and if the amount is less than 0.0001, an amount of light-emitting ions is insufficient so as to cause brightness to decrease. If the amount is more than 0.03, the emission intensity may be decreased due to the concentration quenching by a mutual interaction between light-emitting ions. The parameter f is a parameter representing the constituent amount of the Q element other than Al, Si, O, N, and the A element and if the amount is higher than 0.3, the crystal structure may become unstable so as to cause the emission intensity to decrease. A parameter of each element is determined in order to fix the composition such that the charge neutrality of Al, Si, and the A element as the cation and O, N, and the Q element as the anion may be maintained.

Further, it is preferable that the phosphor having the crystal, in which parameters a, b, c, d, e, and f are values in the ranges that satisfy all conditions recited below:
0.0185≤a≤0.1107,
0.369≤b≤0.4613,
0≤c≤0.0923,
0.4244≤d≤0.5166,
0.0001≤e≤0.0196, and
0≤f≤0.0233,
has a stable crystal structure and renders high emission intensity.

Further, it is preferable that the phosphor having the crystal, in which parameters a, b, c, d, e, and f are values in the ranges that satisfy all conditions recited below:

$0.05 \leq a \leq 0.1107$, $0.369 \leq b \leq 0.43$, $0 \leq c \leq 0.056$, $0.45 \leq d \leq 0.5166$, $0.0001 \leq e \leq 0.0196$, and $0 \leq f \leq 0.0233$, has a stable crystal structure and renders particularly high emission intensity.

Yet, it is preferable that the phosphor having the crystal, in which parameters a, b, c, d, e, and f are values in the ranges that satisfy all conditions recited below:

$0.0738 \leq a \leq 0.1107$, $0.369 \leq b \leq 0.4059$, $0 \leq c \leq 0.0369$, $0.4797 \leq d \leq 0.5166$, $0.0004 \leq e \leq 0.0196$, and $0 \leq f \leq 0.0233$, has a stable crystal structure and renders particularly high emission intensity.

Among the phosphor having, as the host crystal, an inorganic crystal represented by $M_n X_{n+1}$, in particular, an inorganic crystal represented by $Si_x Al_{m+2-x} O_{3-x} N_{m+x}$ (m=n−2, 0<x≤3, and 1≤m≤50), a phosphor comprising an inorganic compound including an inorganic crystal represented by $Si_x Al_{14-x} O_{3-x} N_{12+x}$ (0<x≤3) with m=12 (n=14) (Here, it is also referred to as simply $Si_x Al_{14-x} O_{3-x} N_{12+x}$ crystal), a crystal having the same crystal structure as the inorganic crystal represented by $Si_x Al_{14-x} O_{3-x} N_{12+x}$ (0<x≤3), or an inorganic crystal including a solid solution of these, in which an A element (Here, A is one or two or more kinds of elements selected from the group consisting of Mn, Ce, Pr, Nd, Sm, Eu, Tb, Dy, and Yb.) is solid solved therein, renders in particular high emission intensity.

The inorganic crystal represented by $Si_x Al_{14-x} O_{3-x} N_{12+x}$ (0<x≤3), which was newly synthesized and confirmed to be a new crystal through the crystal structure analysis by the present inventors, is a crystal which has not been reported prior to the present invention.

Figure 7:
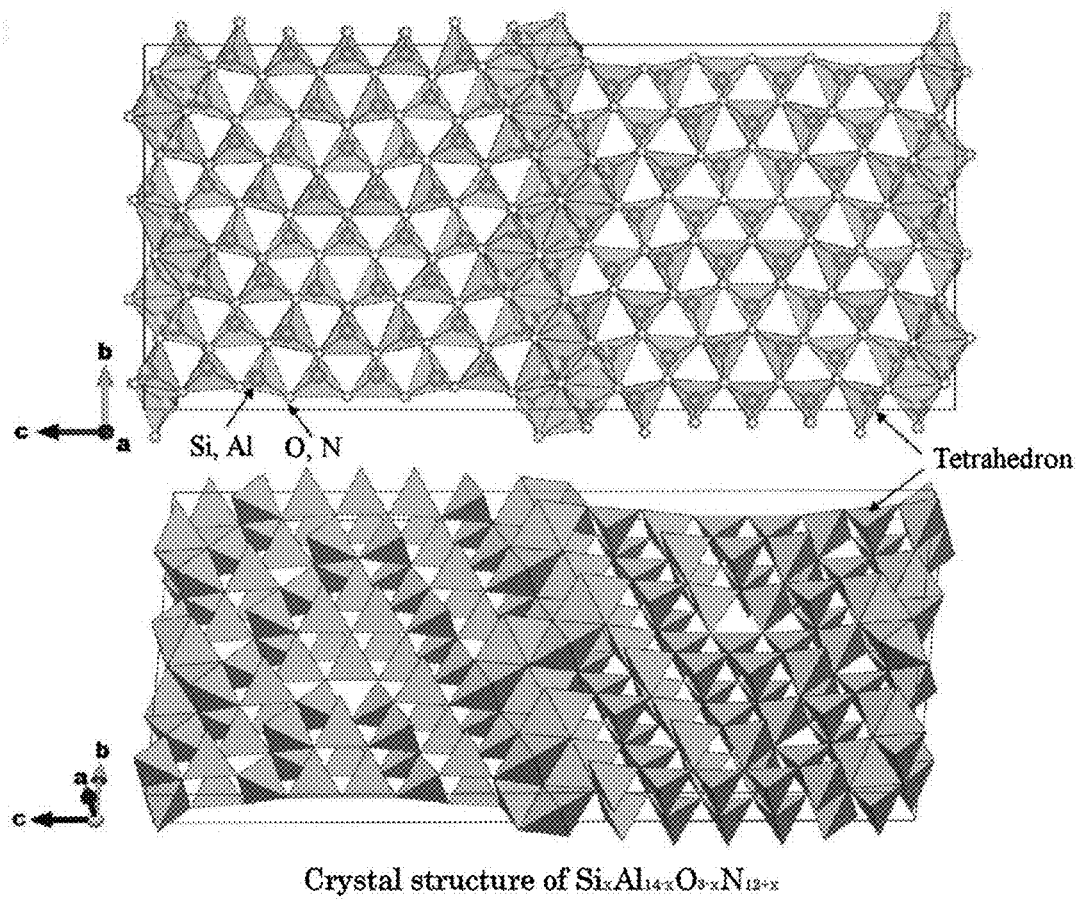
FIG. 7 is a diagram illustrating a crystal structure of $Si_xAl_{14-x}O_{3-x}N_{12+x}$ ($0<x\leq3$) crystal.

FIG. 7 is a diagram showing a crystal structure of $Si_x Al_{14-x} O_{3-x} N_{12+x}$ crystal.

According to the single crystal structure analysis performed with respect to the $Si_x Al_{14-x} O_{3-x} N_{12+x}$ crystal synthesized by the present inventors, the $Si_x Al_{14-x} O_{3-x} N_{12+x}$ crystal belongs to the orthorhombic crystal system and the Cmcm space group (space group No. 63 in the International Tables for Crystallography), and has crystal parameters and occupancy of the atomic coordinate positions as shown in Table 4.

In Table 4, lattice constants a1, b1, and c1 signify respective lengths of the axes of the unit cell, and a, R and γ signify respective angles between axes of the unit cell. The atomic coordinates indicate a position of each atom in the unit cell in terms of a value from 0 to 1 using the unit cell as a unit. In this crystal, there are respective atoms of Si, Al, O, and N and the analysis result showed that Si and Al interexchangeably existed in nineteen (19) kinds of sites from (SiAl(1)) to (SiAl(11)), from (SiAl(12A)) to (SiAl(15A)), and from (SiAl(12B)) to (SiAl(15B)). Further, the analysis result showed that O and N existed in sixteen (16) kinds of sites of ON(1) to ON(16).

TABLE 4

| Crystal structure data of $Si_x Al_{14-x} O_{3-x} N_{12+x}$ crystal | | | |
|---|---|---|---|
| Crystal composition | | $Si_x Al_{14-x} O_{3-x} N_{12+x}$ (x = 3) | |
| Formula mass (Z) | | 8 | |
| Crystal system | | Orthorhombic | |
| Space group | | Cmcm | |
| Space group number | | 63 | |
| Lattice constants | a1 | 3.0722 | Angstrom |
| | b1 | 18.7210 | Angstrom |
| | c1 | 41.4890 | Angstrom |
| | α | 90 | Degree |
| | β | 90 | Degree |
| | γ | 90 | Degree |

| | Atomic coordinates | | | Site occupancy |
|---|---|---|---|---|
| Atoms | x | y | z | rate |
| Si, Al (1) | 0 | 0.7833 | 0.2500 | 1.00 |
| Si, Al (2) | 0 | 0.2093 | 0.6751 | 1.00 |
| Si, Al (3) | 0 | 0.0240 | 0.1791 | 1.00 |
| Si, Al (4) | 0 | 0.4037 | 0.2134 | 1.00 |
| Si, Al (5) | 0 | 0.0247 | 0.2500 | 1.00 |
| Si, Al (6) | 0 | 0.6438 | 0.1466 | 1.00 |
| Si, Al (7) | 0 | 0.4119 | 0.1394 | 1.00 |
| Si, Al (8) | 0 | 0.2628 | 0.1118 | 1.00 |
| Si, Al (9) | 0 | 0.1168 | 0.5767 | 1.00 |
| Si. Al (10) | 0 | 0.0330 | 0.1052 | 1.00 |
| Si, Al (11) | 0 | 0.1682 | 0.2112 | 1.00 |
| Si, Al (12A) | 0 | 0.5056 | 0.0436 | 0.69 |
| Si, Al (12B) | 0 | 0.4854 | 0.0299 | 0.31 |
| Si. Al (13A) | 0 | 0.2750 | 0.0382 | 0.67 |
| Si, Al (13B) | 0 | 0.2530 | 0.0235 | 0.33 |
| Si, Al (14A) | 0 | 0.6547 | 0.0724 | 0.76 |
| Si, Al (14B) | 0 | 0.6354 | 0.0567 | 0.25 |
| Si, Al (15A) | 0 | 0.1058 | 0.5041 | 0.56 |
| Si, Al (15B) | 0 | 0.1267 | 0.0103 | 0.44 |
| O, N (1) | 0 | 0.6952 | 0.1868 | 1.00 |
| O, N (2) | 0 | 0.1542 | 0.7142 | 1.00 |
| O, N (3) | 0 | 0.0629 | 0.6169 | 1.00 |
| O, N (4) | 0 | 0.0752 | 0.2159 | 1.00 |
| O, N (5) | 0 | 0.4637 | 0.2500 | 1.00 |
| O, N (6) | 0 | 0.0855 | 0.1449 | 1.00 |
| O, N (7) | 0 | 0.3172 | 0.1518 | 1.00 |
| O, N (8) | 0 | 0.5596 | 0.0839 | 1.00 |
| O, N (9) | 0 | 0.1974 | 0.5184 | 1.00 |
| O, N (10) | 0 | 0.3294 | 0.0790 | 1.00 |
| O, N (11) | 0 | 0.5741 | 0.0131 | 1.00 |
| O, N (12) | 0 | 0.2919 | 0.6129 | 1.00 |
| O, N (13) | 0 | 0.4653 | 0.1785 | 1.00 |
| O, N (14) | 0 | 0.0491 | 0.5457 | 1.00 |
| O, N (15) | 0 | 0.2197 | 0.2500 | 1.00 |
| O, N (16) | 0 | 0.1828 | 0.0518 | 1.00 |

As a result of the analysis using data in Table 4, the $Si_x Al_{14-x} O_{3-x} N_{12+x}$ crystal was found to have the structure as shown in FIG. 7, in which a skeleton structure formed by linking tetrahedrons constituted of bonds of Si or Al with O or N was configured. In this crystal, it is plausible that the A element to serve as an activating ion such as Eu might have been incorporated into the crystal by substituting locally four of Si or Al having been bonded to O or N and one of O or N.

As the crystal having the same crystal structure as the $Si_x Al_{14-x} O_{3-x} N_{12+x}$ crystal having been synthesized and analyzed for a structure thereof, there is a $(Si, Al)_{14}(O, N)_{15}$ crystal. In the $(Si, Al)_{14} (O, N)_{15}$ crystal, and in the $Si_x Al_{14-x} O_{3-x} N_{12+x}$ crystal, Si and Al can occupy sites which Si and Al are supposed to occupy without distinguishing the sites mutually, and O and N can occupy sites which O and N are supposed to occupy without distinguishing the sites mutually. Thus, a relative ratio of numbers of atoms can be adjusted to fourteen (14) for the sum of Si and Al and fifteen (15) for the sum of O and N while the crystal structure remains the same. Here, it is desirable to have a ratio of Si/Al and a ratio of O/N satisfy the electrical neutrality condition in the crystal.

In the following, for the simplicity, the inorganic crystal represented by $Si_xAl_{14-x}O_{3-x}N_{12+x}$, the inorganic crystal having the same structure as the $Si_xAl_{14-x}O_{3-x}N_{12+x}$ crystal, and the inorganic crystal including a solid solution of these are called collectively as the $Si_xAl_{14-x}O_{3-x}N_{12+x}$ system crystal.

The $Si_xAl_{14-x}O_{3-x}N_{12+x}$ system crystal of the present invention can be identified by means of the X-ray diffraction or the neutron diffraction. As the substance rendering the same diffraction pattern as the X-ray diffraction pattern result of the $Si_xAl_{14-x}O_{3-x}N_{12+x}$ crystal, as shown with respect to the present invention, there is a crystal having the same crystal structure as the $Si_xAl_{14-x}O_{3-x}N_{12+x}$ crystal and, by way of example, there is an inorganic crystal represented by $(Si,Al)_{14}(O,N)_{15}$. Further, there is a crystal in which a lattice constant and/or an atomic position is changed by substituting a constituent element with another element with respect to the $Si_xAl_{14-x}O_{3-x}N_{12+x}$ crystal. Here, the crystal in which another element substitutes a constituent element includes, for example, a crystal in which an L element other than Si and Al substitutes part of Si or part of Al in the $Si_xAl_{14-x}O_{3-x}N_{12+x}$ crystal (Here, L is a metal element other than Si and Al). Further, there is a crystal in which a Z element other than O and N substitutes part or all of O or part of N in the crystal (Here, Z is a non-metal element other than O and N). These substitutions are performed such that the neutrality of charges in the whole crystal is maintained. It is the $Si_xAl_{14-x}O_{3-x}N_{12+x}$ system crystal that would not change its crystal structure as a result of such element substitutions. Since emission characteristics, chemical stability, and thermal stability of the phosphor are changed by the substitution of elements, the substitution of elements may be selectively utilized at an appropriate time for each application thereof as far as the crystal structure remains the same.

In the $Si_xAl_{14-x}O_{3-x}N_{12+x}$ system crystal, the lattice constants change as the constituent components are substituted with other elements or as an activating element such as Eu is solid-solved therein, but the atomic positions given by the crystal structure, sites to be occupied by atoms, and coordinates thereof do not significantly change to an extent in which a chemical bond between skeleton atoms is broken. In the present invention, a crystal structure is defined to be identical (the same) if lengths of chemical bonds (distance of neighboring atoms) of Al—N, Al—O, SiN, and Si—O calculated from the lattice constants and atomic coordinates obtained by conducting Rietveld analysis of the results from the X-ray diffraction or the neutron diffraction in the space group of Cmcm are compared with lengths of chemical bonds calculated from the lattice constants and atomic coordinates of the $Si_xAl_{14-x}O_{3-x}N_{12+x}$ crystal (x=3) as shown in Table 4 such that the difference between the lengths is within ±5%, and using the definition it is determined whether the crystal having the crystal structure belongs to the $Si_xAl_{14-x}O_{3-x}N_{12+x}$ system crystal or not. This determination criterion is employed herein since it was once observed that a crystal in the $Si_xAl_{14-x}O_{3-x}N_{12+x}$ system crystal was changed to become another crystal due to breakage of chemical bonds when lengths of the chemical bonds were changed beyond ±5% according to the prior experiments.

Further, in case an amount of solid-solution is small, a simple method for determining whether it belongs to the $Si_xAl_{14-x}O_{3-x}N_{12+x}$ system crystal or not is described as follows. A new substance can be identified to have the same crystal structure if main peaks of the resultant X-ray diffraction pattern measured with the new substance are respectively located at diffraction peak positions, which agree with the peak positions (2θ) of the diffraction pattern calculated using the crystal structure data of Table 4 and the lattice constants calculated from the resultant X-ray diffraction pattern.

Figure 8:
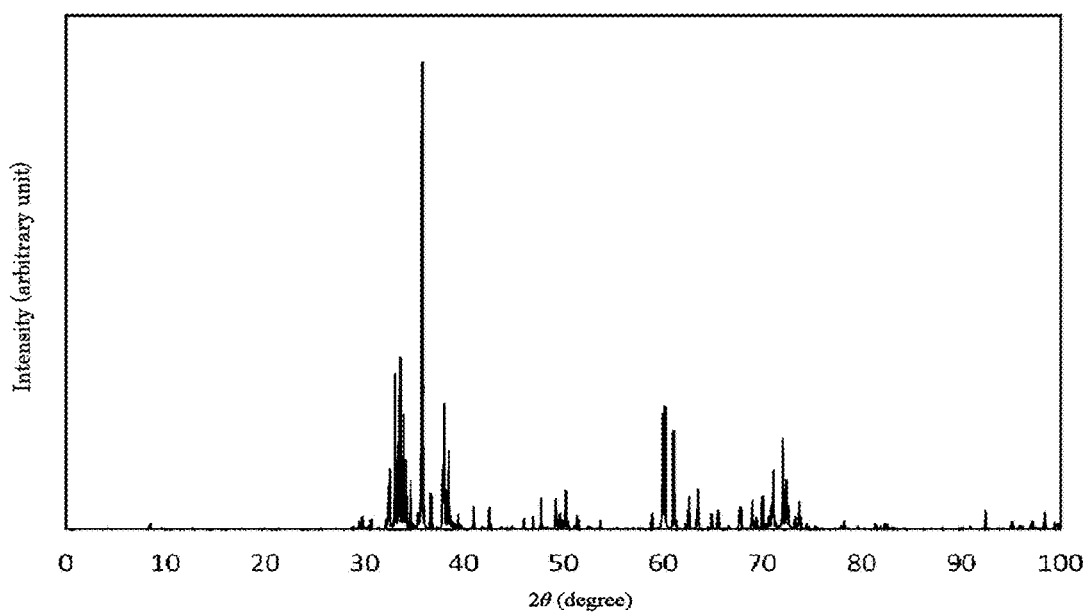
FIG. 8 is a diagram showing a powder X-ray diffraction patter using Cu Kα-line, calculated from a crystal structure of $Si_xAl_{14-x}O_{3-x}N_{12+x}$ (0<x≤3) crystal.

FIG. 8 shows a diagram showing a powder X-ray diffraction pattern using Cu Kα-line calculated from the crystal structure of $Si_xAl_{14-x}O_{3-x}N_{12+x}$ crystal.

It is possible to make a simple determination whether a subject substance belongs to the $Si_xAl_{14-x}O_{3-x}N_{12+x}$ system crystal or not by comparing FIG. 8 and that of the subject substance. It may be good to make a judgment using approximately ten (10) peaks of the highest intensity in the diffraction pattern as the main peaks of the $Si_xAl_{14-x}O_{3-x}N_{12+x}$ system crystal. Table 4 is important in this sense since it could be referenced when the identification of the $Si_xAl_{14-x}O_{3-x}N_{12+x}$ system crystal is conducted. Further, it is also possible to define a crystal structure of the $Si_xAl_{14-x}O_{3-x}N_{12+x}$ system crystal as an approximate structure using another crystal system of the orthorhombic crystal system and, in such a case, the crystal structure is expressed using a different space group, different lattice constants, and different plane indices, but the X-ray diffraction results (for example, FIG. 8) and the crystal structure (for example, FIG. 7) remain unchanged such that an identification method and an identification result thereof are the same. Therefore, in the present invention, it is to perform an X-ray diffraction analysis using the orthorhombic crystal system. The method of identifying the substance based on Table 4 will be concretely described in Examples to be described later, and the explanation of the method described herein is just in general.

A phosphor can be obtained if the $Si_xAl_{14-x}O_{3-x}N_{12+x}$ system crystal is activated by, as the A element, one or two or more kinds of elements selected from the group consisting of Mn, Ce, Pr, Nd, Sm, Eu, Tb, Dy, and Yb. Since emission characteristics such as an excitation wavelength, an emission wavelength, and emission intensity may vary depending on the composition of the $Si_xAl_{14-x}O_{3-x}N_{12+x}$ system crystal, and the kind and quantity of the activating element, such conditions may be chosen in accordance with an application thereof.

The inorganic crystal represented by $Si_xAl_{14-x}O_{3-x}N_{12+x}$ r the inorganic crystal having the same crystal structure as the inorganic crystal represented by $Si_xAl_{14-x}O_{3-x}N_{12+x}$, or the inorganic crystal including a solid solution of these is a crystal in the orthorhombic crystal system and having a symmetry in the space group Cmcm, and lattice constants a1, b1 and c1 have values in the ranges:

a1=0.30722±0.05 nm,
b1=1.87210±0.05 nm, and
c1=4.14890±0.05 nm, such that the inorganic crystal is a particularly stable crystal and the phosphor comprising such an inorganic crystal as the host crystal renders high emission intensity. If the crystal is prepared out of the above ranges, the crystal may become unstable and the emission intensity may occasionally decrease.

Preferably, in the case of 1.5≤x≤3, the phosphor renders high emission intensity. More preferably, in the case of 1.8≤x≤3, the phosphor renders further high emission intensity and yet preferably, in the case of 2≤x≤3, the phosphor renders particularly high emission intensity. In the case where the impurity oxygen contained in the raw material is considered, a phosphor of high emission intensity can be preferably obtained if the upper limit of x is set not exceeding 2.9.

An activating element A includes at least Eu. Therefore, a phosphor rendering particularly high emission intensity may be obtained.

Preferably, the phosphor represented by the composition formula of $Si_aAl_bO_cN_dA_eQ_f$ (Here, a+b+c+d+e+f=1 in the formula, and A is one or two or more elements selected from the group consisting of Mn, Ce, Pr, Nd, Sm, Eu, Tb, Dy, and Yb, and Q is one or two or more kinds of elements selected from the group consisting of elements other than Al, Si, O, N, and A) and expressed in the composition in the ranges in which parameters a, b, c, d, e, and f satisfy every condition as recited below:
$0.012 \leq a \leq 0.1031$,
$0.378 \leq b < 0.48$,
$0 \leq c < 0.103$,
$0.412 < d < 0.516$,
$0.0001 \leq e \leq 0.03$, and
$0 \leq f \leq 0.3$ (Here, if the element Q includes a plurality of elements, f is the sum of respective parameters of the plurality of elements), renders particularly high emission intensity.

The parameter a is a parameter representing the constituent amount of the Si element and if it is less than 0.012 or higher than 0.1031, the crystal structure may become unstable so as to cause the emission intensity to decrease. The parameter b is a parameter representing the constituent amount of the Al element and if it is less than 0.378 or at least 0.48, the crystal structure may become unstable so as to cause the emission intensity to decrease. The parameter c is a parameter representing the constituent amount of the O element and if it is at least 0.103, the crystal structure may become unstable so as to cause the emission intensity to decrease. And, if impurity oxygen contained in the powder raw material is considered, it could be tolerable to contain oxygen within the range less than 0.103 (For example, c is more than 0 and more preferably at least 0.001.) such that the emission intensity could be improved. The parameter d is a parameter representing the constituent amount of the N element, and if it is not exceeding 0.412 or at least 0.516, the crystal structure may become unstable so as to cause the emission intensity to decrease. The parameter e represents an additive amount of the activating element A, and if the amount is less than 0.0001, an amount of light-emitting ions is insufficient so as to cause brightness to decrease. If the amount is more than 0.03, the emission intensity may be decreased due to the concentration quenching by a mutual interaction between light-emitting ions. The parameter f is a parameter representing the constituent amount of the Q element other than Al, Si, O, N, and the A element and if the amount is higher than 0.3, the crystal structure may become unstable so as to cause the emission intensity to decrease. A parameter of each element is determined in order to fix the composition such that the charge neutrality of Al, Si, and the A element as the cation and O, N, and the Q element as the anion may be maintained.

Further, it is preferable that the phosphor having the crystal, in which parameters a, b, c, d, e, and f are values in the ranges that satisfy all conditions recited below:
$0.0172 \leq a \leq 0.1031$,
$0.378 \leq b \leq 0.4639$,
$0 \leq c \leq 0.0859$,
$0.4296 \leq d \leq 0.5155$,
$0.0001 \leq e \leq 0.0196$, and
$0 \leq f \leq 0.0233$,
has a stable crystal structure and renders high emission intensity.

Further, it is preferable that the phosphor having the crystal, in which parameters a, b, c, d, e, and f are values in the ranges that satisfy all conditions recited below:
$0.0515 \leq a \leq 0.1031$,
$0.378 \leq b \leq 0.4296$,
$0 \leq c \leq 0.0515$,
$0.4639 \leq d \leq 0.5155$,
$0.0001 \leq e \leq 0.0196$, and
$0 \leq f \leq 0.0233$,
has a stable crystal structure and renders particularly high emission intensity.

Yet, it is preferable that the phosphor having the crystal, in which parameters a, b, c, d, e, and f are values in the ranges that satisfy all conditions recited below:
$0.0687 \leq a \leq 0.1031$,
$0.378 \leq b \leq 0.4124$,
$0 \leq c \leq 0.0344$,
$0.4811 \leq d \leq 0.5155$,
$0.0004 \leq e \leq 0.0196$, and
$0 \leq f \leq 0.0233$,
has a stable crystal structure and renders particularly high emission intensity.

Among the phosphor having, as the host crystal, an inorganic crystal represented by $M_nX_{n+1}$, in particular, an inorganic crystal represented by $Si_xAl_{m+2-x}O_{3-x}N_{m+x}$ (m=n-2, 0<x≤3, and 1≤m≤50), a phosphor comprising an inorganic compound including an inorganic crystal represented by $Si_xAl_{15-x}O_{3-x}N_{13+x}$ (0<x≤3) with m=13 (n=15) (Here, it is also referred to as simply $Si_xAl_{15-x}O_{3-x}N_{13+x}$ crystal), a crystal having the same crystal structure as the inorganic crystal represented by $Si_xAl_{15-x}O_{3-x}N_{13+x}$ (0<x≤3), or an inorganic crystal including a solid solution of these, in which an A element (Here, A is one or two or more kinds of elements selected from the group consisting of Mn, Ce, Pr, Nd, Sm, Eu, Tb, Dy, and Yb.) is solid solved therein, renders in particular high emission intensity.

The inorganic crystal represented by $Si_xAl_{15-x}O_{3-x}N_{13+x}$ (0<x≤3), which was newly synthesized and confirmed to be a new crystal through the crystal structure analysis by the present inventors, is a crystal which has not been reported prior to the present invention.

Figure 9:
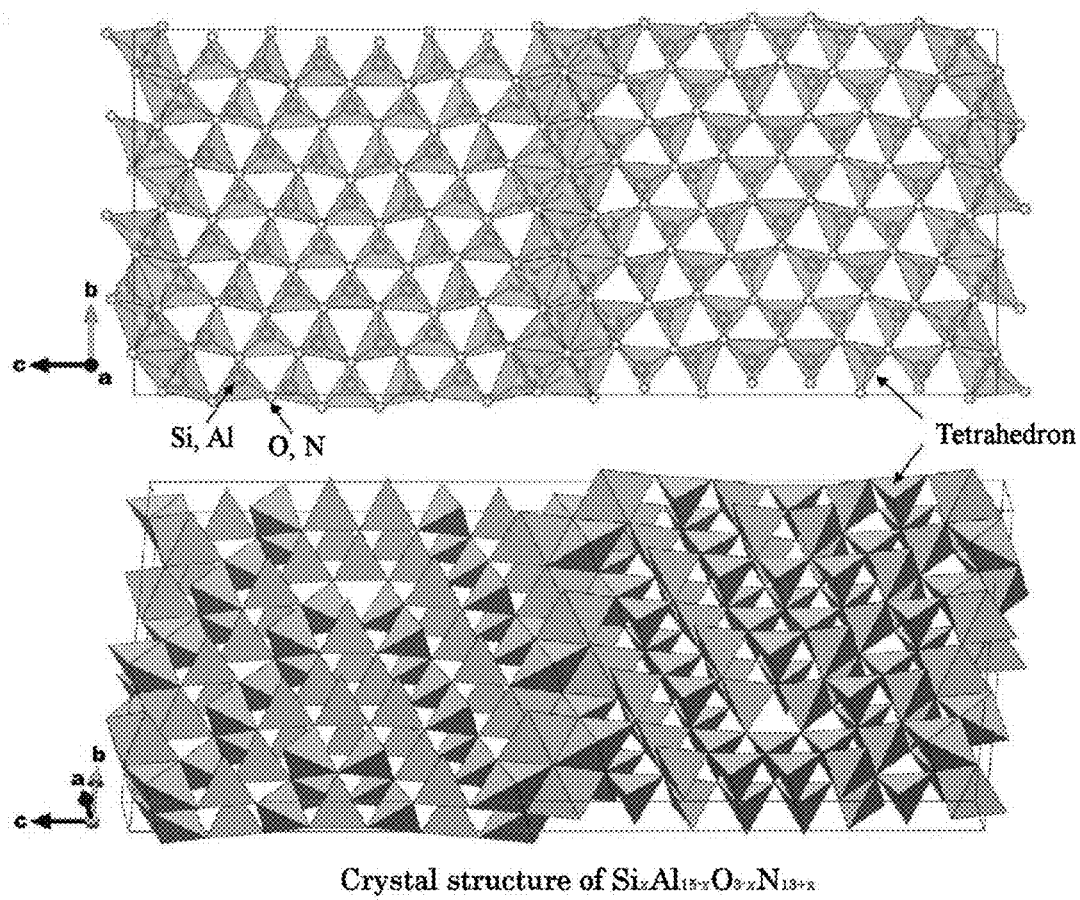
FIG. 9 is a diagram illustrating a crystal structure of $Si_xAl_{15-x}O_{3-x}N_{13+x}$ (0<x≤3) crystal.

FIG. 9 is a diagram showing a crystal structure of $Si_xAl_{15-x}O_{3-x}N_{13+x}$ crystal.

According to the single crystal structure analysis performed with respect to the $Si_xAl_{15-x}O_{3-x}N_{13+x}$ crystal synthesized by the present inventors, the $Si_xAl_{15-x}O_{3-x}N_{13+x}$ crystal belongs to the orthorhombic crystal system and the Cmcm space group (space group No. 63 in the International Tables for Crystallography), and has crystal parameters and occupancy of the atomic coordinate positions as shown in Table 5.

In Table 5, lattice constants a1, b1, and c1 signify respective lengths of the axes of the unit cell, and α, β, and γ signify respective angles between axes of the unit cell. The atomic coordinates indicate a position of each atom in the unit cell in terms of a value from 0 to 1 using the unit cell as a unit. In this crystal, there are respective atoms of Si, Al, O, and N and the analysis result showed that Si and Al interexchangeably existed in twenty (20) kinds of sites from (SiAl(1)) to (SiAl(12)), from (SiAl(13A)) to (SiAl(16A)), and from (SiAl(13B)) to (SiAl(16B)). Further, the analysis result showed that O and N existed in seventeen (17) kinds of sites of ON(1) to ON(17).

TABLE 5

Crystal structure data of $Si_xAl_{15-x}O_{3-x}N_{13+x}$ crystal

| Crystal composition | $Si_xAl_{15-x}O_{3-x}N_{13+x}$ (x = 2.3) | | |
|---|---|---|---|
| Formula mass (Z) | 8 | | |
| Crystal system | Orthorhombic | | |
| Space group | Cmcm | | |
| Space group number | 63 | | |
| Lattice constants | a1 | 3.081 | Angstrom |
| | b1 | 18.7354 | Angstrom |
| | c1 | 44.1775 | Angstrom |
| | α | 90 | Degree |
| | β | 90 | Degree |
| | γ | 90 | Degree |

| Atoms | Atomic coordinates | | | Site occupancy rate |
|---|---|---|---|---|
| | x | y | z | |
| Si, Al (1) | 0 | 0.4704 | 0.2500 | 1.00 |
| Si. Al (2) | 0 | 0.4797 | 0.1798 | 1.00 |
| Si, Al (3) | 0 | 0.7101 | 0.1833 | 1.00 |
| Si, Al (4) | 0 | 0.8994 | 0.6468 | 1.00 |
| Si, Al (5) | 0 | 0.9089 | 0.7160 | 1.00 |
| Si, Al (6) | 0 | 0.3314 | 0.1531 | 1.00 |
| Si, Al (7) | 0 | 0.7218 | 0.1146 | 1.00 |
| Si, Al (8) | 0 | 0.8573 | 0.2136 | 1.00 |
| Si, Al (9) | 0 | 0.5716 | 0.0876 | 1.00 |
| Si, Al (10) | 0 | 0.3415 | 0.0822 | 1.00 |
| Si, Al (11) | 0 | 0.9519 | 0.1205 | 1.00 |
| Si, Al (12) | 0 | 0.7111 | 0.2500 | 1.00 |
| Si. Al (13A) | 0 | 0.8061 | 0.5567 | 0.75 |
| Si, Al (13B) | 0 | 0.8272 | 0.5421 | 0.25 |
| Si, Al (14A) | 0 | 0.9640 | 0.0513 | 0.66 |
| Si, Al (14B) | 0 | 0.9407 | 0.0376 | 0.34 |
| Si, Al (15A) | 0 | 0.8146 | 0.0246 | 0.60 |
| Si, Al (15B) | 0 | 0.7927 | 0.0117 | 0.40 |
| Si, Al (16A) | 0 | 0.5834 | 0.0196 | 0.64 |
| Si, Al (16B) | 0 | 0.5647 | 0.0060 | 0.36 |
| O, N (1) | 0 | 0.7609 | 0.2181 | 1.00 |
| O, N (2) | 0 | 0.5335 | 0.2164 | 1.00 |
| O, N (3) | 0 | 0.3965 | 0.1213 | 1.00 |
| O, N (4) | 0 | 0.9096 | 0.2500 | 1.00 |
| O, N (5) | 0 | 0.3837 | 0.1903 | 1.00 |
| O, N (6) | 0 | 0.1497 | 0.2500 | 1.00 |
| O, N (7) | 0 | 0.8470 | 0.6828 | 1.00 |
| O, N (8) | 0 | 0.8706 | 0.0646 | 1.00 |
| O, N (9) | 0 | 0.6256 | 0.1256 | 1.00 |
| O, N (10) | 0 | 0.7522 | 0.5952 | 1.00 |
| O, N (11) | 0 | 0.9805 | 0.5905 | 1.00 |
| O, N (12) | 0 | 0.7368 | 0.5268 | 1.00 |
| O, N (13) | 0 | 0.9947 | 0.6583 | 1.00 |
| O, N (14) | 0 | 0.7751 | 0.1521 | 1.00 |
| O, N (15) | 0 | 0.6391 | 0.0573 | 1.00 |
| O, N (16) | 0 | 0.4910 | 0.0325 | 1.00 |
| O, N (17) | 0 | 0.8857 | 0.5020 | 1.00 |

As a result of the analysis using data in Table 5, the $Si_xAl_{15-x}O_{3-x}N_{13+x}$ crystal was found to have the structure as shown in FIG. 9, in which a skeleton structure formed by linking tetrahedrons constituted of bonds of Si or Al with O or N was configured. In this crystal, it is plausible that the A element to serve as an activating ion such as Eu might have been incorporated into the crystal by substituting locally four of Si or Al having been bonded to O or N and one of O or N.

As the crystal having the same crystal structure as the $Si_xAl_{15-x}O_{3-x}N_{13+x}$ crystal having been synthesized and analyzed for a structure thereof, there is a $(Si, Al)_{15}(O, N)_{16}$ crystal. In the $(Si, Al)_{15}(O, N)_{16}$ crystal, and in the $Si_xAl_{15-x}O_{3-x}N_{13+x}$ crystal, Si and Al can occupy sites which Si and Al are supposed to occupy without distinguishing the sites mutually, and O and N can occupy sites which O and N are supposed to occupy without distinguishing the sites mutually. Thus, a relative ratio of numbers of atoms can be adjusted to fifteen (15) for the sum of Si and Al and sixteen (16) for the sum of O and N while the crystal structure remains the same. Here, it is desirable to have a ratio of Si/Al and a ratio of O/N satisfy the electrical neutrality condition in the crystal.

In the following, for the simplicity, the inorganic crystal represented by $Si_xAl_{15-x}O_{3-x}N_{13+x}$, the inorganic crystal having the same structure as the $Si_xAl_{15-x}O_{3-x}N_{13+x}$ crystal, and the inorganic crystal including a solid solution of these are called collectively as the $Si_xAl_{15-x}O_{3-x}N_{13+x}$ system crystal.

The $Si_xAl_{15-x}O_{3-x}N_{13+x}$ system crystal of the present invention can be identified by means of the X-ray diffraction or the neutron diffraction. As the substance rendering the same diffraction pattern as the X-ray diffraction pattern result of the $Si_xAl_{15-x}O_{3-x}N_{13+x}$ crystal, as shown with respect to the present invention, there is a crystal having the same crystal structure as the $Si_xAl_{15-x}O_{3-x}N_{13+x}$ crystal and, by way of example, there is an inorganic crystal represented by $(Si,Al)_{15}(O,N)_{16}$. Further, there is a crystal in which a lattice constant and/or an atomic position is changed by substituting a constituent element with another element with respect to the $Si_xAl_{15-x}O_{3-x}N_{13+x}$ crystal. Here, the crystal in which another element substitutes a constituent element includes, for example, a crystal in which an L element other than Si and Al substitutes part of Si or part of Al in the $Si_xAl_{15-x}O_{3-x}N_{13+x}$ crystal (Here, L is a metal element other than Si and Al). Further, there is a crystal in which a Z element other than O and N substitutes part or all of O or part of N in the crystal (Here, Z is a non-metal element other than O and N). These substitutions are performed such that the neutrality of charges in the whole crystal is maintained. It is the $Si_xAl_{15-x}O_{3-x}N_{13+x}$ system crystal that would not change its crystal structure as a result of such element substitutions. Since emission characteristics, chemical stability, and thermal stability of the phosphor are changed by the substitution of elements, the substitution of elements may be selectively utilized at an appropriate time for each application thereof as far as the crystal structure remains the same.

In the $Si_xAl_{15-x}O_{3-x}N_{13+x}$ system crystal, the lattice constants change as the constituent components are substituted with other elements or as an activating element such as Eu is solid-solved therein, but the atomic positions given by the crystal structure, sites to be occupied by atoms, and coordinates thereof do not significantly change to an extent in which a chemical bond between skeleton atoms is broken. In the present invention, a crystal structure is defined to be identical (the same) if lengths of chemical bonds (distance of neighboring atoms) of Al—N, Al—O, SiN, and Si—O calculated from the lattice constants and atomic coordinates obtained by conducting Rietveld analysis of the results from the X-ray diffraction or the neutron diffraction in the space group of Cmcm are compared with lengths of chemical bonds calculated from the lattice constants and atomic coordinates of the $Si_xAl_{15-x}O_{3-x}N_{13+x}$ crystal (x=2.3) as shown in Table 5 such that the difference between the lengths is within ±5%, and using the definition it is determined whether the crystal having the crystal structure belongs to the $Si_xAl_{15-x}O_{3-x}N_{13+x}$ system crystal or not. This determination criterion is employed herein since it was once observed that a crystal in the $Si_xAl_{15-x}O_{3-x}N_{13+x}$ system crystal was changed to become another crystal due to breakage of chemical bonds when lengths of the chemical bonds were changed beyond ±5% according to the prior experiments.

Further, in case an amount of solid-solution is small, a simple method for determining whether it belongs to the $Si_xAl_{15-x}O_{3-x}N_{13+x}$ system crystal or not is described as follows. A new substance can be identified to have the same crystal structure if main peaks of the resultant X-ray diffraction pattern measured with the new substance are respectively located at diffraction peak positions, which agree with the peak positions (2θ) of the diffraction pattern calculated using the crystal structure data of Table and the lattice constants calculated from the resultant X-ray diffraction pattern.

Figure 10:
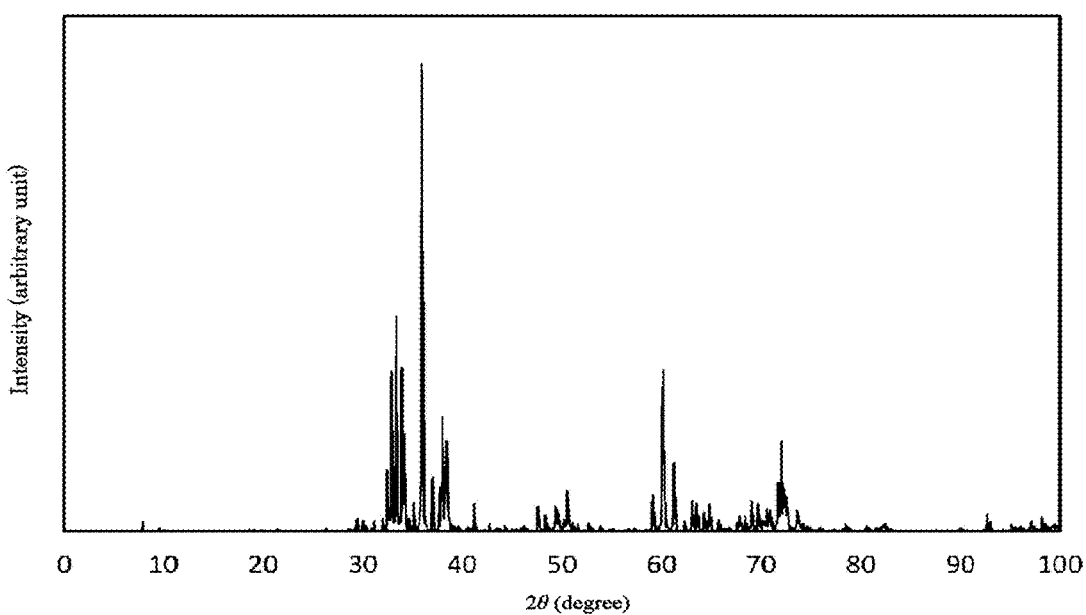
FIG. 10 is a diagram showing a powder X-ray diffraction patter using Cu Kα-line, calculated from a crystal structure of $Si_xAl_{15-x}O_{3-x}N_{13+x}$ (0<x≤3).

FIG. 10 shows a diagram showing a powder X-ray diffraction pattern using Cu Kα-line calculated from the crystal structure of $Si_xAl_{15-x}O_{3-x}N_{13+x}$ crystal.

It is possible to make a simple determination whether a subject substance belongs to the $Si_xAl_{15-x}O_{3-x}N_{13+x}$ system crystal or not by comparing FIG. 10 and that of the subject substance. It may be good to make a judgment using approximately ten (10) peaks of the highest intensity in the diffraction pattern as the main peaks of the $Si_xAl_{15-x}O_{3-x}N_{13+x}$ system crystal. Table 5 is important in this sense since it could be referenced when the identification of the $Si_xAl_{15-x}O_{3-x}N_{13+x}$ system crystal is conducted. Further, it is also possible to define a crystal structure of the $Si_xAl_{15-x}O_{3-x}N_{13+x}$ system crystal as an approximate structure using another crystal system of the orthorhombic crystal system and, in such a case, the crystal structure is expressed using a different space group, different lattice constants, and different plane indices, but the X-ray diffraction results (for example, FIG. 10) and the crystal structure (for example, FIG. 9) remain unchanged such that an identification method and an identification result thereof are the same. Therefore, in the present invention, it is to perform an X-ray diffraction analysis using the orthorhombic crystal system. The method of identifying the substance based on Table 5 will be concretely described in Examples to be described later, and the explanation of the method described herein is just in general.

A phosphor can be obtained if the $Si_xAl_{15-x}O_{3-x}N_{13+x}$ system crystal is activated by, as the A element, one or two or more kinds of elements selected from the group consisting of Mn, Ce, Pr, Nd, Sm, Eu, Tb, Dy, and Yb. Since emission characteristics such as an excitation wavelength, an emission wavelength, and emission intensity may vary depending on the composition of the $Si_xAl_{15-x}O_{3-x}N_{13+x}$ system crystal, and the kind and quantity of the activating element, such conditions may be chosen in accordance with an application thereof.

The inorganic crystal represented by the $Si_xAl_{15-x}O_{3-x}N_{13+x}$, the inorganic crystal having the same crystal structure as the inorganic crystal represented by the $Si_xAl_{15-x}O_{3-x}N_{13+x}$, or the inorganic crystal including a solid solution of these is a crystal in the orthorhombic crystal system and having a symmetry in the space group Cmcm, and lattice constants a1, b1 and c1 have values in the ranges:
a1=0.30810±0.05 nm,
b1=1.87354±0.05 nm, and
c1=4.41775±0.05 nm,
such that the inorganic crystal is a particularly stable crystal and the phosphor comprising such an inorganic crystal as the host crystal renders high emission intensity. If the crystal is prepared out of the above ranges, the crystal may become unstable and the emission intensity may occasionally decrease.

Preferably, in the case of $1.5 \le x \le 3$, the phosphor renders high emission intensity. More preferably, in the case of $1.8 \le x \le 3$, the phosphor renders further high emission intensity and yet preferably, in the case of $2 \le x \le 3$, the phosphor renders particularly high emission intensity. In the case where the impurity oxygen contained in the raw material is considered, a phosphor of high emission intensity can be preferably obtained if the upper limit of x is set not exceeding 2.9.

An activating element A includes at least Eu. Therefore, a phosphor rendering particularly high emission intensity may be obtained.

Preferably, the phosphor represented by the composition formula of $Si_aAl_bO_cN_dA_eQ_f$ (Here, a+b+c+d+e+f=1 in the formula, and A is one or two or more elements selected from the group consisting of Mn, Ce, Pr, Nd, Sm, Eu, Tb, Dy, and Yb, and Q is one or two or more kinds of elements selected from the group consisting of elements other than Al, Si, O, N, and A) and expressed in the composition in the ranges in which parameters a, b, c, d, e, and f satisfy every condition as recited below:
$0.009 \le a \le 0.0965$,
$0.3859 \le b < 0.48$,
$0 \le c < 0.096$,
$0.418 < d < 0.515$,
$0.0001 \le e \le 0.03$, and
$0 \le f \le 0.3$ (Here, if the element Q includes a plurality of elements, f is the sum of respective parameters of the plurality of elements), renders particularly high emission intensity.

The parameter a is a parameter representing the constituent amount of the Si element and if it is less than 0.009 or higher than 0.0965, the crystal structure may become unstable so as to cause the emission intensity to decrease. The parameter b is a parameter representing the constituent amount of the Al element and if it is less than 0.3859 or at least 0.48, the crystal structure may become unstable so as to cause the emission intensity to decrease. The parameter c is a parameter representing the constituent amount of the O element and if it is at least 0.096, the crystal structure may become unstable so as to cause the emission intensity to decrease. And, if impurity oxygen contained in the powder raw material is considered, it could be tolerable to contain oxygen within the range less than 0.096 (For example, c is more than 0 and more preferably at least 0.001.) such that the emission intensity could be improved. The parameter d is a parameter representing the constituent amount of the N element, and if the amount is not exceeding 0.418 or at least 0.515, the crystal structure may become unstable so as to cause the emission intensity to decrease. The parameter e represents an additive amount of the activating element A, and if the amount is less than 0.0001, an amount of light-emitting ions is insufficient so as to cause brightness to decrease. If the amount is more than 0.03, the emission intensity may be decreased due to the concentration quenching by a mutual interaction between light-emitting ions. The parameter f is a parameter representing the constituent amount of the Q element other than Al, Si, O, N, and the A element and if the amount is higher than 0.3, the crystal structure may become unstable so as to cause the emission intensity to decrease. A parameter of each element is determined in order to fix the composition such that the charge neutrality of Al, Si, and the A element as the cation and O, N, and the Q element as the anion may be maintained.

Further, it is preferable that the phosphor having the crystal, in which parameters a, b, c, d, e, and f are values in the ranges that satisfy all conditions recited below:
$0.0161 \le a \le 0.0965$,
$0.3859 \le b \le 0.4662$,
$0 \le c \le 0.0804$,
$0.4341 \le d \le 0.5145$,
$0.0001 \le e \le 0.0196$, and $0 \leq f \leq 0.0233$,
has a stable crystal structure and renders high emission intensity.

Further, it is preferable that the phosphor having the crystal, in which parameters a, b, c, d, e, and f are values in the ranges that satisfy all conditions recited below:
$0.0482 \leq a \leq 0.0965$,
$0.3859 \leq b \leq 0.4341$,
$0 \leq c \leq 0.0482$,
$0.4662 \leq d \leq 0.5145$,
$0.0001 \leq e \leq 0.0196$, and
$0 \leq f \leq 0.0233$,
has a stable crystal structure and renders particularly high emission intensity.

Yet, it is preferable that the phosphor having the crystal, in which parameters a, b, c, d, e, and f are values in the ranges that satisfy all conditions recited below:
$0.0643 \leq a \leq 0.0965$,
$0.3859 \leq b \leq 0.4180$,
$0 \leq c \leq 0.0322$,
$0.4823 \leq d \leq 0.5145$,
$0.0004 \leq e \leq 0.0196$, and
$0 \leq f \leq 0.0233$,
has a stable crystal structure and renders particularly high emission intensity.

Here, the inorganic crystal having the same crystal structure may be supposed to have a homologous structure as the inorganic crystal represented by $(Si,Al)_n(O,N)_n+1$ In other words, the inorganic crystal represented by $Si_xAl_{m+2-x}O_{3-x}N_{m+2+x}$ (Here, m=n−2), the inorganic crystal having the same crystal structure of this, or the inorganic crystal including a solid solution of these may be supposed to have the homologous structure as the crystal of the orthorhombic crystal system (or $\alpha = \beta = \gamma = 90°$)

Figure 21:
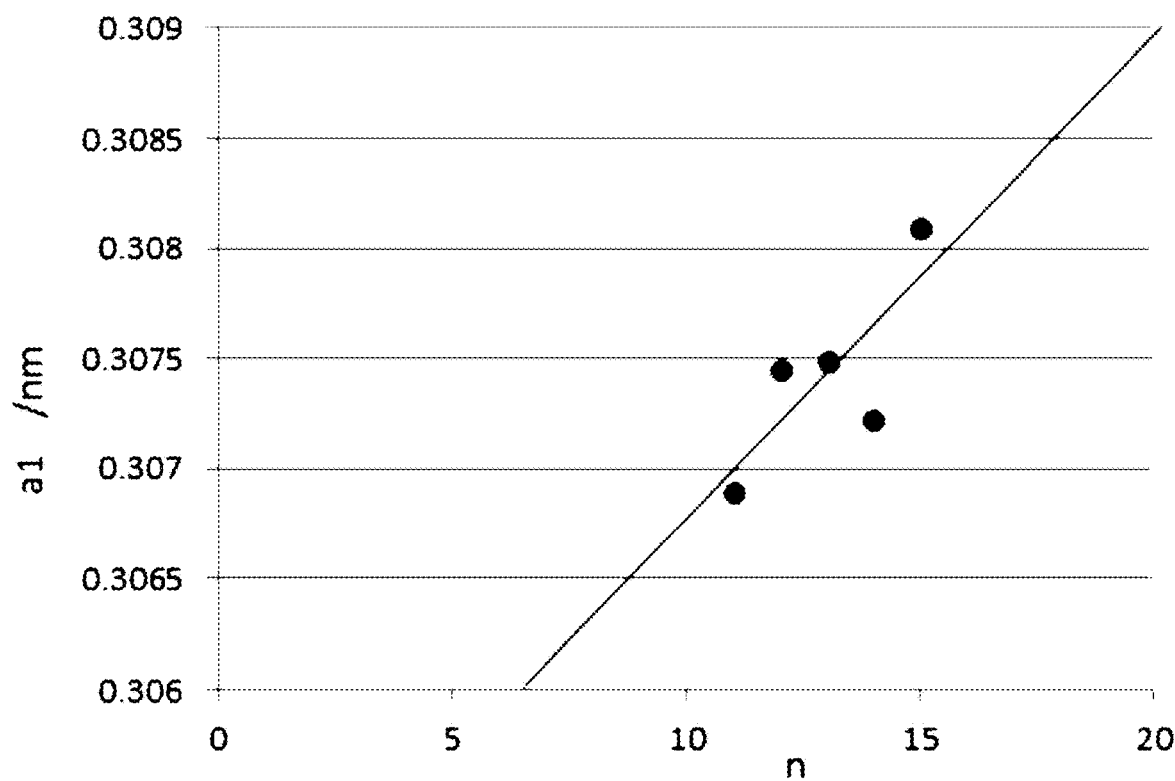
FIG. 21 is a diagram showing a relationship between lattice constant a1 and n.

FIG. 21 is a diagram showing a relationship between lattice constant a1 and n.

Figure 22:
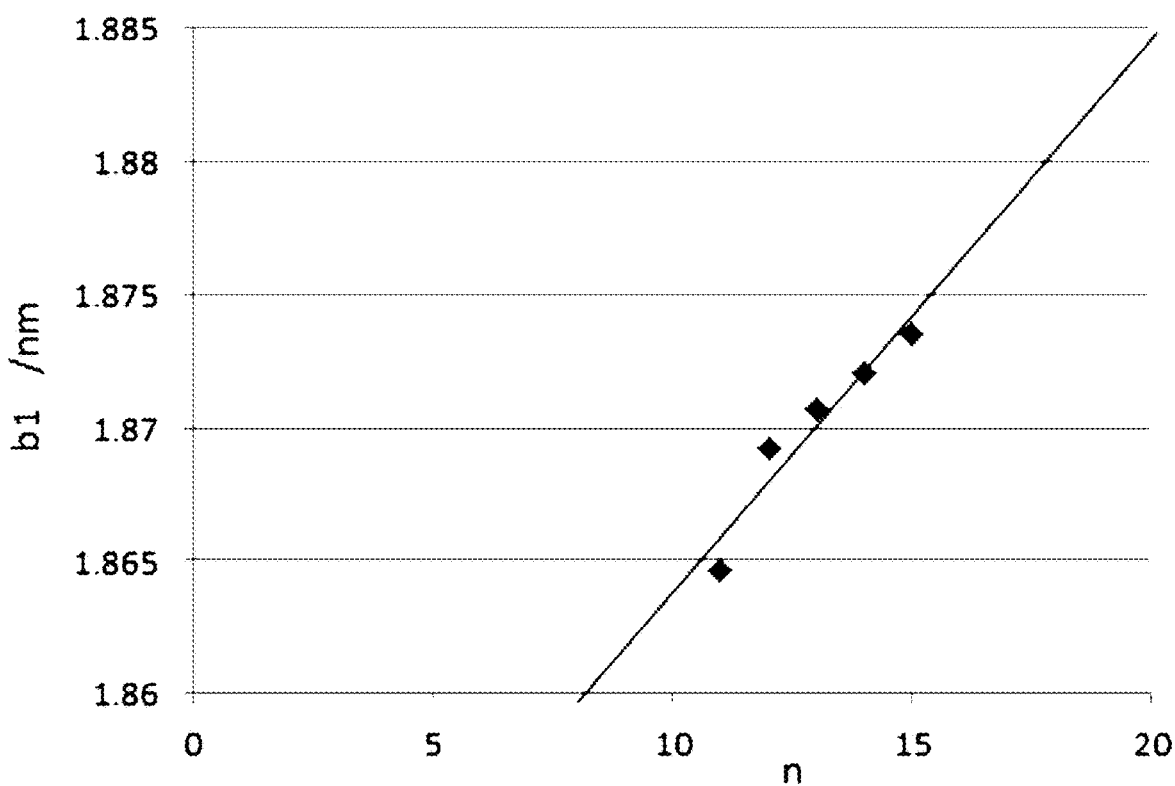
FIG. 22 is a diagram showing a relationship between lattice constant b1 and n.

FIG. 22 is a diagram showing a relationship between lattice constant b1 and n.

Figure 23:
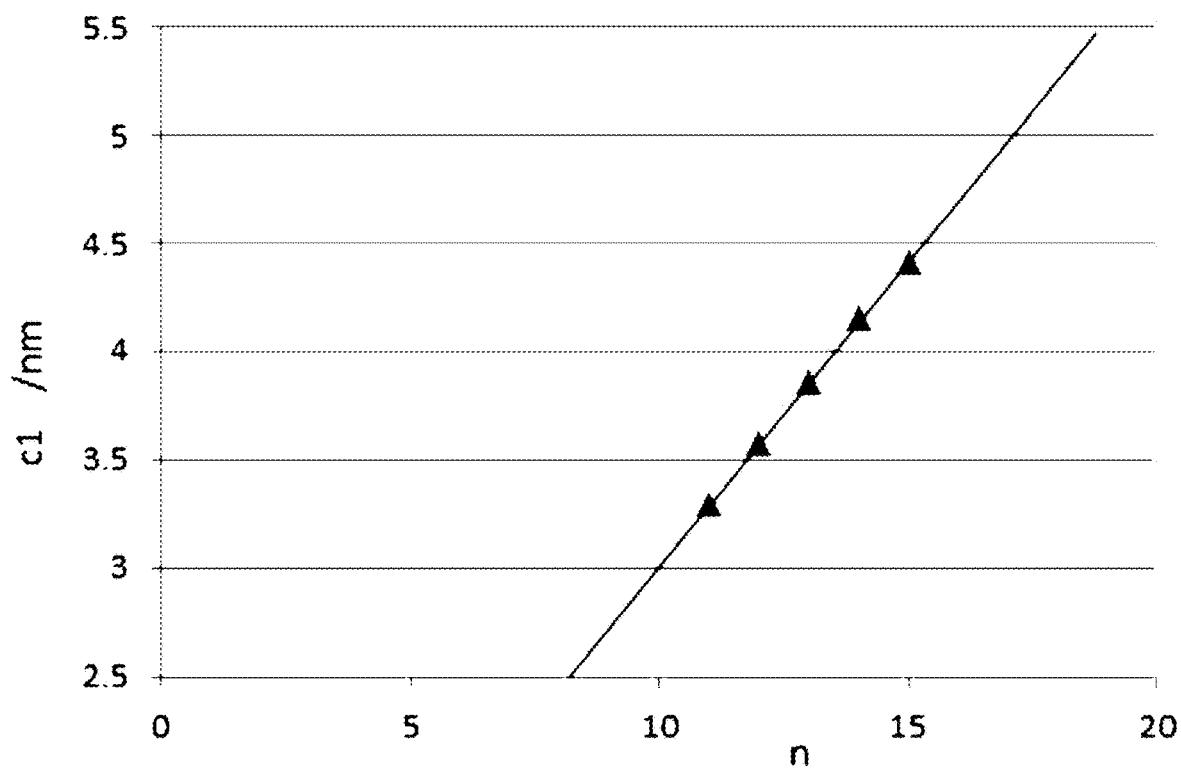
FIG. 23 is a diagram showing a relationship between lattice constant c1 and n.

FIG. 23 is a diagram showing a relationship between lattice constant c1 and n.

FIGS. 21-23 shows graphs in which a1, b1, and c1 recited in Tables 1~5 are plotted against n, respectively. According to FIGS. 21 and 22, even though n varies, a1 and b1 are almost comparably unchanged so that they vary only in the third decimal place as expressed by the nm (nanometer) On the other hand, according to FIG. 23, c1 varied in the order of a few nanometers when n varied such that the longest lattice axis intended with an increase of n, but the rest two axes retained almost the same values as mentioned above. However, with a much closer look, a1, b1, and c1 showed tendency to increase with an increase of n on the whole.

Here, the space group Cmcm described in Tables 1 to is considered. The first symbol is a capital letter and provides the type of Bravais lattice. The symbol 'C' stands for the base-centered lattice and an additional translation: a/2+b/2 (side-centered, additional translation a/2+b/2). The first 'm' stands for the plane of mirror symmetry perpendicular to the a-axis. The symbol "mcm" stands for the plane of mirror symmetry perpendicular to the a-axis and the c-axis and the glide plane perpendicular to the b-axis having the translation of c/2 (Toshio SAKURAI, "X-ray Crystallographic Analysis", Shokabo Co., Ltd.; Physics Selection 2, 1990, 16th edition). As shown in FIGS. 1, 3, 5, 7, and 9, an additional atom to be added to the unit cell with an increase of n is added in the direction of the c-axis. Thus, the c-axis of the crystal lattice intends as n increases. And since the extension component is effective in the directions of the a-axis and the b-axis, the extension is slightly caused in such directions although the amount is quite small if compared to that in the c-axis direction. Here, as mentioned above, the extension amounts in the a-axis and the b-axis are relatively small such that it is possible to consider the extension amounts are negligible.

Here, to perform the linear approximation with the least-square method for values of a1, b1, and c1 of the lattice constants against respective values of n, they may be given as follows:
a1=0.000217×(m+2)+0.304611 nm,
b1=0.002079×(m+2)+1.842989 nm, and
c1=0.28201×(m+2)+0.192324 nm (See FIGS. 21, 22, and 23). The values of squared coefficients of correlation (coefficients of determination) were 0.60535044, 0.916138182, and 0.999854072, respectively. In the case where n=11~15 (or m=9~13), it was confirmed that the symmetry of the spece group Cmcm was retained, and in the case where n is less than 11 or more than 15 (or m is less than 9 or more than 13), likewise, it can be assumed that these homologous structures should retain the symmetry of the space group Cmcm. That is, in the case wherein n=3~52 (or m=1~50), the crystal may have a similar homologous structure; in the case where n=7, 8, 9, 10, 11~15, 16, 17, 18, 19, 20, 21, and 22 (or m=5~20), the crystal may have the similar homologous structure; and in the case wherein n=9, 10, 11~15 (or m=7~13), the crystal may have the similar homologous structure. Then, the respective sets of values of the lattice constants: a1, b1, and c1 may be calculated from the above-mentioned formula such that it also can be said that these crystal structures may be determined unambiguously.

Further, suppose the lattice constants (for example, c1) is predetermined, the composition of the crystal having the above-mentioned structure (homologous structure) with the predetermined lattice constants may be given from the lattice constants by calculating m (or n) from the above-mentioned formula. Since $0 < x \leq 3$ in this case, the composition of such a crystal is supposed to have numerous variations within the range (For example, x may be from the smallest positive value that is technically possible to value of three (3)).

Generally, when the powder X-ray diffraction result is analyzed, the crystal system may be determined, the lattice constants may be obtained, and the number of elements contained in the unit cell may be obtained.

Thus, instead individual lattice constants a1, b1, and c1, a relation between the volume: a1×b1×c1 and n was investigated to obtain the following.
n=11 a1×b1×c1=1.88441,
n=12 a1×b1×c1=2.05639,
n=13 a1×b1×c1=2.21703,
n=14 a1×b1×c1=2.38623, and
n=15 a1×b1×c1=2.55009,
The correlation of these may be given as follows:
a1×b1×c1=0.166121233×n+0.059251458.
The value of squared coefficient of correlation (coefficient of determination) was $R^2$=0.999912615 to show a high correlationship. That is, even in either case where n is smaller than 11 or larger than 15, it can be predicted that a similar homologous structure may be retained. If the molecular weight obtained from the chemical formula such as $Si_xAl_{n-x}O_{3-x}N_{n+x}$ is divided by the a1×b1×c1 corresponding to the volume, the quotient shows almost constant.

A phosphor in which an inorganic compound includes single crystal particles or an aggregate of the single crystals having a mean particle diameter of 0.1 μm or more to 40 μm or less has high emission efficiency and a good handling property when it is applied to an LED such that it is good to control the particle diameter thereof in this range.

Impurity elements of Fe, Co, and Ni included in the inorganic compound may cause the emission intensity to decrease. If the sum of these impurity elements in the phosphor is controlled to be 500 ppm or less, an influence of these elements on the emission intensity is decreased.

As one of the embodiments of the present invention, there is a phosphor containing at least 20 mass % of phosphor content comprising a mixture of a phosphor and another crystal phase or an amorphous phase wherein the phosphor includes an inorganic compound constituted of, as a host crystal, an inorganic crystal including at least a metal element M and a non-metal element X and being represented by $M_nX_{n+1}$ (Here, n is a value in the range of 3≤n≤5), an inorganic crystal having the same crystal structure thereof, or an inorganic crystal including a solid solution of these, in which a light-emitting ion is solid solved. In the case where a phosphor alone cannot fulfill target characteristics wherein the phosphor is constituted of an inorganic compound including, as the host, an inorganic crystal represented by $M_nX_{n+1}$, an inorganic crystal having the same crystal structure of this inorganic crystal, or an inorganic crystal having a solid solution of these and in the case where another feature such as conductivity is added, the present embodiments may be useful. The content amount of phosphor constituted of an inorganic compound including, as the host, an inorganic crystal represented by $M_nX_{n+1}$, an inorganic crystal having the same crystal structure of this, or an inorganic crystal having a solid solution of these may be adjusted according to the target feature, but if it is less than 20 mass %, the emission intensity may be lowered. Therefore, the amount of the main component should be at least 20 mass %.

In the case where the phosphor is supposed to need electrical conductivity in an application in which electron beam excitation or the like is employed, an inorganic substance having electrical conductivity may be added thereto as another crystal phase or an amorphous phase.

As the inorganic substance having the electrical conductivity, oxide; oxynitride; or nitride of one or two or more kinds of elements selected from the group consisting of Zn, Al, Ga, In, and Sn, or a mixture of any of these may be named. For example, zinc oxide, aluminum nitride, indium nitride, tin oxide, and so on may be named.

As one of the embodiments of the present invention, there is a phosphor having a peak at a wavelength in the range of 460 nm to 500 nm upon irradiation by an excitation source. For example, a phosphor including, as the host crystal, an inorganic crystal represented by $M_nX_{n+1}$, an inorganic crystal having the same crystal structure of this inorganic crystal, or an inorganic crystal having a solid solution of these, in which Eu is activated, may have an emission peak in this range by adjusting the composition.

As one of the embodiments of the present invention, there is a phosphor emitting light by the excitation source comprising vacuum ultraviolet light, ultraviolet light, or visible light having a wavelength of 100 nm or more to 420 nm or less, or an electron beam or X-ray. The phosphor can be made to emit light efficiently by using such excitation sources.

Thus, as compared with an ordinary oxide phosphor or an existing sialon phosphor, the phosphor of the present invention is characterized by having a wider excitation range of an electron beam and X-ray and light from ultraviolet light to visible light, emitting light of blue-to-green color, in particular, blue-to-green color of 460~500 nm with a specific composition thereof, and being capable of adjusting an emission wavelength and an emission peak width. Thus, the phosphor of the present invention is suitable for an illuminating device, an image display device, pigment, and an ultraviolet absorber because of such emission characteristics. The phosphor of the present invention has also advantages of excellent heat resistance since it does not degrade even if it is exposed to a high temperature, and has excellent long-term stability under an oxidizing atmosphere and a moisture environment, such that a product having excellent durability can be provided by utilizing the phosphor.

A method of manufacturing such a phosphor of the present invention is not particularly limited, but, for example, a mixture of metal compounds being a raw material mixture that can constitute a phosphor including, as the host, at least an inorganic crystal represented by $M_nX_{n+1}$, an inorganic crystal having the same crystal structure of this inorganic crystal, or an inorganic crystal having a solid solution of these is fired in a nitrogen-containing inert atmosphere in the temperature range from 1,200° C. or higher to 2,200° C. or lower such that the phosphor of the present invention may be obtained. While the main crystal of the present invention belongs to the orthorhombic crystal system and the space group Cmcm, another crystal that belongs to another crystal system and another space group other than the above may be occasionally mixed therein depending on synthesis conditions such as firing temperature. However, even in such a case, a change of the emission characteristics is slight and therefore the thus-obtained product can be used as a phosphor of high brightness.

As a starting material, for example, a mixture of metal compounds, which comprises AlN and/or $Al_2O_3$, $Si_3N_4$, and an oxide or a nitride of A (Here, A is one or two or more kinds of elements selected from the group consisting of Mn, Ce, Pr, Nd, Sm, Eu, Tb, Dy, and Yb), may be utilized. The mixture of these is preferably used since raw materials thereof are easily available and have excellent stability. The mixture is preferable since the reaction tends to easily proceed during the firing. In the case wherein the phosphor of the present invention includes Ca or Y as the L element, or F (fluorine) as the Z element, the mixture of metal compounds may further comprise a fluoride of the L element (for example, calcium fluoride) and an oxide of the L element (for example, calcium oxide and yttrium oxide). Such raw materials may be inorganic compounds that forms a liquid phase at a temperature of a firing temperature or lower to be described later.

Since the firing temperature is high and the firing atmosphere is an inert atmosphere containing nitrogen, an electric furnace of a metal resistance heating type or a graphite resistance heating type, in which a high temperature member of the furnace made of carbon is used, is suitable as a furnace for firing. The nitrogen-containing inert atmosphere in the pressure range of 0.1 MPa or more to 100 MPa or less is preferable because thermal decomposition of nitride or oxynitride of the starting material or the product is suppressed. It is preferable that the oxygen partial pressure is 0.0001% or lower in the firing atmosphere in order to suppress the oxidation reaction of nitride or oxynitride of the starting material or the product.

Here, the firing time is, although it differs depending on the firing temperature, usually 1~10 hours or so.

In order to manufacture the phosphor in the form of powder or aggregate, it would be preferable to utilize a method of firing raw materials after the raw materials are filled in a container with a filling rate kept at the bulk density of 40% or lower. It is possible to prevent particles from adhering with each other by maintaining the bulk density of 40% or lower in the filling rate. Here, the term relative bulk density means the ratio of a value (bulk density) given by dividing the mass of powder material filled in the container by the capacity of the container to the real density of the substance of the powder material.

Various kinds of heat-resistant materials can be used for the container containing the raw material compound in firing the raw material mixture. However, in view of a low adverse effect of material deterioration on the metal nitride used in the present invention, a material suitably includes a boron nitride coated container, which is exemplified by a boron nitride coated graphite crucible used for synthesis of an α-sialon as described in a scientific journal "Journal of the American Ceramic Society" Vol. 85, No. 5, pages 1229 to 1234 in 2002, or boron nitride sintered body. When the firing is performed under such conditions, boron or boron nitride component is mixed into the product from the container, but, if the amount thereof is small, an effect of mixing is slight since the emission characteristics are not deteriorated. Further, durability of the product may be occasionally improved by the addition of a small amount of boron nitride thereto, and such addition may be preferable in some cases.

In order to manufacture the phosphor in the form of powder or aggregate, it is preferable to make the mean particle diameter of powder particles or aggregate of the raw material equal to or less than 500 μm since the raw material has excellent reactivity and handling characteristics.

As a method of adjusting a particle size of the particles or aggregates to be 500 μm or less, it is preferable to employ a spray dryer, sieving, or pneumatic classification since such a method has excellent operating efficiency and handling characteristics.

As a method of firing, not the hot-pressing, but a method of firing, in which no external mechanical pressing is applied, such as pressureless sintering method and gas pressure sintering method is preferable as a method of obtaining a product of powder or aggregate.

A mean particle diameter of phosphor powder is preferably 50 nm or more and 200 μm or less in terms of a volume-based median diameter (d50) because the emission intensity is high. The volume-based mean particle diameter can be measured, for example, by a Microtrac or a laser light scattering method. A mean particle diameter of phosphor powder synthesized by firing may be satisfactorily adjusted to be at least 50 nm and not exceeding 200 μm by applying at least one technique selected from pulverization, classification, and acid treatment.

Defects included in the powder and damages caused by pulverization may be occasionally cured by heat-treating the phosphor powder after firing, the phosphor powder after pulverizing treatment, or the phosphor powder after controlling a particle size at a temperature of 1,000° C. or higher to the firing temperature or lower. The defects and damages may occasionally cause a decrease in the emission intensity, and in such a case, the emission intensity may be recovered by the heat treatment.

During firing for synthesis of the phosphor, a stable crystal may be occasionally obtained by adding an inorganic compound forming a liquid phase at a temperature of a firing temperature or lower and firing a mixture thereof such that the liquid phase acts as a flux to promote the reaction and particle growth, and thus the emission intensity may be occasionally improved.

Specific examples of the inorganic compound forming the liquid phase at the temperature of the firing temperature or lower include a single substance or a mixture of two or more kinds of fluoride, chloride, iodide, bromide, or phosphate of one or two or more kinds of elements selected from the group consisting of Li, Na, K, Mg, Ca, Sr, and Ba. The inorganic compounds have different melting points, respectively, and therefore may be satisfactorily used properly depending on a synthesizing temperature.

Further, the emission intensity of the phosphor may occasionally become high by reducing the content amount of the inorganic compound forming the liquid phase at the temperature of the firing temperature or lower by washing the phosphor with a solvent after the firing.

When the phosphor of the present invention is used in an application of a light-emitting device or the like, it is preferable to use the phosphor dispersed in a liquid medium. And the phosphor can be used as the phosphor mixture including the phosphor of the present invention. A composition prepared by dispersing the phosphor of the present invention in the liquid medium is referred to as a phosphor-containing composition.

As the liquid medium that can be used for the phosphor-containing composition of the present invention, any liquid medium can be selected depending on a purpose or the like, if the liquid medium shows liquid properties under desired use conditions to suitably disperse the phosphor of the present invention, and simultaneously does not cause an undesirable reaction or the like. As examples of the liquid medium, an addition reaction type silicone resin and a condensation reaction type silicone resin before curing, a modified silicone resin, an epoxy resin, a polyvinyl resin, a polyethylene resin, a polypropylene resin, a polyester resin, and so on are named. With respect to the liquid media, a single kind of liquid medium may be used by itself, or any combination of two or more kinds of liquid media with any combination ratio thereof may be used.

An amount of used liquid medium or media may be appropriately adjusted depending on an application or the like. In general, the amount is in the range of generally 3 wt % or more and preferably 5 wt % or more, to generally 30 wt % or less and preferably 15 wt % or less in terms of the weight ratio of the liquid medium to the phosphor of the present invention.

Further, the phosphor-containing composition of the present invention may contain, in addition to the phosphor of the present invention and the liquid medium, any other component depending on an application or the like. As examples of the other component, a dispersing agent, a thickening agent, an extending agent, a buffering agent, and so on are named. Specifically, silica fine powder such as Aerosil, alumina, and so on may be named.

The light-emitting device of the present invention is configured by using at least a light-emitting body or an emission source, and the phosphor of the present invention.

As the light-emitting body or the emission source, there are an LED light-emitting device, a laser diode light-emitting device, an electroluminescence (EL) light-emitting device, a fluorescent lamp, and so on. The LED light-emitting device can be manufactured using the phosphor of the present invention and by a publicly known method which is described in Japanese Patent Application Publication No. H05(1993)-152609, Japanese Patent Application Publication No. H07(1995)-99345, Japanese Patent No. 2927279, or the like. In this case, the light-emitting body or the emission source is preferably what emits light of a wavelength of 330~500 nm. In particular, an LED light-emitting element emitting an ultraviolet (or violet) ray of a wavelength from 330~420 nm, or an LED light-emitting element emitting blue light in a wavelength from 420~500 nm is preferable. Such LED light-emitting elements include a nitride semiconductor such as GaN or InGaN, which can be an emission source of a predetermined wavelength by adjusting the composition.

As a light-emitting unit of the present invention, there are a white light-emitting diode, an illuminating device including a plurality of white light-emitting diodes, a backlight for a liquid crystal panel, and the like, which include the phosphor of the present invention, respectively.

In such light-emitting devices, in addition to the phosphor of the present invention, the device may further include one or two or more kinds of phosphor selected from β-sialon green phosphor activated with Eu, α-sialon yellow phosphor activated with Eu, $Sr_2Si_5N_8$ orange phosphor activated with Eu, (Ca,Sr)AlSiN$_3$ orange phosphor activated with Eu, and CaAlSiN$_3$ red phosphor activated with Eu. As the yellow phosphor other than the above, for example, YAG:Ce, (Ca,Sr,Ba)Si$_2$O$_2$N$_2$:Eu, and the like may be used.

As one aspect of the light-emitting device of the present invention, there is a light-emitting device in which a light-emitting body or an emission source emits ultraviolet light or visible light having a peak wavelength of 300~450 nm such that the phosphor of the present invention emits light of blue-to-green color, which is mixed with light having a wavelength of 450 nm or more emitted by the other phosphor of the present invention such that the light-emitting device emits light of a white color or light of another color other than the white color.

As one aspect of the light-emitting device of the present invention, in addition to the phosphor of the present invention, a blue phosphor emitting light having a peak wavelength of 420 nm~500 nm or less by means of the light-emitting body or the emission source can further be included. As examples of such a blue phosphor, there are AlN:(Eu, Si), BaMgAl$_{10}$O$_{17}$:Eu, SrSi$_9$Al$_{19}$O$_{31}$:Eu, LaSi$_9$Al$_{19}$N$_{32}$:Eu, α-sialon:Ce, JEM:Ce, and so on.

As one aspect of the light-emitting device of the present invention, in addition to the phosphor of the present invention, a green phosphor emitting light having a peak wavelength of at least 500 nm and not exceeding 550 nm by means of the light-emitting body or the emission source can further be included. As examples of such a green phosphor, there are β-sialon:Eu, (Ba,Sr,Ca,Mg)$_2$SiO$_4$:Eu, (Ca,Sr,Ba)Si$_2$O$_2$N$_2$:Eu, and so on.

As one aspect of the light-emitting device of the present invention, in addition to the phosphor of the present invention, a yellow phosphor emitting light having a peak wavelength of at least 550 nm and not exceeding 600 nm by means of the light-emitting body or the emission source can further be included. As examples of such a yellow phosphor, there are YAG:Ce, α-sialon:Eu, CaAlSiN$_3$:Ce, La$_3$Si$_6$N$_{11}$:Ce, and so on.

As one aspect of the light-emitting device of the present invention, in addition to the phosphor of the present invention, a red phosphor emitting light having a peak wavelength of at least 600 nm and not exceeding 700 nm by means of the light-emitting body or the emission source can further be included. As examples of such a red phosphor, there are CaAlSiN$_3$:Eu, (Ca,Sr)AlSiN$_3$:Eu, Ca$_2$Si$_5$N$_8$:Eu, Sr$_2$Si$_5$N$_8$:Eu, and so on.

The image display device of the present invention is constituted of at least an excitation source and the phosphor of the present invention and includes a fluorescent display tube (VFD), a field emission display (FED), a plasma display panel (PDP), a cathode-ray tube (CRT), and the like. It has been confirmed that the phosphor of the present invention emits light by excitation of a vacuum ultraviolet ray of 100~190 nm, an ultraviolet ray of 190~380 nm, an electron beam, or the like, and the above image display devices can be configured by combining these excitation sources and the phosphor of the present invention.

The phosphor comprising an inorganic compound crystal phase having a specific chemical composition according to the present invention has a white color as an object color, and thus can be used as a pigment or fluorescent pigment. That is, the object color of white is observed when the phosphor of the present invention is irradiated with sunlight or light from a fluorescent lamp or the like. In view of a good coloring and no degradation over a long period of time, the phosphor of the present invention is suitable for an inorganic pigment. Therefore, when the phosphor of the present invention is used for a paint, ink, color, glaze, colorant to be added to a plastic product or the like, a favorable coloring can be maintained at a high level for a long period of time.

The nitride phosphor of the present invention absorbs ultraviolet light so as to be also suitable as the ultraviolet absorber. Thus, when it is used as the paint or applied onto a surface of the plastic product or kneaded into an inside thereof, it has a high effect on screening ultraviolet light to effectively allow protection of a product from ultraviolet degradation.

EXAMPLES

The present invention will be described in more detail with reference to the examples to be shown below, but these examples are disclosed only for the purpose of facilitating understanding of the present invention readily such that the present invention is not limited to these examples.
[Raw Materials Used for Synthesis]

The raw material powders used for the synthesis were: silicon nitride powder with a particle size of specific surface area of 11.2 m$^2$/g, oxygen content of 1.29 wt %, and a type content of 95% (SN-E10 grade made by Ube Industries, Ltd); aluminum nitride powder with a particle size of specific surface area of 3.3 m$^2$/g and oxygen content of 0.82 wt % (E-Grade made by Tokuyama Corporation); aluminum oxide powder with a particle size of specific surface area of 13.2 m$^2$/g (TAIMICRON made by Taimei Chemicals Co., Ltd); europium oxide (Eu$_2$O$_3$; with purity of 99.9% made by Shin-Etsu Chemical Co., Ltd); europium nitride (EuN; obtained by nitriding metal through heating metal europium in an ammonia vapor flow at 800° C. for 10 hours); terbium oxide (Tb$_4$O$_7$; with purity of 99.9% made by Shin-Etsu Chemical Co., Ltd); ytterbium oxide (Yb$_2$O$_3$; with purity of 99.9% made by Shin-Etsu Chemical Co., Ltd); manganese carbonate(MnCO$_3$; with purity of 99.9% made by Kojundo Chemical Laboratory Co., Ltd); and calcium fluoride (CaF$_2$; with purity of 99.9% made by Kojundo Chemical Laboratory Co., Ltd).

Phosphor Examples; Examples 1 to 36

According to the design compositions as shown in Tables 6 and 7, raw materials were weighed to be mixture compositions (mass ratios) as shown in Table 8. Design parameters were set in the range of m=2~40 (n=4~42) and x=1~3. Although there may be a case in which a design composition in Tables 6 and 7 and a corresponding mixture composition in Table 8 show difference in the composition depending on the kind of each raw material to be used, the mixture composition was determined such that the amount of each metal ion matches therebetween in such a case. A difference constituent in the composition may be mixed into the product as a secondary phase, but an amount thereof is so slight that the performance of the phosphor may hardly be affected. Weighed raw material powders were mixed for 5 minutes using a pestle and a mortar made of silicon nitride sintered body. Then, the powder mixture was fed into a crucible made of boron nitride sintered body. A bulk density of the powder body was approximately in the range from 20% to 30%.

The crucible containing the powder mixture was set into an electric furnace of a graphite resistance heating type. In the firing operation, first the firing atmosphere was made vacuum of $1 \times 10^{-1}$ Pa or less with a diffusion pump, and heated from the room temperature to 800° C. at a rate of 500° C. per hour. Nitrogen of 99.999 vol % purity was introduced at 800° C. to raise the pressure inside the furnace to 1 MPa, and the temperature was further raised at a rate of 500° C. per hour up to each preset temperature as shown in Table 9, and then the temperature was maintained for two (2) hours.

TABLE 6

Design compositions (atomic proportion) of examples 1-36

| Examples | Design parameters | | | M element | | X element | | A element |
|---|---|---|---|---|---|---|---|---|
| | m (m = n − 2) | n | x | Si | Al | O | N | Eu |
| Example 1 | 4 | 2 | 2.5 | 2.5 | 1.5 | 0.5 | 4.5 | 0.1 |
| Example 2 | 5 | 3 | 2.5 | 2.5 | 2.5 | 0.5 | 5.5 | 0.1 |
| Example 3 | 6 | 4 | 2.5 | 2.5 | 3.5 | 0.5 | 6.5 | 0.1 |
| Example 4 | 7 | 5 | 2.5 | 2.5 | 4.5 | 0.5 | 7.5 | 0.1 |
| Example 5 | 8 | 6 | 2.5 | 2.5 | 5.5 | 0.5 | 8.5 | 0.1 |
| Example 6 | 9 | 7 | 2.5 | 2.5 | 6.5 | 0.5 | 9.5 | 0.1 |
| Example 7 | 10 | 8 | 2.5 | 2.5 | 7.5 | 0.5 | 10.5 | 0.1 |
| Example 8 | 10 | 8 | 2.7 | 2.7 | 7.3 | 0.3 | 10.7 | 0.1 |
| Example 9 | 10 | 8 | 2.8 | 2.8 | 7.2 | 0.2 | 10.8 | 0.1 |
| Example 10 | 10 | 8 | 2.9 | 2.9 | 7.1 | 0.1 | 10.9 | 0.1 |
| Example 11 | 10 | 8 | 3 | 3 | 7 | 0 | 11 | 0.1 |
| Example 12 | 11 | 9 | 1 | 1 | 10 | 2 | 10 | 0.1 |
| Example 13 | 11 | 9 | 2 | 2 | 9 | 1 | 11 | 0.1 |
| Example 14 | 11 | 9 | 2.5 | 2.5 | 8.5 | 0.5 | 11.5 | 0.1 |
| Example 15 | 11 | 9 | 2.5 | 2.5 | 8.5 | 0.5 | 11.5 | 0.1 |
| Example 16 | 12 | 10 | 2 | 2 | 10 | 1 | 12 | 0.1 |
| Example 17 | 12 | 10 | 2.5 | 2.5 | 9.5 | 0.5 | 12.5 | 0.05 |
| Example 18 | 12 | 10 | 2.5 | 2.5 | 9.5 | 0.5 | 12.5 | 0.1 |
| Example 19 | 12 | 10 | 2.5 | 2.5 | 9.5 | 0.5 | 12.5 | 0.1 |
| Example 20 | 12 | 10 | 2.5 | 2.5 | 9.5 | 0.5 | 12.5 | 0.2 |
| Example 21 | 13 | 11 | 2 | 2 | 11 | 1 | 13 | 0.1 |
| Example 22 | 13 | 11 | 2.5 | 2.5 | 10.5 | 0.5 | 13.5 | 0.1 |
| Example 23 | 13 | 11 | 2.5 | 2.5 | 10.5 | 0.5 | 13.5 | 0.1 |
| Example 24 | 14 | 12 | 1.5 | 1.5 | 12.5 | 1.5 | 13.5 | 0.1 |
| Example 25 | 14 | 12 | 2 | 2 | 12 | 1 | 14 | 0.1 |
| Example 26 | 14 | 12 | 2.5 | 2.5 | 11.5 | 0.5 | 14.5 | 0.1 |
| Example 27 | 14 | 12 | 2.5 | 2.5 | 11.5 | 0.5 | 14.5 | 0.1 |
| Example 28 | 15 | 13 | 2.5 | 2.5 | 12.5 | 0.5 | 15.5 | 0.1 |
| Example 29 | 15 | 13 | 2.5 | 2.5 | 12.5 | 0.5 | 15.5 | 0.1 |
| Example 30 | 16 | 14 | 2.5 | 2.5 | 13.5 | 0.5 | 16.5 | 0.1 |
| Example 31 | 17 | 15 | 2.5 | 2.5 | 14.5 | 0.5 | 17.5 | 0.1 |
| Example 32 | 18 | 16 | 2.5 | 2.5 | 15.5 | 0.5 | 18.5 | 0.1 |
| Example 33 | 20 | 18 | 2.5 | 2.5 | 17.5 | 0.5 | 20.5 | 0.1 |
| Example 34 | 22 | 20 | 2.5 | 2.5 | 19.5 | 0.5 | 22.5 | 0.1 |
| Example 35 | 32 | 30 | 2.5 | 2.5 | 29.5 | 0.5 | 32.5 | 0.1 |
| Example 36 | 42 | 40 | 2.5 | 2.5 | 39.5 | 0.5 | 42.5 | 0.1 |

TABLE 7

Design compositions (parameters) of examples 1-36

| Examples | Composition parameters | | | | |
|---|---|---|---|---|---|
| | a Si | b Al | c O | d N | e Eu |
| Example 1 | 0.2747 | 0.1648 | 0.0549 | 0.4945 | 0.0110 |
| Example 2 | 0.2252 | 0.2252 | 0.0450 | 0.4955 | 0.0090 |
| Example 3 | 0.1908 | 0.2672 | 0.0382 | 0.4962 | 0.0076 |
| Example 4 | 0.1656 | 0.2980 | 0.0331 | 0.4967 | 0.0066 |
| Example 5 | 0.1462 | 0.3216 | 0.0292 | 0.4971 | 0.0058 |
| Example 6 | 0.1309 | 0.3403 | 0.0262 | 0.4974 | 0.0052 |
| Example 7 | 0.1185 | 0.3555 | 0.0237 | 0.4976 | 0.0047 |
| Example 8 | 0.1280 | 0.3460 | 0.0142 | 0.5071 | 0.0047 |
| Example 9 | 0.1327 | 0.3412 | 0.0095 | 0.5118 | 0.0047 |
| Example 10 | 0.1374 | 0.3365 | 0.0047 | 0.5166 | 0.0047 |
| Example 11 | 0.1422 | 0.3318 | 0 | 0.5213 | 0.0047 |
| Example 12 | 0.0433 | 0.4329 | 0.0866 | 0.4329 | 0.0043 |
| Example 13 | 0.0866 | 0.3896 | 0.0433 | 0.4762 | 0.0043 |
| Example 14 | 0.1082 | 0.3680 | 0.0216 | 0.4978 | 0.0043 |
| Example 15 | 0.1082 | 0.3680 | 0.0216 | 0.4978 | 0.0043 |
| Example 16 | 0.0797 | 0.3984 | 0.0398 | 0.4781 | 0.0040 |
| Example 17 | 0.0998 | 0.3792 | 0.0200 | 0.4990 | 0.0020 |
| Example 18 | 0.0996 | 0.3785 | 0.0199 | 0.4980 | 0.0040 |
| Example 19 | 0.0996 | 0.3785 | 0.0199 | 0.4980 | 0.0040 |
| Example 20 | 0.0992 | 0.3770 | 0.0198 | 0.4960 | 0.0079 |
| Example 21 | 0.0738 | 0.4059 | 0.0369 | 0.4797 | 0.0037 |
| Example 22 | 0.0923 | 0.3875 | 0.0185 | 0.4982 | 0.0037 |
| Example 23 | 0.0923 | 0.3875 | 0.0185 | 0.4982 | 0.0037 |
| Example 24 | 0.0515 | 0.4296 | 0.0515 | 0.4639 | 0.0034 |
| Example 25 | 0.0687 | 0.4124 | 0.0344 | 0.4811 | 0.0034 |
| Example 26 | 0.0859 | 0.3952 | 0.0172 | 0.4983 | 0.0034 |
| Example 27 | 0.0859 | 0.3952 | 0.0172 | 0.4983 | 0.0034 |
| Example 28 | 0.0804 | 0.4019 | 0.0161 | 0.4984 | 0.0032 |
| Example 29 | 0.0804 | 0.4019 | 0.0161 | 0.4984 | 0.0032 |
| Example 30 | 0.0755 | 0.4079 | 0.0151 | 0.4985 | 0.0030 |
| Example 31 | 0.0712 | 0.4131 | 0.0142 | 0.4986 | 0.0028 |
| Example 32 | 0.0674 | 0.4178 | 0.0135 | 0.4987 | 0.0027 |
| Example 33 | 0.0608 | 0.4258 | 0.0122 | 0.4988 | 0.0024 |
| Example 34 | 0.0554 | 0.4324 | 0.0111 | 0.4989 | 0.0022 |
| Example 35 | 0.0384 | 0.4531 | 0.0077 | 0.4992 | 0.0015 |
| Example 36 | 0.0294 | 0.4642 | 0.0059 | 0.4994 | 0.0012 |

TABLE 8

Raw material mixture compositions (mass ratios) of examples 1-36

| Examples | Raw material mixture compositions (mass ratios) | | | | |
|---|---|---|---|---|---|
| | Si3N4 | AlN | Al2O3 | Eu2O3 | EuN |
| Example 1 | 58.65 | 23.99 | 8.53 | 8.83 | 0 |
| Example 2 | 48.65 | 36.96 | 7.07 | 7.32 | 0 |
| Example 3 | 41.56 | 46.15 | 6.04 | 6.26 | 0 |
| Example 4 | 36.27 | 53.00 | 5.27 | 5.46 | 0 |
| Example 5 | 32.18 | 58.30 | 4.68 | 4.84 | 0 |
| Example 6 | 28.92 | 62.53 | 4.20 | 4.35 | 0 |
| Example 7 | 26.25 | 65.98 | 3.82 | 3.95 | 0 |
| Example 8 | 28.43 | 65.54 | 2.30 | 0 | 3.74 |
| Example 9 | 29.49 | 65.24 | 1.53 | 0 | 3.74 |
| Example 10 | 30.55 | 64.95 | 0.77 | 0 | 3.74 |
| Example 11 | 31.61 | 64.65 | 0 | 0 | 3.74 |
| Example 12 | 9.59 | 72.86 | 13.94 | 3.61 | 0 |
| Example 13 | 19.21 | 70.19 | 6.98 | 3.62 | 0 |
| Example 14 | 24.04 | 68.85 | 3.50 | 3.62 | 0 |
| Example 15 | 24.04 | 68.85 | 3.50 | 3.62 | 0 |
| Example 16 | 17.72 | 72.50 | 6.44 | 3.33 | 0 |
| Example 17 | 22.55 | 72.48 | 3.28 | 1.70 | 0 |
| Example 18 | 22.17 | 71.27 | 3.22 | 3.34 | 0 |
| Example 19 | 22.17 | 71.27 | 3.22 | 3.34 | 0 |
| Example 20 | 21.46 | 68.97 | 3.12 | 6.46 | 0 |
| Example 21 | 16.45 | 74.48 | 5.98 | 3.09 | 0 |
| Example 22 | 20.57 | 73.34 | 2.99 | 3.10 | 0 |
| Example 23 | 20.57 | 73.34 | 2.99 | 3.10 | 0 |
| Example 24 | 11.50 | 77.26 | 8.36 | 2.88 | 0 |
| Example 25 | 15.34 | 76.20 | 5.57 | 2.89 | 0 |

TABLE 8-continued

Raw material mixture compositions (mass ratios) of examples 1-36

| Examples | Si3N4 | AlN | Al2O3 | Eu2O3 | EuN |
|---|---|---|---|---|---|
| Example 26 | 19.19 | 75.13 | 2.79 | 2.89 | 0 |
| Example 27 | 19.19 | 75.13 | 2.79 | 2.89 | 0 |
| Example 28 | 17.98 | 76.70 | 2.61 | 2.71 | 0 |
| Example 29 | 17.98 | 76.70 | 2.61 | 2.71 | 0 |
| Example 30 | 16.91 | 78.08 | 2.46 | 2.55 | 0 |
| Example 31 | 15.97 | 79.31 | 2.32 | 2.40 | 0 |
| Example 32 | 15.12 | 80.41 | 2.20 | 2.28 | 0 |
| Example 33 | 13.67 | 82.29 | 1.99 | 2.06 | 0 |
| Example 34 | 12.47 | 83.84 | 1.81 | 1.88 | 0 |
| Example 35 | 8.68 | 88.75 | 1.26 | 1.31 | 0 |
| Example 36 | 6.65 | 91.38 | 0.97 | 1.00 | 0 |

TABLE 9

Firing conditions of examples 1-36

| Examples | Temperature (° C.) | Ambient pressure (mpa) | Time (hour) |
|---|---|---|---|
| Example 1 | 2000° C. | 1 | 2 |
| Example 2 | 1900° C. | 1 | 2 |
| Example 3 | 1900° C. | 1 | 2 |
| Example 4 | 2000° C. | 1 | 2 |
| Example 5 | 1900° C. | 1 | 2 |
| Example 6 | 1900° C. | 1 | 2 |
| Example 7 | 2000° C. | 1 | 2 |
| Example 8 | 2000° C. | 1 | 2 |
| Example 9 | 2000° C. | 1 | 2 |
| Example 10 | 2000° C. | 1 | 2 |
| Example 11 | 2000° C. | 1 | 2 |
| Example 12 | 2000° C. | 1 | 2 |
| Example 13 | 2000° C. | 1 | 2 |
| Example 14 | 1900° C. | 1 | 2 |
| Example 15 | 2000° C. | 1 | 2 |
| Example 16 | 2000° C. | 1 | 2 |
| Example 17 | 2000° C. | 1 | 2 |
| Example 18 | 1900° C. | 1 | 2 |
| Example 19 | 2000° C. | 1 | 2 |
| Example 20 | 1900° C. | 1 | 2 |
| Example 21 | 2000° C. | 1 | 2 |
| Example 22 | 1900° C. | 1 | 2 |
| Example 23 | 2000° C. | 1 | 2 |
| Example 24 | 1900° C. | 1 | 2 |
| Example 25 | 2000° C. | 1 | 2 |
| Example 26 | 1900° C. | 1 | 2 |
| Example 27 | 2000° C. | 1 | 2 |
| Example 28 | 1900° C. | 1 | 2 |
| Example 29 | 2000° C. | 1 | 2 |
| Example 30 | 2000° C. | 1 | 2 |
| Example 31 | 2000° C. | 1 | 2 |
| Example 32 | 2000° C. | 1 | 2 |
| Example 33 | 2000° C. | 1 | 2 |
| Example 34 | 2000° C. | 1 | 2 |
| Example 35 | 2000° C. | 1 | 2 |
| Example 36 | 2000° C. | 1 | 2 |

Next, each synthesized compound was ground using an agate mortar and the powder X-ray diffraction measurement using Cu Kα-line was carried out. As a result thereof, it was confirmed that an inorganic crystal represented by $M_nX_{n+1}$, that is, the crystal phase represented by the general chemical formula of $Si_xAl_{m+2-x}O_{3-x}N_{m+x}$ (m=n−2, 0<x≤3, m:integer) was the main formation phase. Further, it was confirmed that the synthesized material included Eu, Si, Al, N, and O by the measurement of EDS. That is to say, it was confirmed that the synthesized material was an inorganic compound including the crystal represented by $Si_xAl_{m+2-x}O_{3-x}N_{m+x}$ (0<x≤3, m:integer) in which Eu as the light-emitting ion was solid solved.

After firing, the obtained firing products were crushed coarsely and further ground by hand using a crucible and mortar made of silicon nitride sintered body, and then allowed to pass a 30 μm-mesh sieve. When the particle size distribution was measured, the mean particle diameter was 3~8 μm.

As a result of irradiating light of wavelength of 365 nm emitted by the lamp onto these powder samples, it was confirmed that these powder samples emitted light of blue-to-green color. An emission spectrum and an excitation spectrum of each of the powders were measured using a spectrophotofluorometer. Peak wavelengths of the excitation spectra and peak wavelengths of the emission spectra are shown in Table 10. It was confirmed that the inorganic compounds could be excited by an ultraviolet ray of 300~380 nm and violet or blue light of 380~450 nm and that they were phosphors to emit blue-to-green light.

TABLE 10

Excitation emission characteristics of examples 1-36

| Examples | Excitation peak wavelength (nm) | Emission peak wavelength (nm) | Emission intensity (arbitrary unit) |
|---|---|---|---|
| Example 1 | 342 | 497 | 1.29 |
| Example 2 | 340 | 485 | 1.67 |
| Example 3 | 360 | 478 | 2.05 |
| Example 4 | 366 | 479 | 2.03 |
| Example 5 | 342 | 478 | 1.87 |
| Example 6 | 341 | 478 | 1.81 |
| Example 7 | 363 | 479 | 1.81 |
| Example 8 | 305 | 490 | 0.85 |
| Example 9 | 307 | 490 | 0.81 |
| Example 10 | 309 | 494 | 0.60 |
| Example 11 | 305 | 497 | 0.46 |
| Example 12 | 257 | 487 | 0.04 |
| Example 13 | 361 | 478 | 1.81 |
| Example 14 | 344 | 479 | 1.60 |
| Example 15 | 366 | 483 | 1.64 |
| Example 16 | 360 | 476 | 1.62 |
| Example 17 | 359 | 487 | 1.51 |
| Example 18 | 338 | 478 | 1.67 |
| Example 19 | 357 | 479 | 1.72 |
| Example 20 | 365 | 478 | 1.83 |
| Example 21 | 342 | 478 | 1.48 |
| Example 22 | 346 | 478 | 1.70 |
| Example 23 | 359 | 479 | 1.64 |
| Example 24 | 329 | 472 | 0.92 |
| Example 25 | 366 | 478 | 1.77 |
| Example 26 | 342 | 478 | 1.63 |
| Example 27 | 328 | 479 | 1.61 |
| Example 28 | 354 | 478 | 1.61 |
| Example 29 | 344 | 479 | 1.59 |
| Example 30 | 341 | 478 | 1.64 |
| Example 31 | 339 | 478 | 1.55 |
| Example 32 | 357 | 478 | 1.59 |
| Example 33 | 338 | 477 | 1.55 |
| Example 34 | 336 | 478 | 1.49 |
| Example 35 | 331 | 473 | 1.43 |
| Example 36 | 333 | 475 | 1.22 |

Here, it is considered that, in the case where a raw material mixture composition and a chemical composition of the synthesized compound showed discrepancy, a trace amount of substance was mixed in the synthesized material as an impurity secondary phase.

Phosphor Example; Example 37

According to the design compositions as shown in Tables 11 and 12, raw materials were weighed to be mixture compositions (mass ratios) as shown in Table 13. The design parameters were set to m=10 and x=2.5 and what was different from Examples 1~36 is that calcium fluoride (CaF$_2$) was added as a flux. The flux is an inorganic compound to form a liquid phase at a temperature not exceeding the firing temperature during firing for synthesis of the phosphor, and a stable crystal may be occasionally obtained by adding the inorganic compound to the raw material and firing a mixture thereof so as to promote the reaction and particle growth, thereby causing the phosphor to render improved emission intensity. As the flux, an alkali metal compound (such as LiCl, NaCl, KCl, LiF, NaF, KF, and so on) and an alkaline-earth metal compound (such as CaF$_2$, SrF$_2$, BaF$_2$, CaCl$_2$, SrCl$_2$, BaCl$_2$, and so on) are named and calcium fluoride (CaF$_2$) was used for Example 37.

Weighed raw material powders were mixed for 5 minutes using a pestle and a mortar made of silicon nitride sintered body in the same way as Examples 1~36. Then, the powder mixture was fed into a crucible made of boron nitride sintered body. A bulk density of the powder body was approximately in the range from 20% to 30%.

The crucible containing the powder mixture was set into an electric furnace of a graphite resistance heating type. In the firing operation, first the firing atmosphere was made vacuum of 1×10$^{-1}$ Pa or less with a diffusion pump, and heated from the room temperature to 800° C. at a rate of 500° C. per hour. Nitrogen of 99.999 vol % purity was introduced at 800° C. to raise the pressure inside the furnace to 1 MPa, and the temperature was further raised to the preset temperature of 2000° C. at a rate of 500° C. per hour, and then the temperature was maintained for two (2) hours.

TABLE 11

Design composition (atomic proportion) of example 37

| Example | Design parameters | | | M | | X | | A |
|---|---|---|---|---|---|---|---|---|
| | m (m = n) | n − 2 | x | Si element | Al element | O element | N element | Eu |
| Example 37 | 12 | 10 | 2.5 | 2.5 | 9.5 | 0.5 | 12.5 | 0.1 |

TABLE 12

Design composition (parameters) of example 37

| | Composition parameters | | | | | |
|---|---|---|---|---|---|---|
| Example | a Si | b Al | c O | d N | e Eu | f Ca + F |
| Example 37 | 0.0969 | 0.3682 | 0.0233 | 0.4845 | 0.0039 | 0.0233 |

TABLE 13

Raw material mixture composition (mass ratios) of example 37

| | Raw material mixture composition (mass ratios) | | | | |
|---|---|---|---|---|---|
| Example | Si3N4 | AlN | Al2O3 | Eu2O3 | CaF2 |
| Example 37 | 21.53 | 69.22 | 3.13 | 3.24 | 2.88 |

Next, each synthesized compound was ground using an agate mortar and the powder X-ray diffraction measurement using Cu Kα-line was carried out. As a result thereof, it was confirmed that an inorganic crystal represented by M$_n$X$_{n+1}$ that is, the crystal phase represented by the general chemical formula of Si$_x$Al$_{m+2-x}$O$_{3-x}$N$_{m+x}$ (m=n−2, 0<x≤3, m:integer) was the main formation phase. Further, it was confirmed that the synthesized material included Eu, Si, Al, N, O, Ca, and F by the measurement of EDS. That is to say, it was confirmed that the synthesized material was an inorganic compound including the crystal represented by Si$_x$Al$_{m+2-x}$O$_{3-x}$N$_{m+x}$ (0<x≤3, m:integer) in which Eu as the light-emitting ion and Ca and F were solid solved.

After firing, the obtained firing products were crushed coarsely and further ground by hand using a crucible and mortar made of silicon nitride sintered body, and then allowed to pass a 30 μm-mesh sieve. When the particle size distribution was measured, the mean particle diameter was in the range of 3~8 μm.

As a result of irradiating light of wavelength of 365 nm emitted by the lamp onto the powder sample, it was confirmed that the powder sample emitted light of blue-to-green color. An emission spectrum and an excitation spectrum of the powder were measured using a spectrophotofluorometer. Peak wavelengths of the excitation spectra and peak wavelengths of the emission spectra are shown in Table 14. It was confirmed that the inorganic compounds could be excited by an ultraviolet ray of 300 nm~380 nm and violet or blue light of 380 nm~450 nm and that they were phosphors to emit blue-to-green light.

TABLE 14

Excitation emission characteristics of example 37

| Example | Excitation peak wavelength (nm) | Emission peak wavelength (nm) | Emission intensity (arbitrary unit) |
|---|---|---|---|
| Example 37 | 356 | 471 | 1.62 |

Phosphor Examples; Examples 38 to 43

According to the design compositions as shown in Tables 15 and 16, raw materials were weighed to be mixture compositions (mass ratios) as shown in Table 17. In contract to Examples 1~36, another element other than Eu was employed for the activating element to be the light-emitting ion. Although there may be a case in which a design composition in Tables 15 and 16 and a corresponding mixture composition in Table 17 show difference in the composition depending on the kind of each raw material to be used, the mixture composition was determined such that the amount of each metal ion matches therebetween in such a case. A difference constituent in the composition may be mixed into the product as a secondary phase, but an amount thereof is so slight that the performance of the phosphor may hardly be affected. Weighed raw material powders were mixed for 5 minutes using a pestle and a mortar made of silicon nitride sintered body. Then, the powder mixture was fed into a crucible made of boron nitride sintered body. A bulk density of the powder body was approximately in the range from 20% to 30%.

The crucible containing the powder mixture was set into an electric furnace of a graphite resistance heating type. In the firing operation, first the firing atmosphere was made vacuum of 1×10$^{-1}$ Pa or less with a diffusion pump, and heated from the room temperature to 800° C. at a rate of 500° C. per hour. Nitrogen of 99.999 vol % purity was introduced at 800° C. to raise the pressure inside the furnace to 1 MPa, and the temperature was further raised at a rate of 500° C. per hour up to the preset temperature of 2000° C., and then the temperature was maintained for two (2) hours.

allowed to pass a 30 μm-mesh sieve. When the particle size distribution was measured, the mean particle diameter was in the range of 3~8 μm.

TABLE 15

Design composition (atomic proportion) of examples 38-43

| | Design parameters | | M element | X element | | A element | | | |
|---|---|---|---|---|---|---|---|---|---|
| Examples | n | m (m = n − 2) | x | Si | Al | O | N | Ce | Tb | Yb | Mn |
| Example 38 | 12 | 10 | 2.5 | 2.5 | 9.5 | 0.5 | 12.5 | 0.1 | | | |
| Example 39 | 12 | 10 | 2.5 | 2.5 | 9.5 | 0.5 | 12.5 | | 0.1 | | |
| Example 40 | 12 | 10 | 2.5 | 2.5 | 9.5 | 0.5 | 12.5 | | | 0.1 | |
| Example 41 | 12 | 10 | 2.5 | 2.5 | 9.5 | 0.5 | 12.5 | | | | 0.03 |
| Example 42 | 12 | 10 | 2.5 | 2.5 | 9.5 | 0.5 | 12.5 | | | | 0.1 |
| Example 43 | 12 | 10 | 2.5 | 2.5 | 9.5 | 0.5 | 12.5 | | | | 0.3 |

TABLE 16

Design composition (parameters) of examples 38-43

| | Composition parameters | | | | | | | |
|---|---|---|---|---|---|---|---|---|
| | a | b | c | d | e | | | |
| Examples | Si | Al | O | N | Ce | Tb | Yb | Mn |
| Example 38 | 0.0996 | 0.3785 | 0.0199 | 0.4980 | 0.0040 | | | |
| Example 39 | 0.0996 | 0.3785 | 0.0199 | 0.4980 | | 0.0040 | | |
| Example 40 | 0.0996 | 0.3785 | 0.0199 | 0.4980 | | | 0.0040 | |
| Example 41 | 0.0999 | 0.3795 | 0.0200 | 0.4994 | | | | 0.0012 |
| Example 42 | 0.0996 | 0.3785 | 0.0199 | 0.4980 | | | | 0.0040 |
| Example 43 | 0.0988 | 0.3755 | 0.0198 | 0.4941 | | | | 0.0119 |

TABLE 17

Raw material mixture composition (mass ratios) of examples 38-43

| | Raw material mixture compositions (mass ratios) | | | | | | |
|---|---|---|---|---|---|---|---|
| Examples | Si3N4 | AlN | Al2O3 | CeO2 | Tb4O7 | Yb2O3 | MnCO3 |
| Example 38 | 22.19 | 71.32 | 3.23 | 3.267 | | | |
| Example 39 | 22.13 | 71.12 | 3.22 | | 3.54 | | |
| Example 40 | 22.08 | 70.99 | 3.21 | | | 3.72 | |
| Example 41 | 22.78 | 73.23 | 3.31 | | | | 0.67 |
| Example 42 | 22.43 | 72.10 | 3.26 | | | | 2.21 |
| Example 43 | 21.48 | 69.06 | 3.12 | | | | 6.34 |

Next, each synthesized compound was ground using an agate mortar and the powder X-ray diffraction measurement using Cu Kα-line was carried out. As a result thereof, it was confirmed that an inorganic crystal represented by $M_nX_{n+1}$, that is, the crystal phase represented by the general chemical formula of $Si_xAl_{m+2-x}O_{3-x}N_{m+x}$ (m=n−2, 0<x≤3, m:integer) was the main formation phase. Further, it was confirmed that the synthesized material included Ce, Tb, Yb, or Mn; Si; Al; N; and O by the measurement of EDS. That is to say, it was confirmed that the synthesized material was an inorganic compound including the crystal represented by $Si_xAl_{m+2-x}O_{3-x}N_{m+x}$ (0<x≤3, m:integer) in which the A element as the light-emitting ion was solid solved.

After firing, the obtained firing products were crushed coarsely and further ground by hand using a crucible and mortar made of silicon nitride sintered body, and then As a result of irradiating light of wavelength of 365 nm emitted by the lamp onto these powder samples, it was confirmed that these powder samples emitted light of blue-to-green color. It was confirmed that, even though Ce, Tb, Yb, or Mn is used as an activating element, the inorganic compounds could be excited by an ultraviolet ray of 300 nm~380 nm and violet or blue light of 380 nm~450 nm and that they were phosphors to emit blue-to-green light.

[Synthesis and Structural Analysis of Crystal $Si_xAl_{11-x}O_{3-x}N_{9+x}$ (x=3)]

The present inventors found out that a phosphor comprising, as a host crystal, an inorganic crystal represented by $Si_xAl_{11-x}O_{3-x}N_{9+x}$ (0<x≤3) as the case of m=9 (n=11) rendered especially excellent emission characteristics among the phosphor comprising, as the host crystal, an inorganic crystal represented by the general formula of $Si_xAl_{m+2-x}O_{3-x}N_{m+x}$ (m=n−2 and 0<x≤3), which was an inorganic crystal represented by $M_nX_{n+1}$, according to the results of Examples 1~43. Details will be explained as follows with respect to the synthesis and the structural analysis of $Si_xAl_{11-x}O_{3-x}N_{9+x}$ (0<x≤3) crystal.

A mixture composition was designed so as to set the cation ratio of Si:Al=3:8 when using silicon nitride ($Si_3N_4$) and aluminum nitride (AlN). These raw material powders were weighed to make the above mixture composition and the mixture raw material powders were mixed for 5 minutes using a pestle and a mortar made of silicon nitride sintered body in a nitrogen atmosphere including oxygen content of 1 ppm in a glovebox. Next, the thus-obtained powder mixture was fed into a crucible made of boron nitride sintered body. A bulk density of the powder mixture (powder) was approximately 30%.

The crucible containing the powder mixture was set into an electric furnace of a graphite resistance heating type. In the firing operation, first the firing atmosphere was made vacuum of $1\times10^{-1}$ Pa or less with a diffusion pump, and heated from the room temperature to 800° C. at a rate of 500° C. per hour. Nitrogen of 99.999 vol % purity was introduced at 800° C. to raise the pressure inside the furnace to 1 MPa, and the temperature was further raised to 2000° C. at a rate of 500° C. per hour, and then the temperature was maintained for two (2) hours.

A synthesized material was observed by means of an optical microscope and a crystal particle having a size of 3 μm×12 μm×30 μm was collected out of the synthesized material. The crystal particle was analyzed using a scanning electron microscope (SEM; SUI510 made by Hitachi High-Technologies Corp.) equipped with an energy dispersive elemental analyzer (EDS; QUANTAX made by Bruker AXS Inc.) so as to perform the elemental analysis for the elements included in the crystal particle. As a result, presence of Si, Al, N, and O elements was confirmed, and ratios of the respective numbers of contained atoms of Si and Al were measured to be 3:8.

Next, the crystal was fixed to a tip top of a glass fiber with an organic adhesive. An X-ray diffraction measurement of the crystal was performed under a condition in which an output of an X-ray source was 50 kV and 50 mA using a single crystal X-ray diffractometer with a rotating target of Mo Kα-line (SMART APEX II Ultra made by Bruker AXS Inc). As a result, the crystal particle was confirmed to be a single crystal.

Next, the crystal structure was determined using a single crystal structure analysis software (APEX2 made by Bruker AXS Inc.) from the results of X-ray diffraction measurement. The crystal structure data thus-obtained are shown in Table 1, and a diagram of the crystal structure is shown in FIG. 1. The crystal system, the space group, the lattice constants, and the kinds and positions of atoms are described in Table 1, and the shape and the size of the unit cell and the arrangement of atoms therein can be determined using the data. In addition, Si and Al enter in equivalent atom positions with a certain ratio, and oxygen and nitrogen enter in equivalent atom positions at a certain ratio, and when the ratios are averaged as a whole, the averaged ratio matches the composition fractions of the crystal.

The crystal belonged to the orthorhombic crystal system and the space group Cmcm (space group No. 63 in the International Tables for Crystallography), and had the lattice constants a1, b1, and c1 as described below: a1=0.30697 nm, b1=1.86460 nm, c1=3.29300 nm, Angles: α=90°, β=90°, γ=90°. Further, the atom positions were determined as shown in Table 1. Here, in the table, Si and Al exist in the same atom position at a certain ratio that is determined by the composition. Further, Al has +3 valence and Si has +4 valence, and therefore when the atom positions and ratio of Al and Si are found, the ratio of O and N occupying the positions of (O, N) can be determined from the condition of electrical neutrality of the crystal. The composition of the crystal obtained from Si:Al ratios having been measured by means of EDS and the single crystal X-ray structural analysis was $Si_xAl_{11-x}O_{3-x}N_{9+x}$ (x=3). Here, there may be a case where the starting raw material composition appeared different from the synthesized crystal composition and this is because another composition as a minor second phase other than $Si_xAl_{11-x}O_{3-x}N_{9+x}$ (x=3) was produced. Even in such a case, the analysis result should show a structure of pure $Si_xAl_{11-x}O_{3-x}N_{9+x}$ (x=3) because the single crystal was used in the present measurement.

In consideration of similar compositions, it was confirmed that the $Si_xAl_{11-x}O_{3-x}N_{9+x}$ (x=3) crystal maintained its crystal structure while Al could substitute part of Si, Si could substitute part of Al, N could substitute part or all of O, and O could substitute part of N, such that the crystal having been subject to the above substitutions was one of the compositions of the crystal group having the same crystal structure as the crystal represented by $Si_xAl_{11-x}O_{3-x}N_{9+x}$ (x=3). Further, the crystal can also be described as a composition represented by: $Si_xAl_{11-x}O_{3-x}N_{9+x}$ (0<x≤3), from the condition of electrical neutrality.

Further, $Si_xAl_{11-x}O_{3-x}N_{9+x}$ can also be described as a composition represented by: $Si_xAl_{m+2-x}O_{3-x}N_{m+x}$ (0<x≤3 and m=9) These crystal structures including that of the $Si_xAl_{11-x}O_{3-x}N_{9+x}$ (0<x≤3) crystal as the case of m=9 are those in which the structure of $Al_2O_3(AlN)_m$ has been modified into that of SiAlON; and Si substitution with Al and N substitution with O cause a valence increase (+1) and a valence decrease (−1), respectively, such that the increase and the decrease correspond with each other by one-to-one and the same variable can show the amount of both changes. As the number of m increases, the amount of AlN-like phase increases such that the longest lattice axis (c-axis in a general notation) extends. The rest two axes (a-axis and b-axis) retain about the same or comparable values.

From the crystal structure data, it was confirmed that the present crystal was a new substance having not been reported so far. A powder X-ray diffraction pattern calculated from the crystal structure data is shown in FIG. 2. Hereafter, it is possible to determine the formation of the crystal $Si_xAl_{11-x}O_{3-x}N_{9+x}$ as shown in FIG. 1 has been produced by performing a powder X-ray diffraction measurement of the synthesized compound and comparing the measured powder X-ray diffraction pattern with that of FIG. 2 to conclude that both patterns match. Further, since the powder X-ray pattern can be calculated from values of the lattice constants obtained from the powder X-ray diffraction measurement and the crystal structure data of Table 1 with respect to what retains the same crystal structure as the $Si_xAl_{11-x}O_{3-x}N_{9+x}$ system crystal and has the varied lattice constants, the formation of the $Si_xAl_{11-x}O_{3-x}N_{9+x}$ system crystal can be judged by comparing the measured pattern with the calculated pattern.

[Synthesis and Structural Analysis of Crystal $Si_xAl_{12-x}O_{3-x}N_{10+x}$ (x=2.5)]

The present inventors found out that a phosphor comprising, as a host crystal, an inorganic crystal represented by $Si_xAl_{12-x}O_{3-x}N_{10+x}$ (0<x≤3) as the case of m=10 (n=12) rendered especially excellent emission characteristics among the phosphor comprising, as the host crystal, an inorganic crystal represented by the general formula of $Si_xAl_{m+2-x}O_{3-x}N_{m+x}$ (m=n−2 and 0<x≤3), which was an inorganic crystal represented by $M_nX_{n+1}$, according to the results of Examples 1~43. Details will be explained as follows with respect to the synthesis and the structural analysis of $Si_xAl_{12-x}O_{3-x}N_{10+x}$ (0<x≤3) crystal.

A mixture composition was designed so as to set the cation ratio of Si:Al=2.5:9.5 when using silicon nitride ($Si_3N_4$), aluminum nitride (AlN), and Aluminum oxide ($Al_2O_3$). These raw material powders were weighed to make the above mixture composition and the mixture raw material powders were mixed for 5 minutes using a pestle and a mortar made of silicon nitride sintered body in a nitrogen atmosphere including oxygen content of 1 ppm in a glovebox. Next, the thus-obtained powder mixture was fed into a crucible made of sintered boron nitride body. A bulk density of the powder mixture (powder) was approximately 30%.

The crucible containing the powder mixture was set into an electric furnace of a graphite resistance heating type. In the firing operation, first the firing atmosphere was made vacuum of $1 \times 10^{-1}$ Pa or less with a diffusion pump, and heated from the room temperature to 800° C. at a rate of 500° C. per hour. Nitrogen of 99.999 vol % purity was introduced at 800° C. to raise the pressure inside the furnace to 1 MPa, and the temperature was further raised to 2000° C. at a rate of 500° C. per hour, and then the temperature was maintained for two (2) hours.

A synthesized material was observed by means of an optical microscope and a crystal particle having a size of 23 μm×44 μm×55 μm was collected out of the synthesized material. The crystal particle was analyzed using a scanning electron microscope (SEM; SU1510 made by Hitachi High-Technologies Corp.) equipped with an energy dispersive elemental analyzer (EDS; QUANTAX made by Bruker AXS Inc.) so as to perform the elemental analysis for the elements included in the crystal particle. As a result, presence of Si, Al, O and N elements was confirmed, and ratios of the respective numbers of contained atoms of Si and Al were measured to be 2.5:9.5.

Next, the crystal was fixed to a tip top of a glass fiber with an organic adhesive. An X-ray diffraction measurement of the crystal was performed under a condition in which an output of an X-ray source was 50 kV and 50 mA using a single crystal X-ray diffractometer with a rotating target of Mo Kα-line (SMART APEX II Ultra made by Bruker AXS Inc). As a result, the crystal particle was confirmed to be a single crystal.

Next, the crystal structure was determined using a single crystal structure analysis software (APEX2 made by Bruker AXS Inc.) from the results of X-ray diffraction measurement. The crystal structure data thus-obtained are shown in Table 2, and a diagram of the crystal structure is shown in FIG. 3. The crystal system, the space group, the lattice constants, and the kinds and positions of atoms are described in Table 2 and the shape and the size of the unit cell and the arrangement of atoms therein can be determined using the data. In addition, Si and Al enter in equivalent atom positions with a certain ratio, and oxygen and nitrogen enter in equivalent atom positions at a certain ratio, and when the ratios are averaged as a whole, the averaged ratio matches the composition fractions of the crystal.

The crystal belonged to the orthorhombic crystal system and the space group Cmcm (space group No. 63 in the International Tables for Crystallography), and had the lattice constants a1, b1, and c1 as described below: a1=0.30745 nm, b1=1.86919 nm, c1=3.57830 nm, Angles: α=90°, β=90°, γ=90°. Further, the atom positions were determined as shown in Table 2. Here, in the table, Si and Al exist in the same atom position at a certain ratio that is determined by the composition. Further, Al has +3 valence and Si has +4 valence, and therefore when the atom positions and ratio of Al and Si are found, the ratio of O and N occupying the positions of (O, N) can be determined from the condition of electrical neutrality of the crystal. The composition of the crystal obtained from Si:Al ratios having been measured by means of EDS and the single crystal X-ray structural analysis was $Si_xAl_{12-x}O_{3-x}N_{10+x}$ (x=2.5). Here, there may be a case where the starting raw material composition appeared different from the synthesized crystal composition and this is because another composition as a minor second phase other than $Si_xAl_{12-x}O_{3-x}N_{10+x}$ (x=2.5) was produced. Even in such a case, the analysis result should show a structure of pure $Si_xAl_{12-x}O_{3-x}N_{10+x}$ (x=2.5) because the single crystal was used in the present measurement.

In consideration of similar compositions, it was confirmed that the $Si_xAl_{12-x}O_{3-x}N_{10+x}$ (x=2.5) crystal maintained its crystal structure while Al could substitute part of Si, Si could substitute part of Al, N could substitute part or all of O, and O could substitute part of N, such that the crystal having been subject to the above substitutions was one of the compositions of the crystal group having the same crystal structure as the crystal represented by $Si_xAl_{12-x}O_{3-x}N_{10+x}$ (x=2.5). Further, the crystal can also be described as a composition represented by: $Si_xAl_{12-x}O_{3-x}N_{10+x}$ (0<x≤3), from the condition of electrical neutrality.

Further, $Si_xAl_{12-x}O_{3-x}N_{10+x}$ can also be described as a composition represented by: $Si_xAl_{m+2-x}O_{3-x}N_{m+x}$ (0<x≤3 and m=10). These crystal structures including that of the $Si_xAl_{12-x}O_{3-x}N_{10+x}$ (0<x≤3) crystal as the case of m=10 are those in which the structure of $Al_2O_3(AlN)_m$ has been modified into that of SiAlON; and Si substitution with Al and N substitution with O cause a valence increase (+1) and a valence decrease (−1), respectively, such that the increase and the decrease correspond with each other by one-to-one and the same variable can show the amount of both changes. As the number of m increases, the amount of AlN-like phase increases such that the longest lattice axis (c-axis in a general notation) extends. The rest two axes (a-axis and b-axis) retain about the same or comparable values.

From the crystal structure data, it was confirmed that the present crystal was a new substance having not been reported so far. A powder X-ray diffraction pattern calculated from the crystal structure data is shown in FIG. 4. Hereafter, it is possible to determine the formation of the crystal $Si_xAl_{12-x}O_{3-x}N_{10+x}$ as shown in FIG. 3 has been produced by performing a powder X-ray diffraction measurement of the synthesized compound and comparing the measured powder X-ray diffraction pattern with that of FIG. 4 to conclude that both patterns match. Further, since the powder X-ray pattern can be calculated from values of the lattice constants obtained from the powder X-ray diffraction measurement and the crystal structure data of Table 2 with respect to what retains the same crystal structure as the $Si_xAl_{12-x}O_{3-x}N_{10+x}$ system crystal and has the varied lattice constants, the formation of the $Si_xAl_{12-x}O_{3-x}N_{10+x}$ system crystal can be judged by comparing the measured pattern with the calculated pattern.

[Synthesis and Structural Analysis of Crystal $Si_xAl_{13-x}O_{3-x}N_{11+x}$ (x≈2.2)]

The present inventors found out that a phosphor comprising, as a host crystal, an inorganic crystal represented by $Si_xAl_{13-x}O_{3-x}N_{11+x}$ (0<x≤3) as the case of m=11 (n=13) rendered especially excellent emission characteristics among the phosphor comprising, as the host crystal, an inorganic crystal represented by the general formula of $Si_xAl_{m+2-x}O_{3-x}N_{m+x}$ (m=n−2 and 0<x≤3), which was an inorganic crystal represented by $M_nX_{n+1}$, according to the results of Examples 1~43. Details will be explained as follows with respect to the synthesis and the structural analysis of $Si_xAl_{13-x}O_{3-x}N_{11+x}$ (0<x≤3) crystal.

A mixture composition was designed so as to set the cation ratio of Si:Al=2.2:10.8 when using silicon nitride ($Si_3N_4$), aluminum nitride (AlN), and aluminum oxided ($Al_2O_3$) These raw material powders were weighed to make the above mixture composition and the mixture raw material powders were mixed for 5 minutes using a pestle and a mortar made of silicon nitride sintered body in a nitrogen atmosphere including oxygen content of 1 ppm in a glovebox. Next, the thus-obtained powder mixture was fed into a crucible made of boron nitride sintered body. A bulk density of the powder mixture (powder) was approximately 30%.

The crucible containing the powder mixture was set into an electric furnace of a graphite resistance heating type. In the firing operation, first the firing atmosphere was made vacuum of $1×10^{-1}$ Pa or less with a diffusion pump, and heated from the room temperature to 800° C. at a rate of 500° C. per hour. Nitrogen of 99.999 vol % purity was introduced at 800° C. to raise the pressure inside the furnace to 1 MPa, and the temperature was further raised to 2000° C. at a rate of 500° C. per hour, and then the temperature was maintained for two (2) hours.

A synthesized material was observed by means of an optical microscope and a crystal particle having a size of 7 μm×26 μm×57 μm was collected out of the synthesized material. The crystal particle was analyzed using a scanning electron microscope (SEM; SU1510 made by Hitachi High-Technologies Corp.) equipped with an energy dispersive elemental analyzer (EDS; QUANTAX made by Bruker AXS Inc.) so as to perform the elemental analysis for the elements included in the crystal particle. As a result, presence of Si, Al, O, and N elements was confirmed, and ratios of the respective numbers of contained atoms of Si and Al were measured to be 2.2:10.8.

Next, the crystal was fixed to a tip top of a glass fiber with an organic adhesive. An X-ray diffraction measurement of the crystal was performed under a condition in which an output of an X-ray source was 50 kV and 50 mA using a single crystal X-ray diffractometer with a rotating target of Mo Kα-line (SMART APEX II Ultra made by Bruker AXS Inc). As a result, the crystal particle was confirmed to be a single crystal.

Next, the crystal structure was determined using a single crystal structure analysis software (APEX2 made by Bruker AXS Inc.) from the results of X-ray diffraction measurement. The crystal structure data thus-obtained are shown in Table 3, and a diagram of the crystal structure is shown in FIG. 5. The crystal system, the space group, the lattice constants, and the kinds and positions of atoms are described in Table 3 and the shape and the size of the unit cell and the arrangement of atoms therein can be determined using the data. In addition, Si and Al enter in equivalent atom positions with a certain ratio, and oxygen and nitrogen enter in equivalent atom positions at a certain ratio, and when the ratios are averaged as a whole, the averaged ratio matches the composition fractions of the crystal.

The crystal belonged to the orthorhombic crystal system and the space group Cmcm (space group No. 63 in the International Tables for Crystallography), and had the lattice constants a1, b1, and c1 as described below: a1=0.30749 nm, b1=1.87065 nm, c1=3.85432 nm, Angles: α=90°, β=90°, γ=90°. Further, the atom positions were determined as shown in Table 3. Here, in the table, Si and Al exist in the same atom position at a certain ratio that is determined by the composition. Further, Al has +3 valence and Si has +4 valence, and therefore when the atom positions and ratio of Al and Si are found, the ratio of O and N occupying the positions of (O, N) can be determined from the condition of electrical neutrality of the crystal. The composition of the crystal obtained from Si:Al ratios having been measured by means of EDS and the single crystal X-ray structural analysis was $Si_xAl_{13-x}O_{3-x}N_{11+x}$ (x≈2.2). Here, there may be a case where the starting raw material composition appeared different from the synthesized crystal composition and this is because another composition as a minor second phase other than $Si_xAl_{13-x}O_{3-x}N_{11+x}$ (x≈2.2) was produced. Even in such a case, the analysis result should show a structure of pure $Si_xAl_{13-x}O_{3-x}N_{11+x}$ (x≈2.2) because the single crystal was used in the present measurement.

In consideration of similar compositions, it was confirmed that the $Si_xAl_{13-x}O_{3-x}N_{11+x}$ (x≈2.2) crystal maintained its crystal structure while Al could substitute part of Si, Si could substitute part of Al, N could substitute part or all of O, and O could substitute part of N, such that the crystal having been subject to the above substitutions was one of the compositions of the crystal group having the same crystal structure as the crystal represented by $Si_xAl_{13-x}O_{3-x}N_{11+x}$ (x≈2.2). Further, the crystal can also be described as a composition represented by: $Si_xAl_{13-x}O_{3-x}N_{11+x}$ (0<x≤3), from the condition of electrical neutrality.

Further, $Si_xAl_{13-x}O_{3-x}N_{11+x}$ can also be described as a composition represented by: $Si_xAl_{m+2-x}O_{3-x}N_{m+x}$ (0<x≤3 and m=11). These crystal structures including that of the $Si_xAl_{13-x}O_{3-x}N_{11+x}$ (0<x≤3) crystal as the case of m=11 are those in which the structure of $Al_2O_3(AlN)_m$ has been modified into that of SiAlON; and Si substitution with Al and N substitution with O cause a valence increase (+1) and a valence decrease (−1), respectively, such that the increase and the decrease correspond with each other by one-to-one and the same variable can show the amount of both changes. As the number of m increases, the amount of AlN-like phase increases such that the longest lattice axis (c-axis in a general notation) extends. The rest two axes (a-axis and b-axis) retain about the same or comparable values.

From the crystal structure data, it was confirmed that the present crystal was a new substance having not been reported so far. A powder X-ray diffraction pattern calculated from the crystal structure data is shown in FIG. 6. Hereafter, it is possible to determine the formation of the crystal $Si_xAl_{13-x}O_{3-x}N_{11+x}$ as shown in FIG. 5 has been produced by performing a powder X-ray diffraction measurement of the synthesized compound and comparing the measured powder X-ray diffraction pattern with that of FIG. 6 to conclude that both patterns match. Further, since the powder X-ray pattern can be calculated from values of the lattice constants obtained from the powder X-ray diffraction measurement and the crystal structure data of Table 3 with respect to what retains the same crystal structure as the $Si_xAl_{13-x}O_{3-x}N_{11}$ system crystal and has the varied lattice constants, the formation of the $Si_xAl_{13-x}O_{3-x}N_{11+x}$ system crystal can be judged by comparing the measured pattern with the calculated pattern.

[Synthesis and Structural Analysis of Crystal $Si_xAl_{14-x}O_{3-x}N_{12+x}$ (x=3)]

The present inventors found out that a phosphor comprising, as a host crystal, an inorganic crystal represented by $Si_xAl_{14-x}O_{3-x}N_{12+x}$ (0<x≤3) as the case of m=12 (n=14) rendered especially excellent emission characteristics among the phosphor comprising, as the host crystal, an inorganic crystal represented by the general formula of $Si_xAl_{m+2-x}O_{3-x}N_{m+x}$ (m=n−2 and 0<x≤3), which was an inorganic crystal represented by $M_nX_{n+1}$, according to the results of Examples 1~43. Details will be explained as follows with respect to the synthesis and the structural analysis of $Si_xAl_{14-x}O_{3-x}N_{12+x}$ (0<x≤3) crystal.

A mixture composition was designed so as to set the cation ratio of Si:Al=3:11 when using silicon nitride ($Si_3N_4$) and aluminum nitride (AlN). These raw material powders were weighed to make the above mixture composition and the mixture raw material powders were mixed for 5 minutes using a pestle and a mortar made of silicon nitride sintered body in a nitrogen atmosphere including oxygen content of 1 ppm in a glovebox. Next, the thus-obtained powder mixture was fed into a crucible made of boron nitride sintered body. A bulk density of the powder mixture (powder) was approximately 30%.

The crucible containing the powder mixture was set into an electric furnace of a graphite resistance heating type. In the firing operation, first the firing atmosphere was made vacuum of $1 \times 10^{-1}$ Pa or less with a diffusion pump, and heated from the room temperature to 800° C. at a rate of 500° C. per hour. Nitrogen of 99.999 vol % purity was introduced at 800° C. to raise the pressure inside the furnace to 1 MPa, and the temperature was further raised to 2000° C. at a rate of 500° C. per hour, and then the temperature was maintained for two (2) hours.

A synthesized material was observed by means of an optical microscope and a crystal particle having a size of 4 μm×8 μm×34 μm was collected out of the synthesized material. The crystal particle was analyzed using a scanning electron microscope (SEM; SU1510 made by Hitachi High-Technologies Corp.) equipped with an energy dispersive elemental analyzer (EDS; QUANTAX made by Bruker AXS Inc.) so as to perform the elemental analysis for the elements included in the crystal particle. As a result, presence of Si, Al, and N elements was confirmed, and ratios of the respective numbers of contained atoms of Si and Al were measured to be 3:11.

Next, the crystal was fixed to a tip top of a glass fiber with an organic adhesive. An X-ray diffraction measurement of the crystal was performed under a condition in which an output of an X-ray source was 50 kV and 50 mA using a single crystal X-ray diffractometer with a rotating target of Mo Kα-line (SMART APEX II Ultra made by Bruker AXS Inc). As a result, the crystal particle was confirmed to be a single crystal.

Next, the crystal structure was determined using a single crystal structure analysis software (APEX2 made by Bruker AXS Inc.) from the results of X-ray diffraction measurement. The crystal structure data thus-obtained are shown in Table 4, and a diagram of the crystal structure is shown in FIG. 7. The crystal system, the space group, the lattice constants, and the kinds and positions of atoms are described in Table 4 and the shape and the size of the unit cell and the arrangement of atoms therein can be determined using the data. In addition, Si and Al enter in equivalent atom positions with a certain ratio, and oxygen and nitrogen enter in equivalent atom positions at a certain ratio, and when the ratios are averaged as a whole, the averaged ratio matches the composition fractions of the crystal.

The crystal belonged to the orthorhombic crystal system and the space group Cmcm (space group No. 63 in the International Tables for Crystallography), and had the lattice constants a1, b1, and c1 as described below: a1=0.30722 nm, b1=1.87210 nm, c1=4.14890 nm, Angles: α=90°, β=90°, γ=90°. Further, the atom positions were determined as shown in Table 4. Here, in the table, Si and Al exist in the same atom position at a certain ratio that is determined by the composition. Further, Al has +3 valence and Si has +4 valence, and therefore when the atom positions and ratio of Al and Si are found, the ratio of O and N occupying the positions of (O, N) can be determined from the condition of electrical neutrality of the crystal. The composition of the crystal obtained from Si:Al ratios having been measured by means of EDS and the single crystal X-ray structural analysis was $Si_xAl_{14-x}O_{3-x}N_{12+x}$ (x=3). Here, there may be a case where the starting raw material composition appeared different from the synthesized crystal composition and this is because another composition as a minor second phase other than $Si_xAl_{14-x}O_{3-x}N_{12+x}$ (x=3) was produced. Even in such a case, the analysis result should show a structure of pure $Si_xAl_{14-x}O_{3-x}N_{12+x}$ (x=3) because the single crystal was used in the present measurement.

In consideration of similar compositions, it was confirmed that the $Si_xAl_{14-x}O_{3-x}N_{12+x}$ (x=3) crystal maintained its crystal structure while Al could substitute part of Si, Si could substitute part of Al, N could substitute part or all of O, and O could substitute part of N, such that the crystal having been subject to the above substitutions was one of the compositions of the crystal group having the same crystal structure as the crystal represented by $Si_xAl_{14-x}O_{3-x}N_{12+x}$ (x=3). Further, the crystal can also be described as a composition represented by: $Si_xAl_{14-x}O_{3-x}N_{12+x}$ (0<x≤3), from the condition of electrical neutrality.

Further, $Si_xAl_{14-x}O_{3-x}N_{12+x}$ can also be described as a composition represented by: $Si_xAl_{m+2-x}O_{3-x}N_{m+x}$ (0<x≤3 and m=12). These crystal structures including that of the $Si_xAl_{14-x}O_{3-x}N_{12+x}$ (0<x≤3) crystal as the case of m=12 are those in which the structure of $Al_2O_3(AlN)_m$ has been modified into that of SiAlON; and Si substitution with Al and N substitution with O cause a valence increase (+1) and a valence decrease (−1), respectively, such that the increase and the decrease correspond with each other by one-to-one and the same variable can show the amount of both changes. As the number of m increases, the amount of AlN-like phase increases such that the longest lattice axis (c-axis in a general notation) extends. The rest two axes (a-axis and b-axis) retain about the same or comparable values.

From the crystal structure data, it was confirmed that the present crystal was a new substance having not been reported so far. A powder X-ray diffraction pattern calculated from the crystal structure data is shown in FIG. 8. Hereafter, it is possible to determine the formation of the crystal $Si_xAl_{14-x}O_{3-x}N_{12+x}$ as shown in FIG. 7 has been produced by performing a powder X-ray diffraction measurement of the synthesized compound and comparing the measured powder X-ray diffraction pattern with that of FIG. 8 to conclude that both patterns match. Further, since the powder X-ray pattern can be calculated from values of the lattice constants obtained from the powder X-ray diffraction measurement and the crystal structure data of Table 4 with respect to what retains the same crystal structure as the $Si_xAl_{14-x}O_{3-x}N_{12+x}$ system crystal and has the varied lattice constants, the formation of the $Si_xAl_{14-x}O_{3-x}N_{12+x}$ system crystal can be judged by comparing the measured pattern with the calculated pattern.

[Synthesis and Structural Analysis of Crystal $Si_xAl_{15-x}O_{3-x}N_{13+x}$ (x=2.3)]

The present inventors found out that a phosphor comprising, as a host crystal, an inorganic crystal represented $Si_xAl_{15-x}O_{3-x}N_{13+x}$ (0<x≤3) as the case of m=13 (n=15) rendered especially excellent emission characteristics among the phosphor comprising, as the host crystal, an inorganic crystal represented by the general formula of $Si_xAl_{m+2-x}O_{3-x}N_{m+x}$ (m=n−2 and 0<x≤3), which was an inorganic crystal represented by $M_nX_{n+1}$, according to the results of Examples 1~43. Details will be explained as follows with respect to the synthesis and the structural analysis of $Si_xAl_{15-x}O_{3-x}N_{13+x}$ (0<x≤3) crystal.

A mixture composition was designed so as to set the cation ratio of Si:Al=2:11 when using silicon nitride ($Si_3N_4$) and aluminum nitride (AlN). These raw material powders were weighed to make the above mixture composition and the mixture raw material powders were mixed for 5 minutes using a pestle and a mortar made of silicon nitride sintered body in a nitrogen atmosphere including oxygen content of 1 ppm in a glovebox. Next, the thus-obtained powder mixture was fed into a crucible made of boron nitride sintered body. A bulk density of the powder mixture (powder) was approximately 30%.

The crucible containing the powder mixture was set into an electric furnace of a graphite resistance heating type. In the firing operation, first the firing atmosphere was made vacuum of $1\times10^{-1}$ Pa or less with a diffusion pump, and heated from the room temperature to 800° C. at a rate of 500° C. per hour. Nitrogen of 99.999 vol % purity was introduced at 800° C. to raise the pressure inside the furnace to 1 MPa, and the temperature was further raised to 2000° C. at a rate of 500° C. per hour, and then the temperature was maintained for two (2) hours.

A synthesized material was observed by means of an optical microscope and a crystal particle having a size of 3 μm×11 μm×19 μm was collected out of the synthesized material. The crystal particle was analyzed using a scanning electron microscope (SEM; SUI510 made by Hitachi High-Technologies Corp.) equipped with an energy dispersive elemental analyzer (EDS; QUANTAX made by Bruker AXS Inc.) so as to perform the elemental analysis for the elements included in the crystal particle. As a result, presence of Si, Al, N, and O elements was confirmed, and ratios of the respective numbers of contained atoms of Si and Al were measured to be 2:11 (2.3:12.7).

Next, the crystal was fixed to a tip top of a glass fiber with an organic adhesive. An X-ray diffraction measurement of the crystal was performed under a condition in which an output of an X-ray source was 50 kV and 50 mA using a single crystal X-ray diffractometer with a rotating target of Mo Kα-line (SMART APEX II Ultra made by Bruker AXS Inc). As a result, the crystal particle was confirmed to be a single crystal.

Next, the crystal structure was determined using a single crystal structure analysis software (APEX2 made by Bruker AXS Inc.) from the results of X-ray diffraction measurement. The crystal structure data thus-obtained are shown in Table 5, and a diagram of the crystal structure is shown in FIG. 9. The crystal system, the space group, the lattice constants, and the kinds and positions of atoms are described in Table 5 and the shape and the size of the unit cell and the arrangement of atoms therein can be determined using the data. In addition, Si and Al enter in equivalent atom positions with a certain ratio, and oxygen and nitrogen enter in equivalent atom positions at a certain ratio, and when the ratios are averaged as a whole, the averaged ratio matches the composition fractions of the crystal.

The crystal belonged to the orthorhombic crystal system and the space group Cmcm (space group No. 63 in the International Tables for Crystallography), and had the lattice constants a1, b1, and c1 as described below: a1=0.30810 nm, b1=1.87354 nm, c1=4.41775 nm, Angles: α=90°, β=90°, γ=90°. Further, the atom positions were determined as shown in Table 5. Here, in the table, Si and Al exist in the same atom position at a certain ratio that is determined by the composition. Further, Al has +3 valence and Si has +4 valence, and therefore when the atom positions and ratio of Al and Si are found, the ratio of O and N occupying the positions of (O, N) can be determined from the condition of electrical neutrality of the crystal. The composition of the crystal obtained from Si:Al ratios having been measured by means of EDS and the single crystal X-ray structural analysis was $Si_xAl_{15-x}O_{3-x}N_{13+x}$ (x=2.3). Here, there may be a case where the starting raw material composition appeared different from the synthesized crystal composition and this is because another composition as a minor second phase other than $Si_xAl_{15-x}O_{3-x}N_{13+x}$ (x=2.3) was produced. Even in such a case, the analysis result should show a structure of pure $Si_xAl_{15-x}O_{3-x}N_{13+x}$ (x=2.3) because the single crystal was used in the present measurement.

In consideration of similar compositions, it was confirmed that the $Si_xAl_{15-x}O_{3-x}N_{13+x}$ (x=2.3) crystal maintained its crystal structure while Al could substitute part of Si, Si could substitute part of Al, N could substitute part or all of O, and O could substitute part of N, such that the crystal having been subject to the above substitutions was one of the compositions of the crystal group having the same crystal structure as the crystal represented by $Si_xAl_{15-x}O_{3-x}N_{13+x}$ (x=2.3). Further, the crystal can also be described as a composition represented by: $Si_xAl_{15-x}O_{3-x}N_{13+x}$ (0<x≤3), from the condition of electrical neutrality.

Further, $Si_xAl_{15-x}O_{3-x}N_{13+x}$ can also be described as a composition represented by: $Si_xAl_{m+2-x}O_{3-x}N_{m+x}$ (0<x≤3 and m=13). These crystal structures including that of the $Si_xAl_{15-x}O_{3-x}N_{13+x}$ (0<x≤3) crystal as the case of m=13 are those in which the structure of $Al_2O_3$ $(AlN)_m$ has been modified into that of SiAlON; and Si substitution with Al and N substitution with O cause a valence increase (+1) and a valence decrease (−1), respectively, such that the increase and the decrease correspond with each other by one-to-one and the same variable can show the amount of both changes. As the number of m increases, the amount of AlN-like phase increases such that the longest lattice axis (c-axis in a general notation) extends. The rest two axes (a-axis and b-axis) retain about the same or comparable values.

From the crystal structure data, it was confirmed that the present crystal was a new substance having not been reported so far. A powder X-ray diffraction pattern calculated from the crystal structure data is shown in FIG. 10. Hereafter, it is possible to determine the formation of the crystal $Si_xAl_{15-x}O_{3-x}N_{13+x}$ as shown in FIG. 9 has been produced by performing a powder X-ray diffraction measurement of the synthesized compound and comparing the measured powder X-ray diffraction pattern with that of FIG. 10 to conclude that both patterns match. Further, since the powder X-ray pattern can be calculated from values of the lattice constants obtained from the powder X-ray diffraction measurement and the crystal structure data of Table 5 with respect to what retains the same crystal structure as the $Si_xAl_{15-x}O_{3-x}N_{13+x}$ system crystal and has the varied lattice constants, the formation of the $Si_xAl_{15-x}O_{3-x}N_{13+x}$ system crystal can be judged by comparing the measured pattern with the calculated pattern.

Phosphor Examples; Examples A44 to A53

According to the design compositions as shown in Tables 18 and 19, raw materials were weighed to be mixture compositions (mass ratios) as shown in Table 20. Design parameters were set to m=9 (n=11) and x was set in the range of x=0.5~3. Although there may be a case in which a design composition in Tables 18 and 19 and a corresponding mixture composition in Table 20 show difference in the composition depending on the kind of each raw material to be used, the mixture composition was determined such that the amount of each metal ion matches therebetween in such a case. A difference constituent in the composition may be mixed into the product as a secondary phase, but an amount thereof is so slight that the performance of the phosphor may hardly be affected. In the following examples, it is considered the same should apply such that the above recitation will be omitted. Weighed raw material powders were mixed for 5 minutes using a pestle and a mortar made of silicon nitride sintered body. Then, the powder mixture was fed into a crucible made of boron nitride sintered body. A bulk density of the powder body was approximately in the range from 20% to 30%.

Each crucible containing each powder mixture as mentioned above was set into an electric furnace of a graphite resistance heating type. In the firing operation, first the firing atmosphere was made vacuum of $1\times10^{-1}$ Pa or less with a diffusion pump, and heated from the room temperature to 800° C. at a rate of 500° C. per hour. Nitrogen of 99.999 vol % purity was introduced at 800° C. to raise the pressure inside the furnace to 1 MPa, and the temperature was further raised at a rate of 500° C. per hour up to each preset temperature as shown in Table 21, and then the temperature was maintained for two (2) hours.

TABLE 18

Design compositions (atomic proportion) of examples A44-A53

| | Design parameters | | | M element | | X element | | A element |
|---|---|---|---|---|---|---|---|---|
| Examples | | m (m = n − 2) | x | Si | Al | O | N | Eu |
| | | n | | | | | | |
| Example | A44 | 11 | 9 | 0.5 | 0.5 | 10.5 | 2.5 | 9.5 | 0.1 |
| Example | A45 | 11 | 9 | 1 | 1 | 10 | 2 | 10 | 0.1 |
| Example | A46 | 11 | 9 | 1.5 | 1.5 | 9.5 | 1.5 | 10.5 | 0.2 |
| Example | A47 | 11 | 9 | 1.8 | 1.8 | 9.2 | 1.2 | 10.8 | 0.2 |
| Example | A48 | 11 | 9 | 2 | 2 | 9 | 1 | 11 | 0.1 |
| Example | A49 | 11 | 9 | 2 | 2 | 9 | 1 | 11 | 0.1 |
| Example | A50 | 11 | 9 | 2.5 | 2.5 | 8.5 | 0.5 | 11.5 | 0.1 |
| Example | A51 | 11 | 9 | 2.5 | 2.5 | 8.5 | 0.5 | 11.5 | 0.1 |
| Example | A52 | 11 | 9 | 3 | 3 | 8 | 0 | 12 | 0.1 |
| Example | A53 | 11 | 9 | 3 | 3 | 8 | 0 | 12 | 0.1 |

*Example A45 is example 12 (identical example).

TABLE 19

Design compositions (parameters) of examples A44-A53

| | | Composition parameters | | | | |
|---|---|---|---|---|---|---|
| Examples | | a Si | b Al | c O | d N | e Eu |
| Example | A44 | 0.0216 | 0.4545 | 0.1082 | 0.4113 | 0.0043 |
| Example | A45 | 0.0433 | 0.4329 | 0.0866 | 0.4329 | 0.0043 |
| Example | A46 | 0.0647 | 0.4095 | 0.0647 | 0.4526 | 0.0086 |
| Example | A47 | 0.0776 | 0.3966 | 0.0517 | 0.4655 | 0.0086 |
| Example | A48 | 0.0866 | 0.3896 | 0.0433 | 0.4762 | 0.0043 |
| Example | A49 | 0.0866 | 0.3896 | 0.0433 | 0.4762 | 0.0043 |
| Example | A50 | 0.1082 | 0.3680 | 0.0216 | 0.4978 | 0.0043 |
| Example | A51 | 0.1082 | 0.3680 | 0.0216 | 0.4978 | 0.0043 |
| Example | A52 | 0.1299 | 0.3463 | 0 | 0.5195 | 0.0043 |
| Example | A53 | 0.1299 | 0.3463 | 0 | 0.5195 | 0.0043 |

* Example A45 is example 12 (identical example).

TABLE 20

Design compositions (parameters) of examples A44-A53

| | | Raw material mixture compositions (mass ratios) | | | | |
|---|---|---|---|---|---|---|
| Examples | | Si3N4 | AlN | Al2O3 | Eu2O3 | EuN |
| Example | A44 | 4.79 | 74.19 | 17.41 | 3.61 | 0.00 |
| Example | A45 | 9.59 | 72.86 | 13.94 | 3.61 | 0.00 |
| Example | A46 | 13.90 | 69.03 | 10.10 | 6.97 | 0.00 |
| Example | A47 | 16.68 | 68.26 | 8.09 | 6.98 | 0.00 |
| Example | A48 | 19.25 | 70.33 | 7.00 | 0.00 | 3.42 |
| Example | A49 | 19.25 | 70.33 | 7.00 | 0.00 | 3.42 |
| Example | A50 | 24.09 | 68.99 | 3.50 | 0.00 | 3.42 |
| Example | A51 | 24.09 | 68.99 | 3.50 | 0.00 | 3.42 |
| Example | A52 | 28.94 | 67.64 | 0.00 | 0.00 | 3.42 |
| Example | A53 | 28.94 | 67.64 | 0.00 | 0.00 | 3.42 |

* Example A45 is example 12 (identical example).

TABLE 21

Firing conditions of examples A44-A53

| | | Firing conditions | | |
|---|---|---|---|---|
| Examples | | Temperature (° C.) | Ambient pressure (mpa) | Time (hour) |
| Example | A44 | 2000° C. | 1 | 2 |
| Example | A45 | 2000° C. | 1 | 2 |
| Example | A46 | 2000° C. | 1 | 2 |
| Example | A47 | 2000° C. | 1 | 2 |
| Example | A48 | 1900° C. | 1 | 2 |
| Example | A49 | 2000° C. | 1 | 2 |
| Example | A50 | 1900° C. | 1 | 2 |
| Example | A51 | 2000° C. | I | 2 |
| Example | A52 | 1900° C. | 1 | 2 |
| Example | A53 | 2000° C. | 1 | 2 |

* Example A45 is example 12 (identical example).

Next, each synthesized compound was ground using an agate mortar and the powder X-ray diffraction measurement using Cu Kα-line was carried out. As a result thereof, it was confirmed that a crystal phase having the same crystal structure as the crystal represented by $Si_xAl_{11-x}O_{3-x}N_{9+x}$ (x=3) was produced. Further, it was confirmed that the synthesized material included Eu, Si, Al, N, and O by the measurement of EDS. That is to say, it was confirmed that the synthesized material was an inorganic compound in which Eu as the light-emitting ion was solid solved in the $Si_xAl_{11-x}O_{3-x}N_{9+x}$ system crystal.

After firing, the obtained firing products were crushed coarsely and further ground by hand using a crucible and mortar made of silicon nitride sintered body, and then allowed to pass a 30 μm-mesh sieve. When the particle size distribution was measured, the mean particle diameter was 3~8 μm.

As a result of irradiating light of wavelength of 365 nm emitted by the lamp onto these powder samples, it was confirmed that these powder samples emitted light of blue-to-green color. An emission spectrum and an excitation spectrum of each of the powders were measured using a spectrophotofluorometer. Peak wavelengths of the excitation spectra and peak wavelengths of the emission spectra are shown in Table 22. It was confirmed that the inorganic compounds could be excited by an ultraviolet ray of 300 nm~380 nm and violet or blue light of 380 nm~450 nm and that they were phosphors to emit blue-to-green light.

TABLE 22

Excitation emission characteristics of examples A44-A53

| Examples | | Excitation peak wavelength (nm) | Emission peak wavelength (nm) | Emission intensity (arbitrary unit) |
|---|---|---|---|---|
| Example | A44 | 271 | 479 | 0.02 |
| Example | A45 | 257 | 487 | 0.04 |
| Example | A46 | 328 | 475 | 0.58 |
| Example | A47 | 328 | 473 | 1.41 |
| Example | A48 | 327 | 477 | 1.90 |
| Example | A49 | 331 | 478 | 1.98 |
| Example | A50 | 338 | 479 | 1.88 |
| Example | A51 | 338 | 482 | 1.81 |
| Example | A52 | 305 | 487 | 1.52 |
| Example | A53 | 342 | 486 | 1.22 |

* Example A45 is example 12 (identical example).

Here, it is considered that, in the case where a raw material mixture composition and a chemical composition of the synthesized compound showed discrepancy, a trace amount of substance was mixed in the synthesized material as an impurity secondary phase. In the following examples, it is considered the same should apply such that the above recitation will be omitted.

Figure 11:
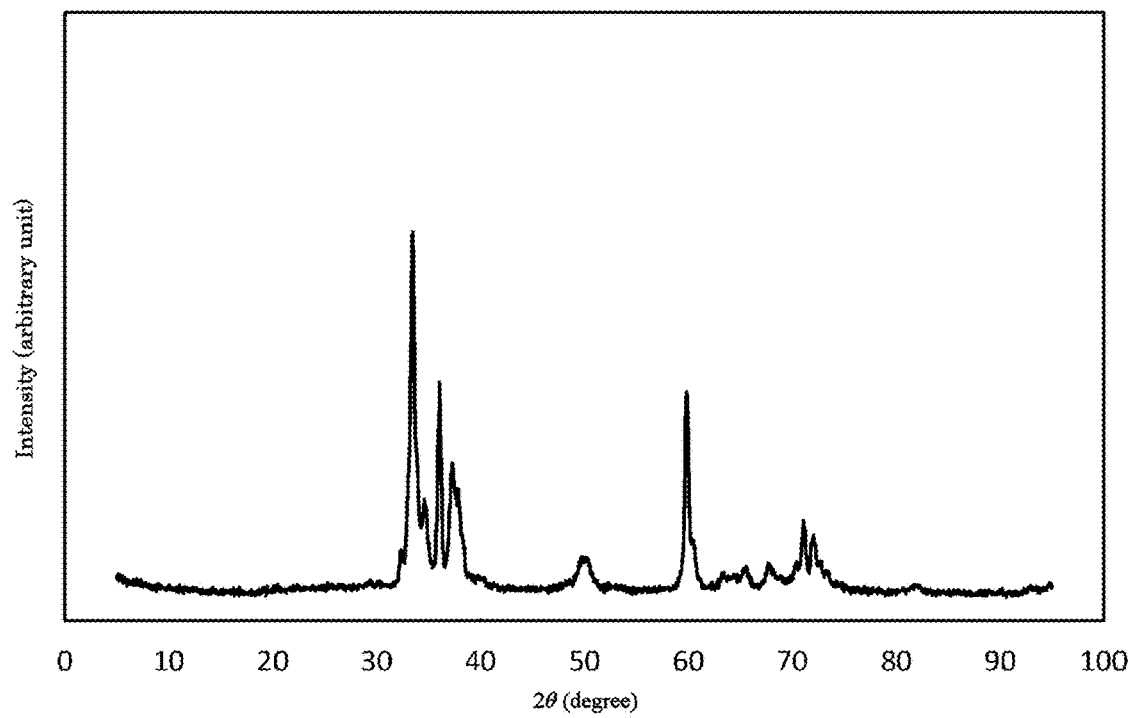
FIG. 11 is a diagram showing a resultant powder X-ray diffraction pattern of a phosphor synthesized in Example A48.

FIG. 11 is a diagram showing a resultant powder X-ray diffraction pattern of a phosphor synthesized in Example A48.

Figure 12:
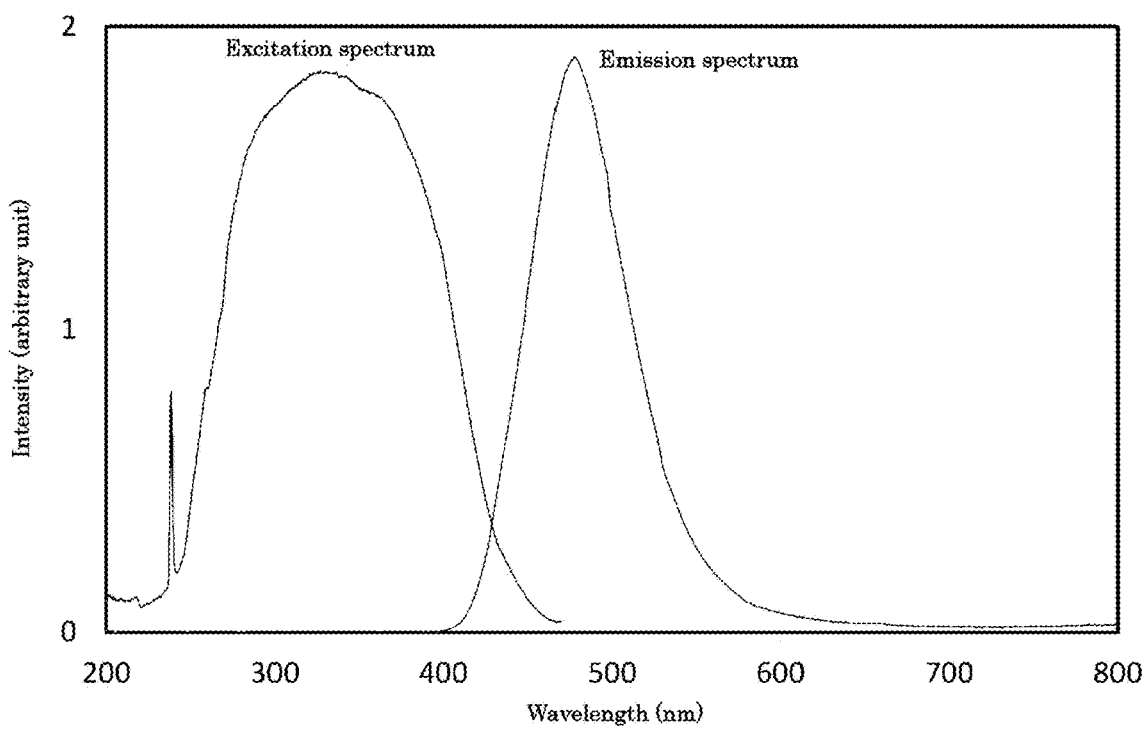
FIG. 12 is a diagram showing an excitation spectrum and an emission spectrum of a phosphor synthesized in Example A48.

FIG. 12 is a diagram showing an excitation spectrum and an emission spectrum of the phosphor synthesized in Example A48.

The results of powder X-ray diffraction of the synthesized phosphors (FIG. 11) show a good agreement with the results of structure analysis (FIG. 2). In Example A48, the measured X-ray diffraction pattern is the same as the $Si_xAl_{11-x}O_{3-x}N_{9+x}$ (x=3) crystal, and the crystal having the same crystal structure as the $Si_xAl_{11-x}O_{3-x}N_{9+x}$ (x=3) crystal was confirmed to be the main component. In Example A48, it is understood that the phosphor was found to allow excitation at 327 nm most efficiently, and the emission spectrum was found to emit light having a peak at 477 nm when the phosphor was excited by light of 327 nm. Further, an emission color of the phosphor of Example A48 was confirmed to be (0.149, 0.225) in the CIE 1931 chromaticity coordinates.

Phosphor Examples; Examples B44 to B59

According to the design compositions as shown in Tables 23 and 24, raw materials were weighed to be mixture compositions (mass ratios) as shown in Table 25. Design parameters were set to m=10 (n=12) and x was set in the range of x=0.5~3 while x should be mainly 2.5. A powder mixture was obtained from raw material powders weighed in the same way as described with respect to Examples A44 to A53 and the powder mixture was fed into a crucible. Here, the bulk density of the powder body was also approximately in the range from 20% to 30%. The powder mixture was fired in the same procedure as used with Examples A44 to A53. The firing conditions are shown in Table 26.

TABLE 23

Design compositions (atomic proportion) of examples B44-B59

| | | Design parameters | | | M element | | X element | | A element |
|---|---|---|---|---|---|---|---|---|---|
| Examples | | n | m (m = n − 2) | x | Si | Al | O | N | Eu |
| Example | B44 | 12 | 10 | 0.5 | 0.5 | 11.5 | 2.5 | 10.5 | 0.1 |
| Example | B45 | 12 | 10 | 1 | 1 | 11 | 2 | 11 | 0.1 |
| Example | B46 | 12 | 10 | 1 | 1 | 11 | 2 | 11 | 0.1 |
| Example | B47 | 12 | 10 | 1.5 | 1.5 | 10.5 | 1.5 | 11.5 | 0.1 |
| Example | B48 | 12 | 10 | 1.5 | 1.5 | 10.5 | 1.5 | 11.5 | 0.1 |
| Example | B49 | 12 | 10 | 1.8 | 1.8 | 10.2 | 1.2 | 11.8 | 0.2 |
| Example | B50 | 12 | 10 | 2 | 2 | 10 | 1 | 12 | 0.1 |
| Example | B51 | 12 | 10 | 2 | 2 | 10 | 1 | 12 | 0.1 |
| Example | B52 | 12 | 10 | 2.5 | 2.5 | 9.5 | 0.5 | 12.5 | 0.01 |
| Example | B53 | 12 | 10 | 2.5 | 2.5 | 9.5 | 0.5 | 12.5 | 0.05 |
| Example | B54 | 12 | 10 | 2.5 | 2.5 | 9.5 | 0.5 | 12.5 | 0.1 |
| Example | B55 | 12 | 10 | 2.5 | 2.5 | 9.5 | 0.5 | 12.5 | 0.1 |
| Example | B56 | 12 | 10 | 2.5 | 2.5 | 9.5 | 0.5 | 12.5 | 0.2 |
| Example | B57 | 12 | 10 | 2.5 | 2.5 | 9.5 | 0.5 | 12.5 | 0.5 |
| Example | B58 | 12 | 10 | 3 | 3 | 9 | 0 | 13 | 0.1 |
| Example | B59 | 12 | 10 | 3 | 3 | 9 | 0 | 13 | 0.1 |

*Examples B53, B54, and B55 are examples 17, 18, and 19, respectively (identical examples).

TABLE 24

Design compositions (parameters) of examples B44-B59

| | | Composition parameters | | | | |
|---|---|---|---|---|---|---|
| Examples | | a Si | b Al | c O | d N | e Eu |
| Example | B44 | 0.0199 | 0.4582 | 0.0996 | 0.4183 | 0.0040 |
| Example | B45 | 0.0398 | 0.4382 | 0.0797 | 0.4382 | 0.0040 |
| Example | B46 | 0.0398 | 0.4382 | 0.0797 | 0.4382 | 0.0040 |
| Example | B47 | 0.0598 | 0.4183 | 0.0598 | 0.4582 | 0.0040 |
| Example | B48 | 0.0598 | 0.4183 | 0.0598 | 0.4582 | 0.0040 |
| Example | B49 | 0.0714 | 0.4048 | 0.0476 | 0.4683 | 0.0079 |
| Example | B50 | 0.0797 | 0.3984 | 0.0398 | 0.4781 | 0.0040 |
| Example | B51 | 0.0797 | 0.3984 | 0.0398 | 0.4781 | 0.0040 |
| Example | B52 | 0.1000 | 0.3798 | 0.0200 | 0.4998 | 0.0004 |
| Example | B53 | 0.0998 | 0.3792 | 0.0200 | 0.4990 | 0.0020 |
| Example | B54 | 0.0996 | 0.3785 | 0.0199 | 0.4980 | 0.0040 |
| Example | B55 | 0.0996 | 0.3785 | 0.0199 | 0.4980 | 0.0040 |
| Example | B56 | 0.0992 | 0.3770 | 0.0198 | 0.4960 | 0.0079 |
| Example | B57 | 0.0980 | 0.3725 | 0.0196 | 0.4902 | 0.0196 |
| Example | B58 | 0.1195 | 0.3586 | 0 | 0.5179 | 0.0040 |
| Example | B59 | 0.1195 | 0.3586 | 0 | 0.5179 | 0.0040 |

*Examples B53, B54, and B55 are examples 17, 18, and 19, respectively (identical examples).

TABLE 25

Raw material mixture compositions (mass ratios) of examples B44-B59

| | | Raw material mixture composition (mass ratios) | | | |
|---|---|---|---|---|---|
| Examples | | Si3N4 | AlN | Al2O3 | Eu2O3 |
| Example | B44 | 4.42 | 76.19 | 16.06 | 3.33 |
| Example | B45 | 8.85 | 74.96 | 12.86 | 3.33 |
| Example | B46 | 8.85 | 74.96 | 12.86 | 3.33 |
| Example | B47 | 13.28 | 73.73 | 9.65 | 3.33 |
| Example | B48 | 13.28 | 73.73 | 9.65 | 3.33 |
| Example | B49 | 15.43 | 70.64 | 7.48 | 6.45 |
| Example | B50 | 17.72 | 72.50 | 6.44 | 3.33 |
| Example | B51 | 17.72 | 72.50 | 6.44 | 3.33 |
| Example | B52 | 22.86 | 73.47 | 3.32 | 0.34 |
| Example | B53 | 22.55 | 72.48 | 3.28 | 1.70 |
| Example | B54 | 22.17 | 71.27 | 3.22 | 3.34 |
| Example | B55 | 22.17 | 71.27 | 3.22 | 3.34 |

TABLE 25-continued

Raw material mixture compositions
(mass ratios) of examples B44-B59

| | | Raw material mixture composition (mass ratios) | | | |
|---|---|---|---|---|---|
| Examples | | Si3N4 | AlN | Al2O3 | Eu2O3 |
| Example | B56 | 21.46 | 68.97 | 3.12 | 6.46 |
| Example | B57 | 19.56 | 62.87 | 2.84 | 14.72 |
| Example | B58 | 26.63 | 70.03 | 0 | 3.34 |
| Example | B59 | 26.63 | 70.03 | 0 | 3.34 |

*Examples B53, B54, and B55 are examples 17, 18, and 19, respectively (identical examples).

TABLE 26

Firing conditions of examples B44-B59

| | | Firing conditions | | |
|---|---|---|---|---|
| Examples | | Temperature (° C.) | Ambient pressure (mpa) | Time (hour) |
| Example | B44 | 2000° C. | 1 | 2 |
| Example | B45 | 1900° C. | 1 | 2 |
| Example | B46 | 2000° C. | 1 | 2 |
| Example | B47 | 1900° C. | 1 | 2 |
| Example | B48 | 2000° C. | 1 | 2 |
| Example | B49 | 2000° C. | 1 | 2 |
| Example | B50 | 1900° C. | 1 | 2 |
| Example | B51 | 2000° C. | 1 | 2 |
| Example | B52 | 2000° C. | 1 | 2 |
| Example | B53 | 2000° C. | 1 | 2 |
| Example | B54 | 1900° C. | 1 | 2 |
| Example | B55 | 2000° C. | 1 | 2 |
| Example | B56 | 2000° C. | 1 | 2 |
| Example | B57 | 2000° C. | 1 | 2 |
| Example | B58 | 1900° C. | 1 | 2 |
| Example | B59 | 2000° C. | 1 | 2 |

*Examples B53, B54, and B55 are examples 17, 18, and 19, respectively (identical examples).

Next, each synthesized compound was ground using an agate mortar and the powder X-ray diffraction measurement using Cu Kα-line was carried out. As a result thereof, it was confirmed that a crystal phase having the same crystal structure as the crystal represented by $Si_xAl_{12-x}O_{3-x}N_{10+x}$ (x=2.5) was produced. Further, it was confirmed that the synthesized material included Eu, Si, Al, N, and O by the measurement of EDS. That is to say, it was confirmed that the synthesized material was an inorganic compound in which Eu as the light-emitting ion was solid solved in the $Si_xAl_{12-x}O_{3-x}N_{10+x}$ system crystal.

After firing, the obtained firing products were crushed coarsely and further ground by hand using a crucible and mortar made of silicon nitride sintered body, and then allowed to pass a 30 μm-mesh sieve. When the particle size distribution was measured, the mean particle diameter was 3~8 μm.

As a result of irradiating light of wavelength of 365 nm emitted by the lamp onto these powder samples, it was confirmed that these powder samples emitted light of blue-to-green color. An emission spectrum and an excitation spectrum of each of the powders were measured using a spectrophotofluorometer. Peak wavelengths of the excitation spectra and peak wavelengths of the emission spectra are shown in Table 27. It was confirmed that the inorganic compounds could be excited by an ultraviolet ray of 300 nm~380 nm and violet or blue light of 380 nm~450 nm and that they were phosphors to emit blue-to-green light.

TABLE 27

Excitation emission characteristics of examples B44-B59

| Examples | | Excitation peak wavelength (nm) | Emission peak wavelength (nm) | Emission intensity (arbitrary unit) |
|---|---|---|---|---|
| Example | B44 | 251 | 482 | 0.03 |
| Example | B45 | 259 | 484 | 0.03 |
| Example | B46 | 254 | 500 | 0.04 |
| Example | B47 | 331 | 472 | 0.89 |
| Example | B48 | 334 | 473 | 0.69 |
| Example | B49 | 328 | 475 | 1.40 |
| Example | B50 | 332 | 478 | 1.85 |
| Example | B51 | 366 | 477 | 1.75 |
| Example | B52 | 351 | 481 | 1.01 |
| Example | B53 | 359 | 487 | 1.51 |
| Example | B54 | 338 | 478 | 1.67 |
| Example | B55 | 357 | 479 | 1.72 |
| Example | B56 | 365 | 478 | 2.12 |
| Example | B57 | 343 | 476 | 1.3 |
| Example | B58 | 335 | 480 | 1.34 |
| Example | B59 | 344 | 479 | 1.48 |

*Examples B53, B54, and B55 are examples 17, 18, and 19, respectively (identical examples).

Figure 13:
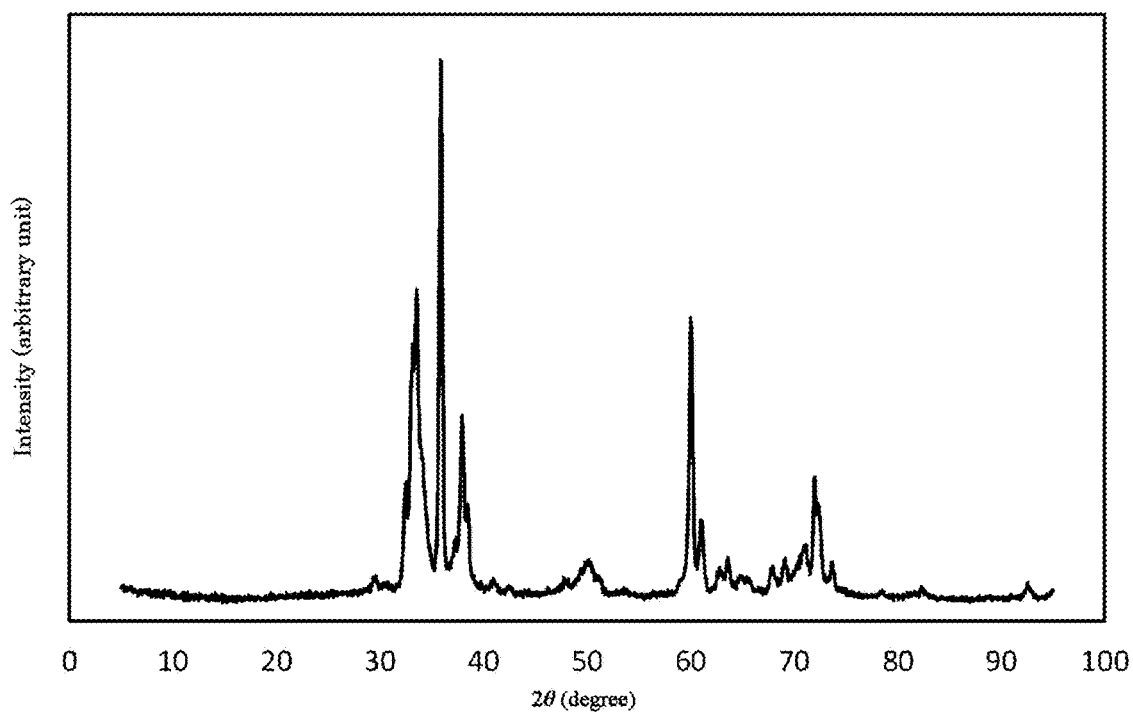
FIG. 13 is a diagram showing a resultant powder X-ray diffraction pattern of a phosphor synthesized in Example B53.

FIG. 13 is a diagram showing a resultant powder X-ray diffraction pattern of a phosphor synthesized in Example B53.

Figure 14:
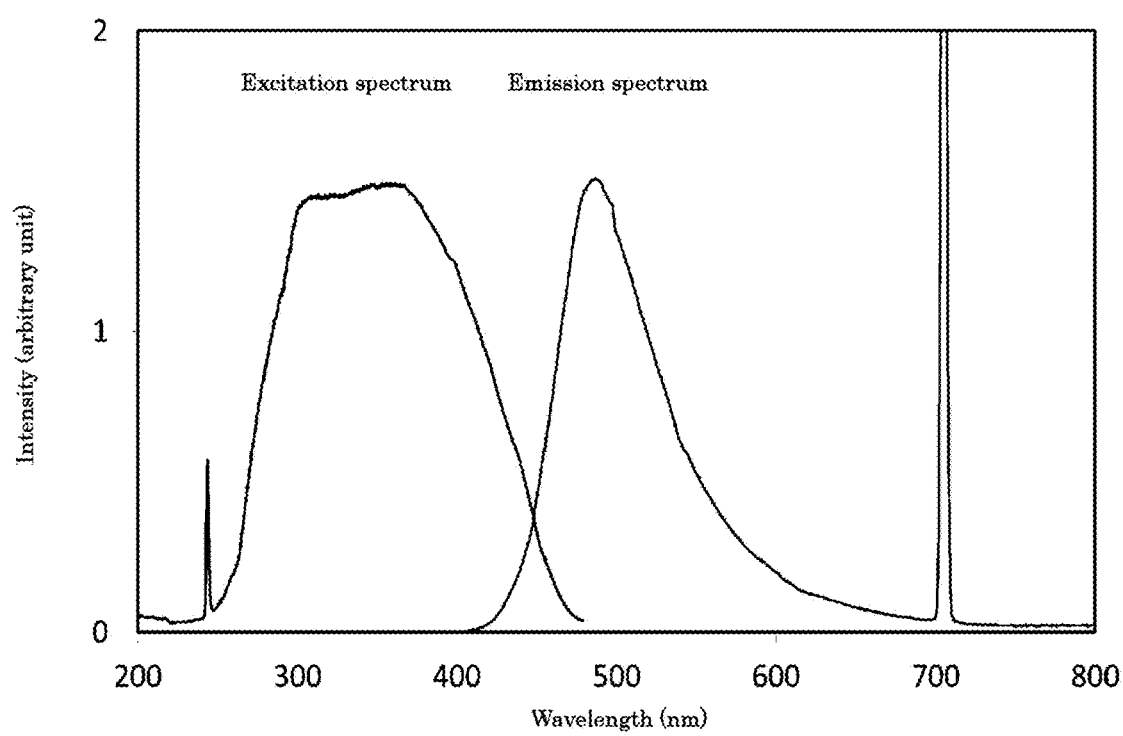
FIG. 14 is a diagram showing an excitation spectrum and an emission spectrum of a phosphor synthesized in Example B53.

FIG. 14 is a diagram showing an excitation spectrum and an emission spectrum of the phosphor synthesized in Example B53.

The results of powder X-ray diffraction of the synthesized phosphors (FIG. 13) show a good agreement with the results of structure analysis (FIG. 4). In Example B53, the measured X-ray diffraction pattern is the same as the $Si_xAl_{12-x}O_{3-x}N_{10+x}$ (x=2.5) crystal, and the crystal having the same crystal structure as the $Si_xAl_{12-x}O_{3-x}N_{10+x}$ (x=2.5) crystal was confirmed to be the main component. In Example B53, it is understood that the phosphor was found to allow excitation at 359 nm most efficiently, and the emission spectrum was found to emit light having a peak at 487 nm when the phosphor was excited by light of 359 nm. Further, an emission color of the phosphor of Example B53 was confirmed to be (0.205, 0.366) in the CIE 1931 chromaticity coordinates.

Phosphor Examples; Examples C44 to C53

According to the design compositions as shown in Tables 28 and 29, raw materials were weighed to be mixture compositions (mass ratios) as shown in Table 30. Design parameters were set to m=11 (n=13) and x was set in the range of x=0.5~3. A powder mixture was obtained from raw material powders weighed in the same way as described with respect to Examples A44 to A53 and the powder mixture was fed into a crucible. Here, the bulk density of the powder body was also approximately in the range from 20% to 30%. The powder mixture was fired in the same procedure as used with Examples A44 to A53. The firing conditions are shown in Table 31.

TABLE 28

Design compositions (atomic proportion) of examples C44-C53

| | Design parameters | | | M element | | X element | | A element |
|---|---|---|---|---|---|---|---|---|
| Examples | | n | m (m = n − 2) | x | Si | Al | O | N | Eu |
| Example | C44 | 13 | 11 | 0.5 | 0.5 | 12.5 | 2.5 | 11.5 | 0.1 |
| Example | C45 | 13 | 11 | 1 | 1 | 12 | 2 | 12 | 0.1 |
| Example | C46 | 13 | 11 | 1.5 | 1.5 | 11.5 | 1.5 | 12.5 | 0.2 |
| Example | C47 | 13 | 11 | 1.8 | 1.8 | 11.2 | 1.2 | 12.8 | 0.2 |
| Example | C48 | 13 | 11 | 2 | 2 | 11 | 1 | 13 | 0.1 |
| Example | C49 | 13 | 11 | 2 | 2 | 11 | 1 | 13 | 0.1 |
| Example | C50 | 13 | 11 | 2.5 | 2.5 | 10.5 | 0.5 | 13.5 | 0.1 |
| Example | C51 | 13 | 11 | 2.5 | 2.5 | 10.5 | 0.5 | 13.5 | 0.1 |
| Example | C52 | 13 | 11 | 3 | 3 | 10 | 0 | 14 | 0.1 |
| Example | C53 | 13 | 11 | 3 | 3 | 10 | 0 | 14 | 0.1 |

*Examples C49, C50, and C51 are examples 21, 22, and 23, respectively (identical examples).

TABLE 29

Design compositions (parameters) of examples C44-C53

| | | Composition parameters | | | | |
|---|---|---|---|---|---|---|
| Examples | | a Si | b Al | c O | d N | e Eu |
| Example | C44 | 0.0185 | 0.4613 | 0.0923 | 0.4244 | 0.0037 |
| Example | C45 | 0.0369 | 0.4428 | 0.0738 | 0.4428 | 0.0037 |
| Example | C46 | 0.0551 | 0.4228 | 0.0551 | 0.4596 | 0.0074 |
| Example | C47 | 0.0662 | 0.4118 | 0.0441 | 0.4706 | 0.0074 |
| Example | C48 | 0.0738 | 0.4059 | 0.0369 | 0.4797 | 0.0037 |
| Example | C49 | 0.0738 | 0.4059 | 0.0369 | 0.4797 | 0.0037 |
| Example | C50 | 0.0923 | 0.3875 | 0.0185 | 0.4982 | 0.0037 |
| Example | C51 | 0.0923 | 0.3875 | 0.0185 | 0.4982 | 0.0037 |
| Example | C52 | 0.1107 | 0.3690 | 0.0000 | 0.5166 | 0.0037 |
| Example | C53 | 0.1107 | 0.3690 | 0.0000 | 0.5166 | 0.0037 |

*Examples C49, C50, and C51 are examples 21, 22, and 23, respectively (identical examples).

TABLE 30

Raw material mixture composition (mass ratios) of examples C44-C53

| | | Raw material mixture composition (mass ratios) | | | |
|---|---|---|---|---|---|
| Examples | | Si3N4 | AlN | Al2O3 | Eu2O3 |
| Example | C44 | 4.10 | 77.91 | 14.91 | 3.09 |
| Example | C45 | 8.21 | 76.77 | 11.94 | 3.09 |
| Example | C46 | 11.95 | 73.36 | 8.69 | 6.00 |
| Example | C47 | 14.35 | 72.69 | 6.96 | 6.00 |
| Example | C48 | 16.45 | 74.48 | 5.98 | 3.09 |
| Example | C49 | 16.45 | 74.48 | 5.98 | 3.09 |
| Example | C50 | 20.57 | 73.34 | 2.99 | 3.10 |
| Example | C51 | 20.57 | 73.34 | 2.99 | 3.10 |
| Example | C52 | 24.71 | 72.19 | 0.00 | 3.10 |
| Example | C53 | 24.71 | 72.19 | 0.00 | 3.10 |

*Examples C49, C50, and C51 are examples 21, 22, and 23, respectively (identical examples).

TABLE 31

Firing conditions of examples C44-C53

| | | Firing conditions | | |
|---|---|---|---|---|
| Examples | | Temperature (° C.) | Ambient pressure (mpa) | Time (hour) |
| Example | C44 | 1900° C. | 1 | 2 |
| Example | C45 | 2000° C. | 1 | 2 |
| Example | C46 | 2000° C. | 1 | 2 |
| Example | C47 | 2000° C. | 1 | 2 |
| Example | C48 | 1900° C. | 1 | 2 |
| Example | C49 | 2000° C. | 1 | 2 |
| Example | C50 | 1900° C. | 1 | 2 |
| Example | C51 | 2000° C. | 1 | 2 |
| Example | C52 | 1900° C. | 1 | 2 |
| Example | C53 | 2000° C. | 1 | 2 |

*Examples C49, C50, and C51 are examples 21, 22, and 23, respectively (identical examples).

Next, each synthesized compound was ground using an agate mortar and the powder X-ray diffraction measurement using Cu Kα-line was carried out. As a result thereof, it was confirmed that a crystal phase having the same crystal structure as the crystal represented by $Si_xAl_{13-x}O_{3-x}N_{11+x}$ (x≈2.2) was produced. Further, it was confirmed that the synthesized material included Eu, Si, Al, N, and O by the measurement of EDS. That is to say, it was confirmed that the synthesized product was an inorganic compound in which Eu as the light-emitting ion was solid solved in the $Si_xAl_{13-x}O_{3-x}N_{11+x}$ system crystal.

After firing, the obtained firing products were crushed coarsely and further ground by hand using a crucible and mortar made of silicon nitride sintered body, and then allowed to pass a 30 μm-mesh sieve. When the particle size distribution was measured, the mean particle diameter was 3~8 μm.

As a result of irradiating light of wavelength of 365 nm emitted by the lamp onto these powder samples, it was confirmed that these powder samples emitted light of blue-to-yellow color and that they emitted light of blue-to-green color with the specific composition. An emission spectrum and an excitation spectrum of each of the powders were measured using a spectrophotofluorometer.

Peak wavelengths of the excitation spectra and peak wavelengths of the emission spectra are shown in Table 32.

It was confirmed that the inorganic compounds could be excited by an ultraviolet ray of 300 nm~380 nm and violet or blue light of 380 nm~450 nm and were phosphors to emit blue-to-green light.

TABLE 32

Excitation emission characteristics of examples C44-C53

| Examples | | Excitation peak wavelength (nm) | Emission peak wavelength (nm) | Emission intensity (arbitrary unit) |
|---|---|---|---|---|
| Example | C44 | 299 | 595 | 0.57 |
| Example | C45 | 259 | 488 | 0.03 |
| Example | C46 | 281 | 474 | 0.47 |
| Example | C47 | 330 | 473 | 1.44 |
| Example | C48 | 343 | 475 | 1.62 |
| Example | C49 | 342 | 478 | 1.48 |
| Example | C50 | 346 | 478 | 1.70 |
| Example | C51 | 359 | 479 | 1.64 |
| Example | C52 | 340 | 479 | 1.31 |
| Example | C53 | 361 | 480 | 1.65 |

*Examples C49, C50, and C51 are examples 21, 22, and 23, respectively (identical examples).

Figure 15:
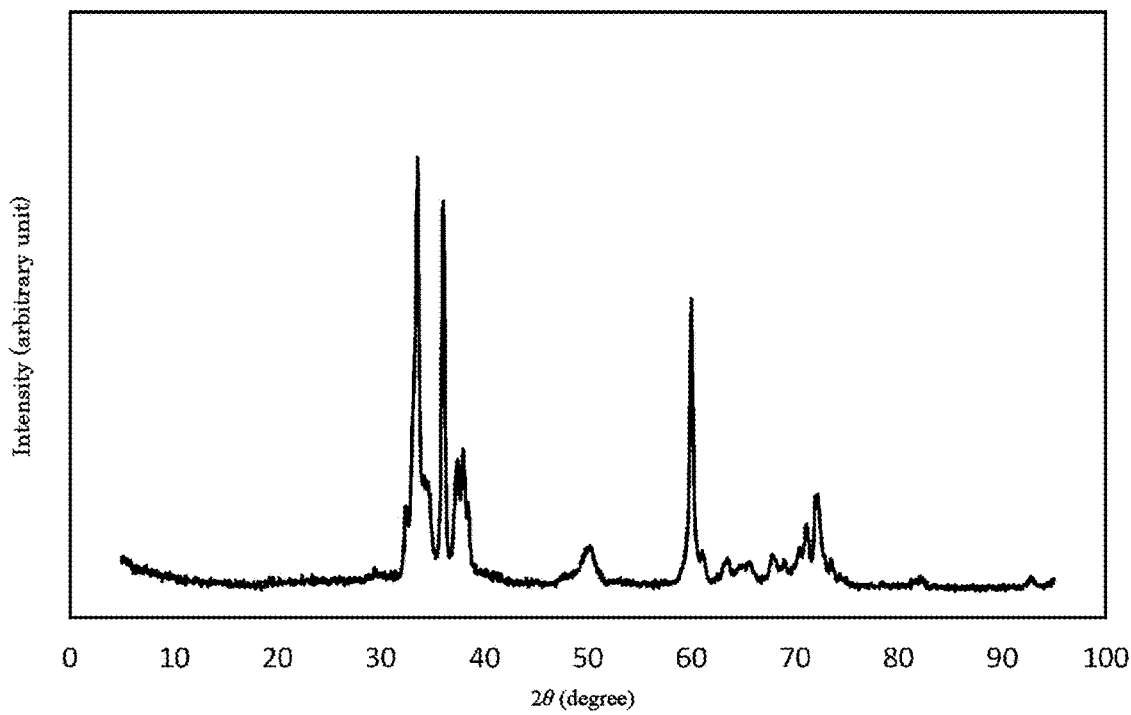
FIG. 15 is a diagram showing a resultant powder X-ray diffraction pattern of a phosphor synthesized in Example C51.

FIG. 15 is a diagram showing a resultant powder X-ray diffraction pattern of a phosphor synthesized in Example C51.

Figure 16:
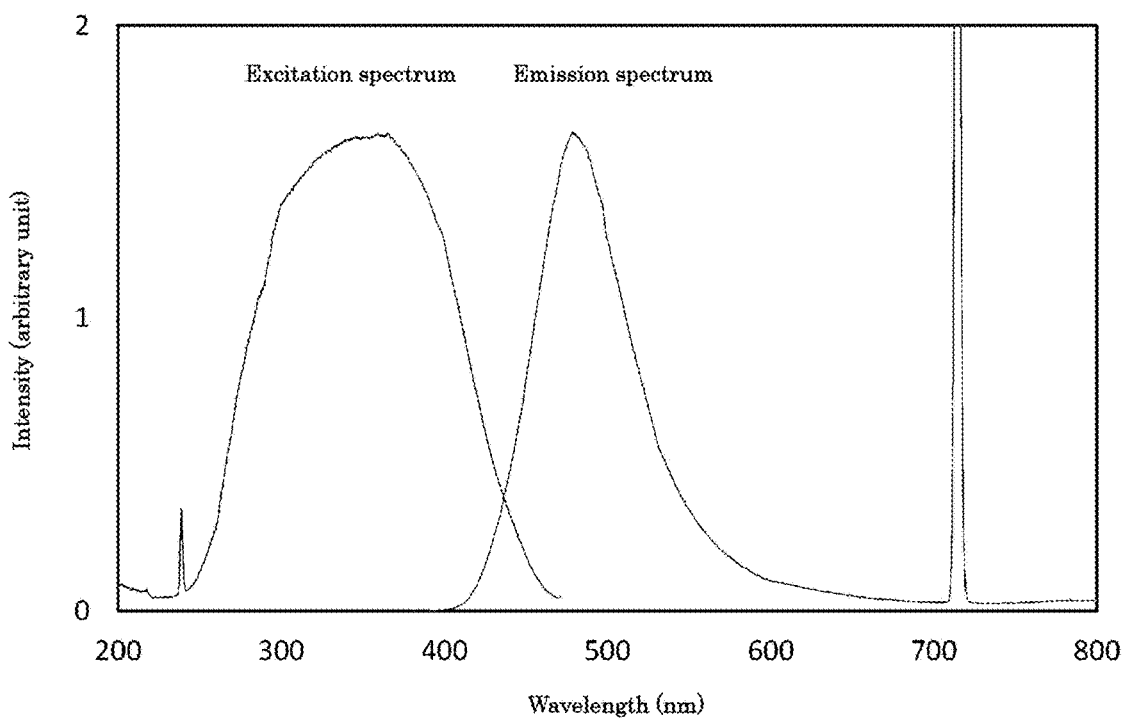
FIG. 16 is a diagram showing an excitation spectrum and an emission spectrum of a phosphor synthesized in Example C51.

FIG. 16 is a diagram showing an excitation spectrum and an emission spectrum of the phosphor synthesized in Example C51.

The results of powder X-ray diffraction of the synthesized phosphors (FIG. 15) show a good agreement with the results of structure analysis (FIG. 6). In Example C51, the measured X-ray diffraction pattern is the same as the $Si_xAl_{13-x}O_{3-x}N_{11+x}$ (x≈2.2) crystal, and the crystal having the same crystal structure as the $Si_xAl_{13-x}O_{3-x}N_{11+x}$ (x≈2.2) crystal was confirmed to be the main component. In Example C51, it is understood that the phosphor was found to allow excitation at 359 nm most efficiently, and the emission spectrum was found to emit light having a peak at 479 nm when the phosphor was excited by light of 359 nm. Further, an emission color of the phosphor of Example C51 was confirmed to be (0.169, 0.273) in the CIE 1931 chromaticity coordinates.

Phosphor Examples; Examples D44 to D53

According to the design compositions as shown in Tables 33 and 34, raw materials were weighed to be mixture compositions (mass ratios) as shown in Table 35. Design parameters were set to m=12 (n=14) and x was set in the range of x=0.5~3. A powder mixture was obtained from raw material powders weighed in the same way as described with respect to Examples A44 to A53 and the powder mixture was fed into a crucible. Here, the bulk density of the powder body was also approximately in the range from 20% to 30%. The powder mixture was fired in the same procedure as used with Examples A44 to A53. The firing conditions are shown in Table 36.

TABLE 33

Design compositions (atomic proportion) of examples D44-D53

| | | Design parameters | | M | | X | | A |
|---|---|---|---|---|---|---|---|---|
| | | m (m = | | element | | element | | element |
| Examples | | n | n − 2 | x | Si | Al | O | N | Eu |
| Example | D44 | 14 | 12 | 0.5 | 0.5 | 13.5 | 2.5 | 12.5 | 0.1 |
| Example | D45 | 14 | 12 | 1.5 | 1.5 | 12.5 | 1.5 | 13.5 | 0.1 |
| Example | D46 | 14 | 12 | 1.5 | 1.5 | 12.5 | 1.5 | 13.5 | 0.1 |
| Example | D47 | 14 | 12 | 1.8 | 1.8 | 12.2 | 1.2 | 13.8 | 0.2 |
| Example | D48 | 14 | 12 | 2 | 2 | 12 | 1 | 14 | 0.1 |
| Example | D49 | 14 | 12 | 2 | 2 | 12 | 1 | 14 | 0.1 |
| Example | D50 | 14 | 12 | 2.5 | 2.5 | 11.5 | 0.5 | 14.5 | 0.1 |
| Example | D51 | 14 | 12 | 2.5 | 2.5 | 11.5 | 0.5 | 14.5 | 0.1 |
| Example | D52 | 14 | 12 | 3 | 3 | 11 | 0 | 15 | 0.1 |
| Example | D53 | 14 | 12 | 3 | 3 | 11 | 0 | 15 | 0.1 |

*Examples D45, D49, D50, and D51 are examples 24, 25, 26, and 27, respectively (identical examples).

TABLE 34

Design compositions (parameters) of examples D44-D53

| | | Composition parameters | | | | |
|---|---|---|---|---|---|---|
| | | a | b | c | d | e |
| Examples | | Si | Al | O | N | Eu |
| Example | D44 | 0.0172 | 0.4639 | 0.0859 | 0.4296 | 0.0034 |
| Example | D45 | 0.0515 | 0.4296 | 0.0515 | 0.4639 | 0.0034 |
| Example | D46 | 0.0515 | 0.4296 | 0.0515 | 0.4639 | 0.0034 |
| Example | D47 | 0.0616 | 0.4178 | 0.0411 | 0.4726 | 0.0068 |
| Example | D48 | 0.0687 | 0.4124 | 0.0344 | 0.4811 | 0.0034 |
| Example | D49 | 0.0687 | 0.4124 | 0.0344 | 0.4811 | 0.0034 |
| Example | D50 | 0.0859 | 0.3952 | 0.0172 | 0.4983 | 0.0034 |
| Example | D51 | 0.0859 | 0.3952 | 0.0172 | 0.4983 | 0.0034 |
| Example | D52 | 0.1031 | 0.3780 | 0 | 0.5155 | 0.0034 |
| Example | D53 | 0.1031 | 0.3780 | 0 | 0.5155 | 0.0034 |

*Examples D45, D49, D50, and D51 are examples 24, 25, 26, and 27, respectively (identical examples).

TABLE 35

Raw material mixture composition (mass ratios) of examples D44-D53

| | | Raw material mixture composition (mass ratios) | | | | |
|---|---|---|---|---|---|---|
| Examples | | Si3N4 | AlN | Al2O3 | Eu2O3 | EuN |
| Example | D44 | 3.83 | 79.52 | 13.93 | 0 | 2.72 |
| Example | D45 | 11.50 | 77.26 | 8.36 | 2.88 | 0 |
| Example | D46 | 11.50 | 77.26 | 8.36 | 2.88 | 0 |
| Example | D47 | 13.41 | 74.48 | 6.50 | 5.61 | 0 |
| Example | D48 | 15.34 | 76.20 | 5.57 | 2.89 | 0 |
| Example | D49 | 15.34 | 76.20 | 5.57 | 2.89 | 0 |
| Example | D50 | 19.19 | 75.13 | 2.79 | 2.89 | 0 |
| Example | D51 | 19.19 | 75.13 | 2.79 | 2.89 | 0 |
| Example | D52 | 23.08 | 74.19 | 0 | 0 | 2.73 |
| Example | D53 | 23.08 | 74.19 | 0 | 0 | 2.73 |

*Examples D45, D49, D50, and D51 are examples 24, 25, 26, and 27, respectively (identical examples).

TABLE 36

Firing conditions of examples D44-D53

| | | Firing conditions | | |
|---|---|---|---|---|
| | | Temperature | Ambient | Time |
| Examples | | (° C.) | pressure (mpa) | (hour) |
| Example | D44 | 2000° C. | 1 | 2 |
| Example | D45 | 1900° C. | 1 | 2 |
| Example | D46 | 2000° C. | 1 | 2 |
| Example | D47 | 2000° C. | 1 | 2 |
| Example | D48 | 1900° C. | 1 | 2 |
| Example | D49 | 2000° C. | 1 | 2 |
| Example | D50 | 1900° C. | 1 | 2 |
| Example | D51 | 2000° C. | 1 | 2 |
| Example | D52 | 1900° C. | 1 | 2 |
| Example | D53 | 2000° C. | 1 | 2 |

*Examples D45, D49, D50, and D51 are examples 24, 25, 26, and 27, respectively (identical examples).

Next, each synthesized compound was ground using an agate mortar and the powder X-ray diffraction measurement using Cu Kα-line was carried out. As a result thereof, it was confirmed that a crystal phase having the same crystal structure as the crystal represented by $Si_xAl_{14-x}O_{3-x}N_{12+x}$ (x=3) was produced. Further, it was confirmed that the synthesized material included Eu, Si, Al, N, and O by the measurement of EDS. That is to say, it was confirmed that the synthesized material was an inorganic compound in which Eu as the light-emitting ion was solid solved in the $Si_xAl_{14-x}O_{3-x}N_{12+x}$ system crystal.

After firing, the obtained firing products were crushed coarsely and further ground by hand using a crucible and mortar made of silicon nitride sintered body, and then allowed to pass a 30 μm-mesh sieve. When the particle size distribution was measured, the mean particle diameter was 3~8 μm.

As a result of irradiating light of wavelength of 365 nm emitted by the lamp onto these powder samples, it was confirmed that these powder samples emitted light of blue-to-green color. An emission spectrum and an excitation spectrum of the powder were measured using a spectrophotofluorometer. Peak wavelengths of the excitation spectra and peak wavelengths of the emission spectra are shown in Table 37. It was confirmed that the inorganic compounds could be excited by an ultraviolet ray of 300 nm~380 nm and violet or blue light of 380 nm~450 nm and were phosphors to emit blue-to-green light.

TABLE 37

Excitation emission characteristics of examples D44-D53

| Examples | | Excitation peak wavelength (nm) | Emission peak wavelength (nm) | Emission intensity (arbitrary unit) |
|---|---|---|---|---|
| Example | D44 | 311 | 521 | 0.09 |
| Example | D45 | 329 | 472 | 0.92 |
| Example | D46 | 337 | 472 | 0.66 |
| Example | D47 | 331 | 472 | 1.27 |
| Example | D48 | 330 | 477 | 1.78 |
| Example | D49 | 366 | 478 | 1.77 |
| Example | D50 | 342 | 478 | 1.63 |
| Example | D51 | 328 | 479 | 1.61 |
| Example | D52 | 303 | 489 | 1.61 |
| Example | D53 | 334 | 485 | 1.36 |

*Examples D45, D49, D50, and D51 are examples 24, 25, 26, and 27, respectively (identical examples).

Figure 17:
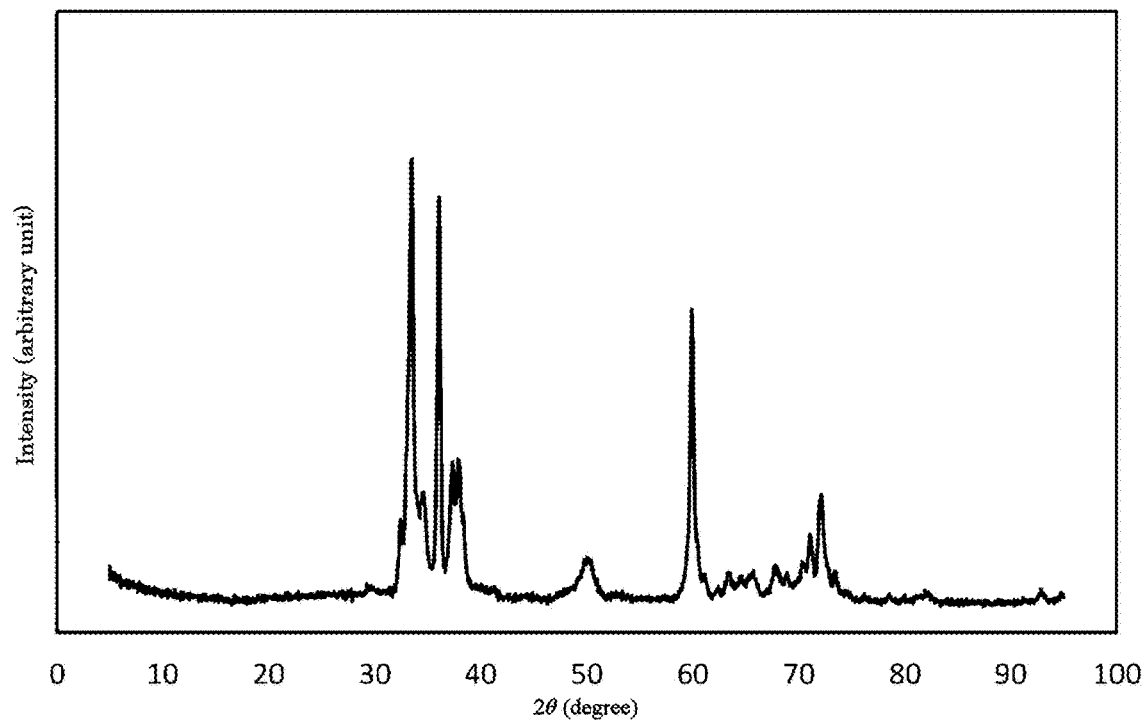
FIG. 17 is a diagram showing a resultant powder X-ray diffraction pattern of a phosphor synthesized in Example D51.

FIG. 17 is a diagram showing a resultant powder X-ray diffraction pattern of a phosphor synthesized in Example D51.

Figure 18:
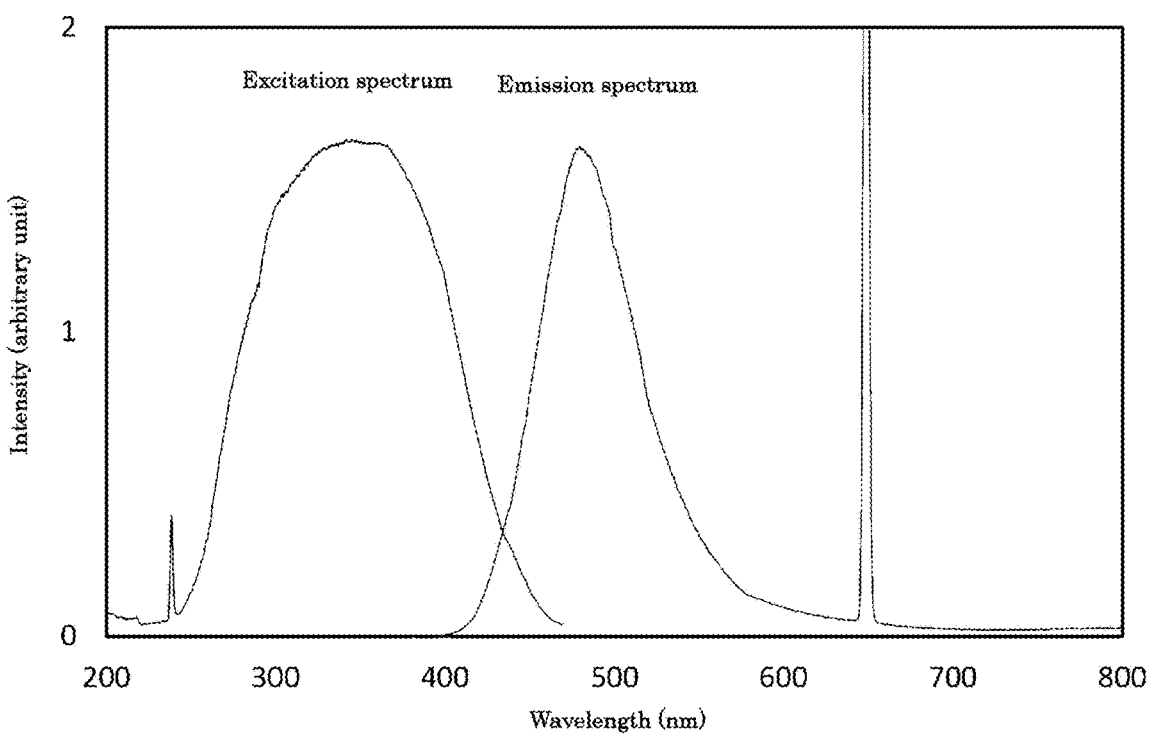
FIG. 18 is a diagram showing an excitation spectrum and an emission spectrum of a phosphor synthesized in Example D51.

FIG. 18 is a diagram showing an excitation spectrum and an emission spectrum of the phosphor synthesized in Example D51.

The results of powder X-ray diffraction of the synthesized phosphors (FIG. 17) show a good agreement with the results of structure analysis (FIG. 8). In Example D51, the measured X-ray diffraction pattern is the same as the $Si_xAl_{14-x}O_{3-x}N_{12+x}$ (x=3) crystal, and the crystal having the same crystal structure as the $Si_xAl_{14-x}O_{3-x}N_{12+x}$ (x=3) crystal was confirmed to be the main component. In Example D51, it is understood that the phosphor was found to allow excitation at 328 nm most efficiently, and the emission spectrum was found to emit light having a peak at 479 nm when the phosphor was excited by light of 328 nm. Further, an emission color of the phosphor of Example D51 was confirmed to be (0.164, 0.271) in the CIE 1931 chromaticity coordinates.

Phosphor Examples; Examples E44 to E53

According to the design compositions as shown in Tables 38 and 39, raw materials were weighed to be mixture compositions (mass ratios) as shown in Table 40. Design parameters were set to m=13 (n=15) and x is set in the range of x=0.5~3. A powder mixture was obtained from raw material powders weighed in the same way as described with respect to Examples A44 to A53 and the powder mixture was fed into a crucible. Here, the bulk density of the powder body was also approximately in the range from 20% to 30%. The powder mixture was fired in the same procedure as used with Examples A44 to A53. The firing conditions are shown in Table 41.

TABLE 38

Design compositions (atomic proportion) of examples E44-E53

| | | Design parameters | | M element | | X element | | A element |
|---|---|---|---|---|---|---|---|---|
| Examples | | n | m (m = n − 2) | Si | Al | O | N | Eu |
| Example | E44 | 15 | 13 | 0.5 | 0.5 | 14.5 | 2.5 | 13.5 | 0.1 |
| Example | E45 | 15 | 13 | 1.5 | 1.5 | 13.5 | 1.5 | 14.5 | 0.1 |
| Example | E46 | 15 | 13 | 1.5 | 1.5 | 13.5 | 1.5 | 14.5 | 0.1 |
| Example | E47 | 15 | 13 | 1.5 | 1.8 | 13.2 | 1.2 | 14.8 | 0.2 |
| Example | E48 | 15 | 13 | 2 | 2 | 13 | 1 | 15 | 0.1 |
| Example | E49 | 15 | 13 | 2 | 2 | 13 | 1 | 15 | 0.1 |
| Example | E50 | 15 | 13 | 2.5 | 2.5 | 12.5 | 0.5 | 15.5 | 0.1 |
| Example | E51 | 15 | 13 | 2.5 | 2.5 | 12.5 | 0.5 | 15.5 | 0.1 |
| Example | E52 | 15 | 13 | 3 | 3 | 12 | 0 | 16 | 0.1 |
| Example | E53 | 15 | 13 | 3 | 3 | 12 | 0 | 16 | 0.1 |

TABLE 39

Design compositions (parameters) of examples E44-E53

| | | Composition parameters | | | | |
|---|---|---|---|---|---|---|
| Examples | | a Si | b Al | c O | d N | e Eu |
| Example | E44 | 0.0161 | 0.4662 | 0.0804 | 0.4341 | 0.0032 |
| Example | E45 | 0.0482 | 0.4341 | 0.0482 | 0.4662 | 0.0032 |
| Example | E46 | 0.0482 | 0.4341 | 0.0482 | 0.4662 | 0.0032 |
| Example | E47 | 0.0577 | 0.4231 | 0.0385 | 0.4744 | 0.0064 |
| Example | E48 | 0.0643 | 0.4180 | 0.0322 | 0.4823 | 0.0032 |
| Example | E49 | 0.0643 | 0.4180 | 0.0322 | 0.4823 | 0.0032 |
| Example | E50 | 0.0804 | 0.4019 | 0.0161 | 0.4984 | 0.0032 |
| Example | E51 | 0.0804 | 0.4019 | 0.0161 | 0.4984 | 0.0032 |
| Example | E52 | 0.0965 | 0.3859 | 0 | 0.5145 | 0.0032 |
| Example | E53 | 0.0965 | 0.3859 | 0 | 0.5145 | 0.0032 |

TABLE 40

Raw material mixture composition (mass ratios) of examples E44-E53

| | | Raw material mixture composition (mass ratios) | | | | |
|---|---|---|---|---|---|---|
| Examples | | Si3N4 | AlN | Al2O3 | Eu2O3 | EuN |
| Example | E44 | 3.59 | 80.81 | 13.05 | 0 | 2.55 |
| Example | E45 | 10.79 | 78.82 | 7.84 | 0 | 2.55 |
| Example | E46 | 10.79 | 78.82 | 7.84 | 0 | 2.55 |
| Example | E47 | 12.27 | 74.09 | 5.95 | 5.13 | 0 |
| Example | E48 | 14.40 | 77.82 | 5.23 | 0 | 2.56 |
| Example | E49 | 14.40 | 77.82 | 5.23 | 0 | 2.56 |
| Example | E50 | 18.01 | 76.82 | 2.62 | 0 | 2.56 |
| Example | E51 | 18.01 | 76.82 | 2.62 | 0 | 2.56 |
| Example | E52 | 21.62 | 75.82 | 0 | 0 | 2.56 |
| Example | E53 | 21.62 | 75.82 | 0 | 0 | 2.56 |

TABLE 41

Firing conditions of examples E44-E53

| Examples | | Firing conditions | | |
|---|---|---|---|---|
| | | Temperature (° C.) | Ambient pressure (mpa) | Time (hour) |
| Example | E44 | 2000° C. | 1 | 2 |
| Example | E45 | 1900° C. | 1 | 2 |
| Example | E46 | 2000° C. | 1 | 2 |
| Example | E47 | 2000° C. | 1 | 2 |
| Example | E48 | 1900° C. | 1 | 2 |
| Example | E49 | 2000° C. | 1 | 2 |
| Example | E50 | 1900° C. | 1 | 2 |
| Example | E51 | 2000° C. | 1 | 2 |
| Example | E52 | 1900° C. | 1 | 2 |
| Example | E53 | 2000° C. | 1 | 2 |

Next, each synthesized compound was ground using an agate mortar and the powder X-ray diffraction measurement using Cu Kα-line was carried out. As a result thereof, it was confirmed that a crystal phase having the same crystal structure as the crystal represented by $Si_xAl_{15-x}O_{3-x}N_{13+x}$ (x=2.3) was produced. Further, it was confirmed that the synthesized material included Eu, Si, Al, N, and O by the measurement of EDS. That is to say, it was confirmed that the synthesized material was an inorganic compound in which Eu as the light-emitting ion was solid solved in the $Si_xAl_{15-x}O_{3-x}N_{13+x}$ system crystal.

After firing, the obtained firing products were crushed coarsely and further ground by hand using a crucible and mortar made of silicon nitride sintered body, and then allowed to pass a 30 μm-mesh sieve. When the particle size distribution was measured, the mean particle diameter was 3~8 μm.

As a result of irradiating light of wavelength of 365 nm emitted by the lamp onto these powder samples, it was confirmed that these powder samples emitted light of blue-to-green color. An emission spectrum and an excitation spectrum of each of the powders were measured using a spectrophotofluorometer. Peak wavelengths of the excitation spectra and peak wavelengths of the emission spectra are shown in Table 42. It was confirmed that the inorganic compounds could be excited by an ultraviolet ray of 300 nm~380 nm and violet or blue light of 380 nm~450 nm and that they were phosphors to emit blue-to-green light.

TABLE 42

Excitation emission characteristics of examples E44-E53

| Examples | | Excitation peak wavelength (nm) | Emission peak wavelength (nm) | Emission intensity (arbitrary unit) |
|---|---|---|---|---|
| Example | E44 | 308 | 536 | 0.08 |
| Example | E45 | 326 | 472 | 1.00 |
| Example | E46 | 285 | 474 | 0.48 |
| Example | E47 | 330 | 472 | 1.29 |
| Example | E48 | 330 | 473 | 1.87 |
| Example | E49 | 333 | 473 | 1.98 |
| Example | E50 | 330 | 478 | 1.74 |
| Example | E51 | 333 | 478 | 1.77 |
| Example | E52 | 301 | 488 | 1.36 |
| Example | E53 | 342 | 482 | 1.47 |

Figure 19:
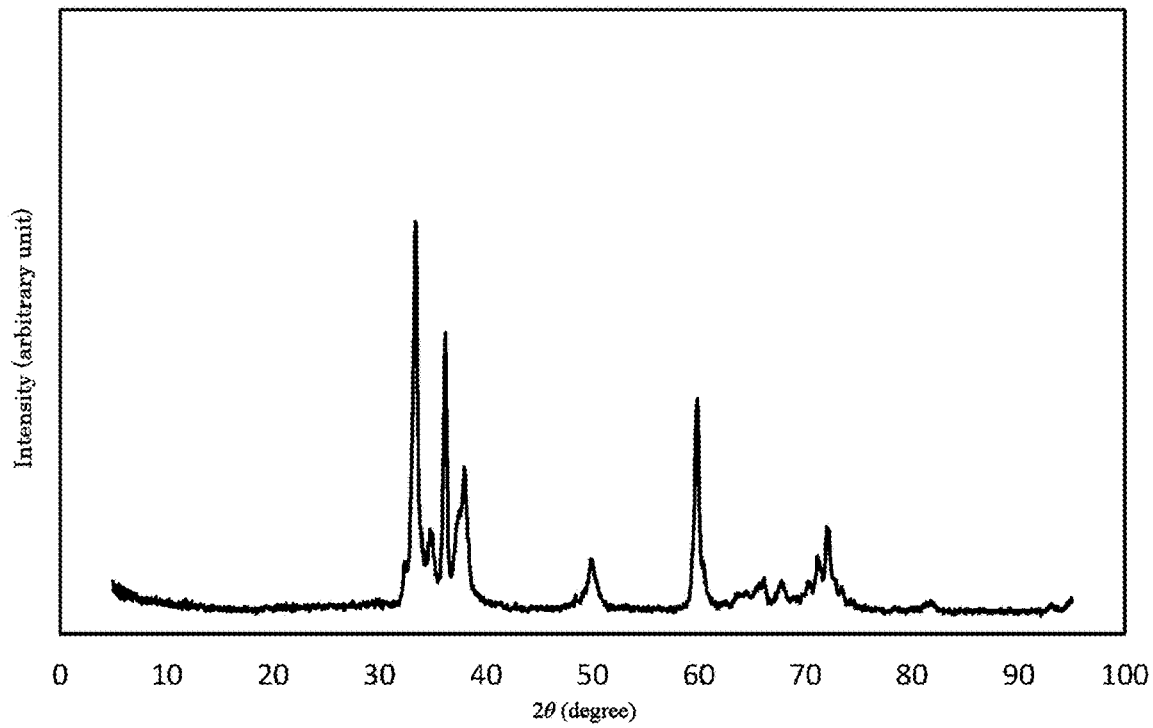
FIG. 19 is a diagram showing a resultant powder X-ray diffraction pattern of a phosphor synthesized in Example E51.

FIG. 19 is a diagram showing a resultant powder X-ray diffraction pattern of a phosphor synthesized in Example E51.

Figure 20:
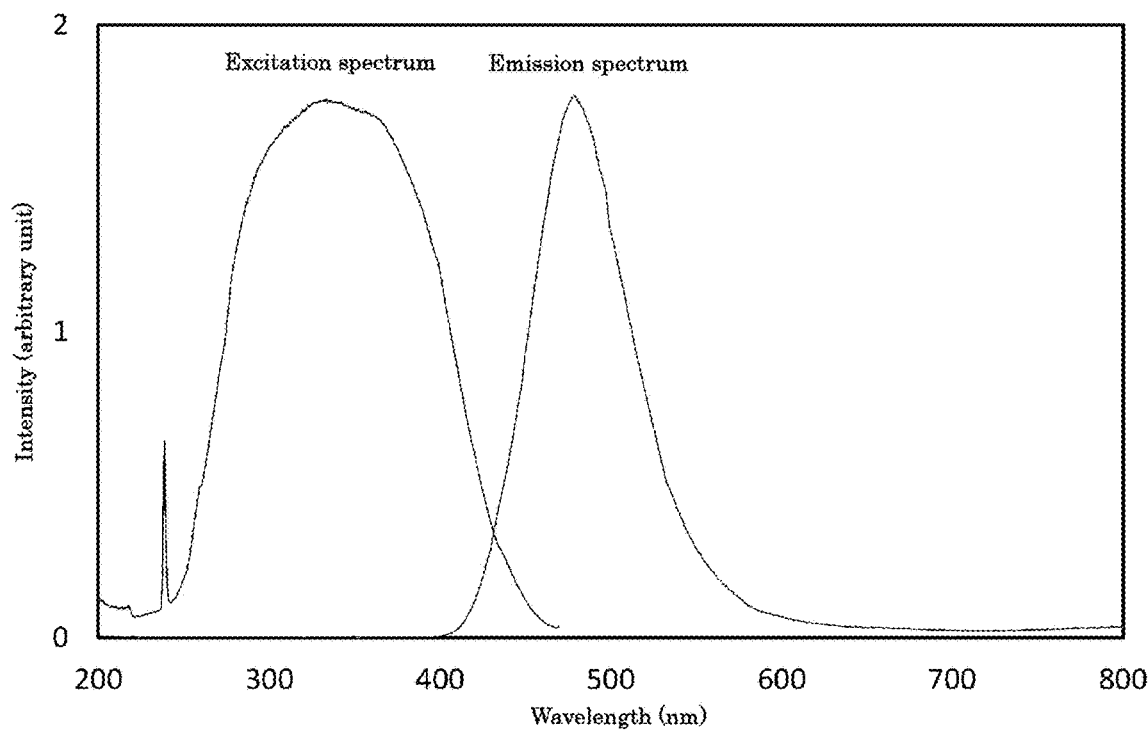
FIG. 20 is a diagram showing an excitation spectrum and an emission spectrum of a phosphor synthesized in Example E51.

FIG. 20 is a diagram showing an excitation spectrum and an emission spectrum of the phosphor synthesized in Example E51.

The results of powder X-ray diffraction of the synthesized phosphors (FIG. 19) show a good agreement with the results of structure analysis (FIG. 10). In Example E51, the measured X-ray diffraction pattern is the same as the $Si_xAl_{15-x}O_{3-x}N_{13+x}$ (x=2.3) crystal, and the crystal having the same crystal structure as the $Si_xAl_{15-x}O_{3-x}N_{13+x}$ (x=2.3) crystal was confirmed to be the main component. In Example E51, it is understood that the phosphor was found to allow excitation at 333 nm most efficiently, and the emission spectrum was found to emit light having a peak at 478 nm when the phosphor was excited by light of 333 nm. Further, an emission color of the phosphor of Example E51 was confirmed to be (0.153, 0.245) in the CIE 1931 chromaticity coordinates.

Examples of Light-Emitting Device and Image Display Device; Examples 60 to 63

Next, a light-emitting device utilizing the phosphor of the present invention will be described.

Example 60

Figure 24:
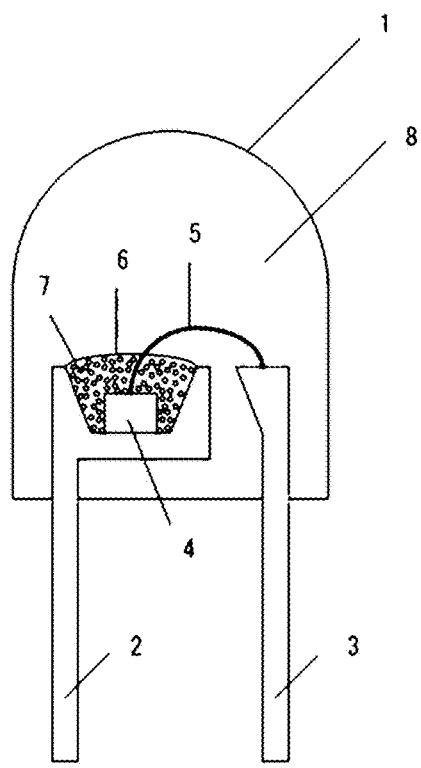
FIG. 24 is a schematic diagram showing an illuminating device (bullet-type of LED illuminating device) according to the present invention.

FIG. 24 is a schematic diagram showing an illuminating device (bullet-type of LED illuminating device) according to the present invention.

A so-called bullet-type white light-emitting diode lamp (1) shown in FIG. 24 was produced. There are two lead wires (2, 3), one of which (2) has a recess, in which an ultraviolet light-emitting diode element (4) having an emission peak of 365 nm is placed. The lower electrode of the ultraviolet light-emitting diode element (4) and the bottom surface of the recess are electrically connected with conductive paste, and the upper electrode and the other lead wire (3) are electrically connected through a gold thin wire (5). The phosphor (7) is dispersed in resin and mounted in the vicinity of the ultraviolet light-emitting diode element (4). The first resin (6) in which this phosphor is dispersed is transparent, and covers the entire ultraviolet light-emitting diode element (4). The tip-top portion of the lead wire including the recess, the ultraviolet light-emitting diode element, and the first resin in which the phosphor is dispersed are sealed with transparent second resin (8). A second resin (8) which is transparent is formed approximately in a cylindrical shape as a whole and the top portion is rounded in a lens shape such that the lamp is generally referred to as a bullet-type.

In the present embodiment, a phosphor prepared for Example A48, B53, C51, D51, or E51 and a red phosphor of $CaAlSiN_3$:Eu were blended with the ratio by weight of 4 to 1 to make a blended phosphor powder, the blended phosphor powder was mixed with epoxy resin by the concentration of 25 wt %, the resultant mixture was dropped by the appropriate amount with a dispenser to make the first resin (6) in which the blended phosphor powder (7) was dispersed. The coloration of the thus-obtained light-emitting device was x=0.45 and y=0.39 and exhibited an incandescent-lamp color.

A so-called bullet-type white light-emitting diode lamp was prepared using a violet light-emitting diode element having an emission peak at 405 nm in the same way and almost the same result was obtained.

Example 61

Figure 25:
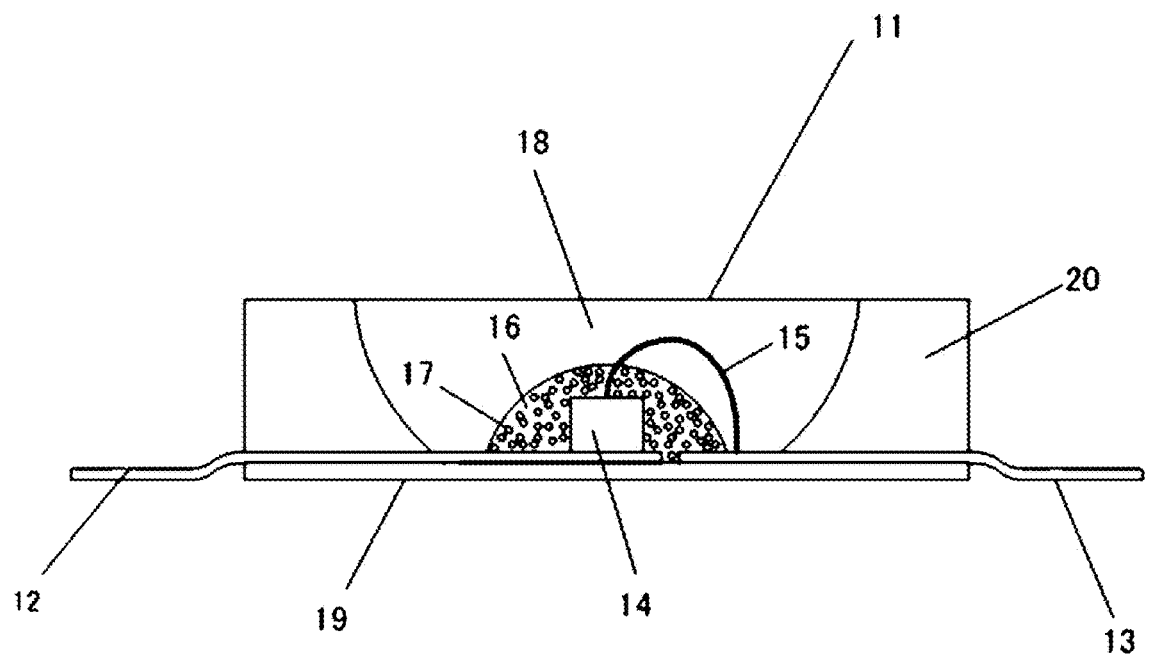
FIG. 25 is a schematic diagram showing an illuminating device (board-mounting-type LED illuminating device) according to the present invention.

FIG. 25 is a schematic diagram showing an illuminating device (board-mounting-type LED illuminating device) according to the present invention.

A chip-type white light-emitting diode lamp (11) for board-mounting as shown in FIG. 25 was produced. Two lead wires (12, 13) are fixed to a white alumina ceramic board (19) having high reflectance of visible light and one end of each of the wires is located at approximately the center portion of the board and the other end of each of the wires extends outside to serve as an electrode to be soldered when the lamp is mounted on the electric board. One of the lead wires (12) has the one end on which a blue light-emitting diode element (14) having an emission peak wavelength of 450 nm is placed and fixed thereto such that the element is located at the center of the board. The lower electrode of the blue light-emitting diode element (14) and the lead wire below are electrically connected with conductive paste, and the upper electrode and the other lead wire (13) are electrically connected to a gold thin wire (15).

A mixture of the first resin (16) and a phosphor (17) including a yellow phosphor of α-SiAlON:Eu and a phosphor prepared in Example A48, B53, C51, D51, or E51, both phosphors being blended with the mass ratio of 7:3, is implemented near the light-emitting diode element. The first resin in which this phosphor is dispersed is transparent, and covers the entire blue color light-emitting diode element (14). Also, a wall surface member (20) having a hole opened at the center portion is fixed to the ceramic board. The wall surface member (20) has the center portion formed as the hole in which the blue color light-emitting diode element (14) and the resin (16) having the phosphor (17) dispersed therein are contained and the portion of the hole facing the center is made to be a slope. This slope is made of a reflective surface for taking out light forward, and the shape of the curved surface of the slope is determined in consideration of the direction of light reflection. Further, at least the surface which constitutes the reflective surface forms a surface having high visible light reflectance with white color or metallic luster. In the present example, the wall surface member (20) is configured with white silicone resin. The hole at the center portion of the wall surface member is formed with a recess as the final shape of the chip-type light-emitting diode lamp, and is filled up with second transparent resin (18) to seal all of the blue light-emitting diode element (14) and the first resin (16) in which the phosphor (17) is dispersed. In the present example, the same epoxy resin was used for both the first resin (16) and second resin (18). The addition ratio of the phosphors was the same as Example 60 and the chromaticity having been achieved was x=0.33 and y=0.33 to exhibit white color.

Next, an example of design of an image display device using the phosphor of the present invention will be explained.

Example 62

Figure 26:
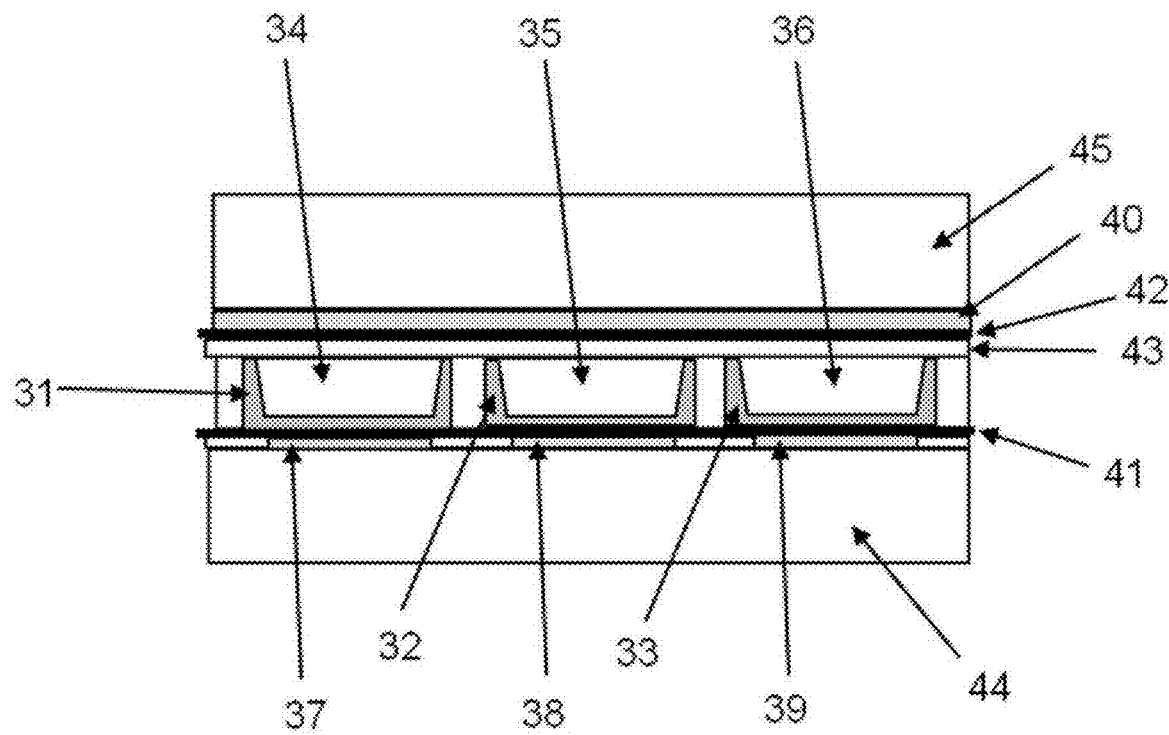
FIG. 26 is a schematic diagram showing an image display device (plasma display panel) according to the present invention.

FIG. 26 is a schematic diagram showing an image display device (plasma display panel) according to the present invention.

A blue phosphor (31) of Example A48, B50, C51, D51, or E51 of the present invention, a green phosphor (β-sialon:Eu$^{2+}$) (32), and a red phosphor (CaAlSiN$_3$:Eu$^{2+}$) (33) are applied to interior surfaces of the respective cells (34, 35, 36), which are arranged via electrodes (37, 38, 39) and a dielectric layer (41) over a glass substrate (44). If electric power is supplied to the electrodes (37, 38, 39, 40), a vacuum ultraviolet ray is generated by Xe discharge in each of the cells, thereby exciting the respective phosphors so as to emit visible light of a red color, a green color, or a blue color such that the emitted light may be observed from the outside through a protective layer (43), a dielectric layer (42), and a glass substrate (45) so as to serve as an image display device.

Example 63

Figure 27:
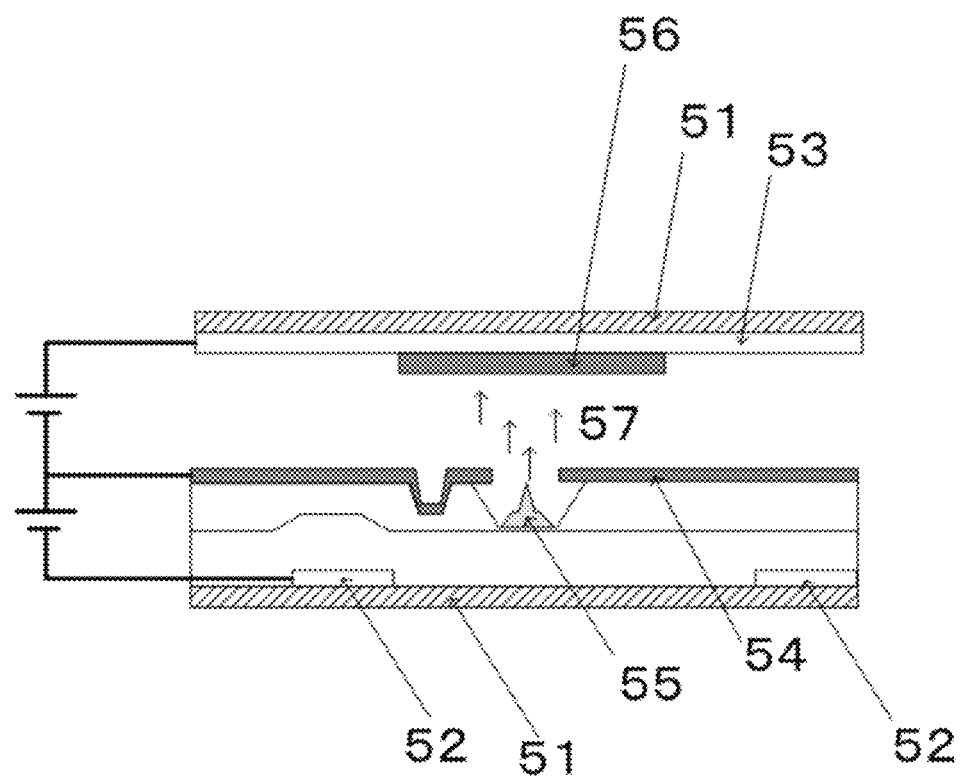
FIG. 27 is a schematic diagram showing an image display device (field emission display panel) according to the present invention.

FIG. 27 is a schematic diagram showing an image display device (field emission display panel) according to the present invention.

A blue phosphor (56) of Example A48, B50, C51, D51, or E51 of the present invention is applied to an interior surface of an anode (53). By applying a voltage between a cathode (52) and a gate (54), electrons (57) are emitted from an emitter (55). The electrons are accelerated by the voltage between the anode (53) and cathode, and impinge on the blue phosphor (56) to excite the phosphor to emit light. The entire device is protected by a glass (51). Although the drawing shows a single light emission cell comprising one emitter and one phosphor, a display is actually configured to emit light of a variety of color by arranging many cells for a red color and a green color in addition to for a blue color. Although the phosphors to be used for cells for a green color and a red color are not particularly specified, a phosphor which exhibits high brightness under a low speed electron beam is preferable.

As mentioned above, in the present application, the following and the like may be provided.

An phosphor comprising an inorganic compound in which an A element (here, A is one or two or more kinds of elements selected from the group consisting of Mn, Ce, Pr, Nd, Sm, Eu, Tb, Dy, and Yb) is solid solved in an inorganic crystal including at least a metal element M and a non-metal element X and being represented by M$_n$X$_{n+1}$ (Here, n is a value in the range of 3≤n≤52; the metal element M includes at least Al (aluminum) and Si (silicon), and if necessary, an L element (L is a metal element other than Al and Si); and the non-metal element X includes at least N (nitrogen), and if necessary, O (oxygen), and if necessary, a Z element (The Z element is a non-metal element other than N and O)), an inorganic crystal having the same crystal structure of the above inorganic crystal, or an inorganic crystal including a solid solution of these crystals.

The above-mentioned all phosphors wherein the inorganic crystal represented by M$_n$X$_{n+1}$ comprises an inorganic crystal represented by Si$_x$Al$_{m+2-x}$O$_{3-x}$N$_{m+x}$ (Here, m=n−2 and 0<x≤3).

The above-mentioned all phosphors wherein the inorganic crystal represented by M$_n$X$_{n+1}$ comprises a homologous structure.

The above-mentioned all phosphors wherein the value of x is in the range of 1.5≤x≤2.9.

The above-mentioned all phosphors wherein the value of x is in the range of 2≤x≤2.9.

The above-mentioned all phosphors wherein the value of m is in the range of 5≤m≤20.

The above-mentioned all phosphors wherein the value of n is a integer.

The above-mentioned all phosphors wherein the value of n is in the range of 9≤n≤15.

The above-mentioned all phosphors wherein the inorganic crystal comprises a crystal in the orthorhombic crystal system.

The above-mentioned all phosphors wherein the inorganic crystal comprises a crystal represented by the space group Cmcm.

The above-mentioned all phosphors wherein the inorganic crystal comprises a crystal in the orthorhombic crystal system and having a symmetry in a space group Cmcm, and lattice constants a1, b1 and c1 have values in the ranges:
a1=0.31±0.05 nm;
b1=1.87±0.2 nm; and
c1=0.275×(n+1)±0.1 nm (Here, 3≤n≤52).
(1) In the case where n is an even number,
the atomic coordinates Mi of the element M included in the unit cell are:
(0, (4+6i−3n)/16±0.05, (¼+(i−1)/(2n))±0.05), wherein 1≤i≤n+1 (It is n+1 in all), and
the atomic coordinates Xi of the element X are:
(0, (4+6i−3n)/16±0.05, (¼+(i−1)/(2n+1))±0.05), wherein 1≤i≤n+2 (It is n+2 in all);
(2) In the case where n is an odd number,
the atomic coordinates Mj of the element M included in the unit cell are:
(0, (8+6j−3n)/16±0.05, (¼+(j−1)/(2n))±0.05), wherein 1≤j≤n+1 (It is n+1 in all), and
the atomic coordinates Xj of the element X are:
(0, (4+6j−3n)/16±0.05, (¼+(j−1)/(2n+1))±0.05), wherein 1≤j≤n+2 (It is n+2 in all).

The phosphor wherein the inorganic compound is represented by the composition formula of $Si_aAl_bO_cN_dA_eQ_f$ (Here, a+b+c+d+e+f=1 in the formula and A may be one or two or more kinds of elements selected from the group consisting of Mn, Ce, Pr, Nd, Sm, Eu, Tb, Dy, and Yb, and Q may be one or two or more kinds of elements selected from the group consisting of elements other than Al, Si, O, N, and the element A.) and parameters a, b, c, d, e, and f satisfy every condition recited below:
0.0117≤a≤0.3472,
0.0694≤b≤0.4812,
0≤c≤0.2283,
0.3261≤d≤0.53,
0.0001≤e≤0.03, and
0≤f≤0.3 (Here, if the element Q includes a plurality of elements, f is the sum of respective parameters of the plurality of elements).

The above-mentioned all phosphors wherein the inorganic crystal represented by $M_nX_{n+1}$ comprises an inorganic crystal represented by $Si_xAl_{11-x}O_{3-x}N_{9+x}$ (Here, 0<x≤3).

The above-mentioned all phosphors wherein the inorganic crystal represented by $Si_xAl_{11-x}O_{3-x}N_{9+x}$, the inorganic crystal having the same crystal structure as the above-mentioned inorganic crystal, or the inorganic crystal including a solid solution of these comprises a crystal in the orthorhombic crystal system and having a symmetry in a space group Cmcm, and lattice constants a1, b1 and c1 have values in the ranges:
a1=0.30697±0.05 nm;
b1=1.86460±0.05 nm; and
c1=3.29300±0.05 nm.

The above-mentioned all phosphors wherein the inorganic crystal having the same crystal structure comprises an inorganic crystal represented by $(Si,Al)_{11}(O,N)_{12}$.

The above-mentioned all phosphors wherein the inorganic crystal represented by $M_nX_{n+1}$ comprises an inorganic crystal represented by $Si_xAl_{12-x}O_{3-x}N_{10+x}$ (Here, 0<x≤3).

The above-mentioned all phosphors wherein the inorganic crystal represented by $Si_xAl_{12-x}O_{3-x}N_{10+x}$, the inorganic crystal having the same crystal structure as the above-mentioned inorganic crystal, or the inorganic crystal including a solid solution of these comprises a crystal in the orthorhombic crystal system and having a symmetry in a space group Cmcm, and lattice constants a1, b1 and c1 have values in the ranges:
a1=0.30745±0.05 nm;
b1=1.86919±0.05 nm; and
c1=3.57830±0.05 nm.

The above-mentioned all phosphors wherein the inorganic crystal having the same crystal structure comprises an inorganic crystal represented by $(Si,Al)_{12}(O,N)_{13}$.

The above-mentioned all phosphors wherein the inorganic crystal represented by $M_nX_{n+1}$ comprises an inorganic crystal represented by $Si_xAl_{13-x}O_{3-x}N_{11+x}$ (Here, 0<x≤3).

The above-mentioned all phosphors wherein the inorganic crystal represented by $Si_xAl_{13-x}O_{3-x}N_{11+x}$, the inorganic crystal having the same crystal structure as the above-mentioned inorganic crystal, or the inorganic crystal including a solid solution of these comprises a crystal in the orthorhombic crystal system and having a symmetry in a space group Cmcm, and lattice constants a1, b1 and c1 have values in the ranges:
a1=0.30749±0.05 nm;
b1=1.87065±0.05 nm; and
c1=3.85432±0.05 nm.

The above-mentioned all phosphors wherein the inorganic crystal having the same crystal structure comprises an inorganic crystal represented by $(Si,Al)_{13}(O,N)_{14}$.

The above-mentioned all phosphors wherein the inorganic crystal represented by $M_nX_{n+1}$ comprises an inorganic crystal represented by $Si_xAl_{14-x}O_{3-x}N_{12+x}$ (Here, 0<x≤3).

The above-mentioned all phosphors wherein the inorganic crystal represented by $Si_xAl_{14-x}O_{3-x}N_{12+x}$, the inorganic crystal having the same crystal structure as the above-mentioned inorganic crystal, or the inorganic crystal including a solid solution of these comprises a crystal in the orthorhombic crystal system and having a symmetry in a space group Cmcm, and lattice constants a1, b1 and c1 have values in the ranges:
a1=0.30722±0.05 nm;
b1=1.87210±0.05 nm; and
c1=4.14890±0.05 nm.

The above-mentioned all phosphors wherein the inorganic crystal having the same crystal structure comprises an inorganic crystal represented by $(Si,Al)_{14}(O,N)_{15}$.

The above-mentioned all phosphors wherein the inorganic crystal represented by $M_nX_{n+1}$ comprises an inorganic crystal represented by $Si_xAl_{15-x}O_{3-x}N_{13+x}$ (Here, 0<x≤3).

The above-mentioned all phosphors wherein the inorganic crystal represented by $Si_xAl_{15-x}O_{3-x}N_{13+x}$, the inorganic crystal having the same crystal structure as the above-mentioned inorganic crystal, or the inorganic crystal including a solid solution of these comprises a crystal in the orthorhombic crystal system and having a symmetry in a space group Cmcm, and lattice constants a1, b1 and c1 have values in the ranges:
a1=0.30810±0.05 nm;
b1=1.87354±0.05 nm; and
c1=4.41775±0.05 nm.

The above-mentioned all phosphors wherein the inorganic crystal having the same crystal structure comprises an inorganic crystal represented by $(Si,Al)_{15}(O,N)_{16}$.

The above-mentioned all phosphors wherein the A element comprises Eu.

The above-mentioned all phosphors wherein the inorganic compound comprises a single crystal particle or an aggregate of single crystal particles having a mean particle diameter of at least 0.1 μm and not exceeding 40 μm.

The above-mentioned all phosphors wherein the inorganic compound comprises a mixture of a phosphor including any of the above-mentioned all inorganic compounds and another crystal phase or an amorphous phase and the content of the phosphor is at least 20 mass %.

The above-mentioned all phosphors wherein fluorescence having a peak at the wavelength in the range from 460 nm to 500 nm is emitted upon irradiation by an excitation source.

The above-mentioned all phosphors wherein the excitation source comprises a vacuum ultraviolet ray, an ultraviolet ray, or visible light having a wavelength that is at least 100 nm and not exceeding 420 nm, or an electron beam or an X-ray.

A method of manufacturing any of the above-mentioned all phosphors comprises the step of firing a raw material mixture, which is a mixture of metal compounds and could constitute the phosphor as recited in claim 1 by firing, in an inert atmosphere including nitrogen at a temperature range of at least 1200° C. and not exceeding 2200° C.

The above-mentioned all methods of manufacturing the phosphor wherein the mixture of metal compounds includes AlN and/or $Al_2O_3$, $Si_3N_4$ and an oxide or a nitride of the element A (Here, the element A is one or two or more kinds of elements selected from the group consisting of Mn, Ce, Pr, Nd, Sm, Eu, Tb, Dy, and Yb).

The above-mentioned all methods of manufacturing the phosphor wherein the metal compounds in a state of powder or aggregate is fired after the metal compounds are filled in a container with a filling rate kept at the bulk density of 40% or lower.

A light emitting device comprising at least a light-emitting body and a phosphor wherein the phosphor utilizes at least one of the above-mentioned all phosphors.

The above-mentioned all light emitting devices wherein the light-emitting body comprises an organic EL light-emitting body (OLED), a semiconductor laser, a laser diode (LD), or a light-emitting diode (LED), which emits light of wavelength from 330~500 nm.

The above-mentioned all light emitting devices wherein the light-emitting device comprises a white color light-emitting diode, an illuminating device including a plurality of white color light-emitting diodes, or a backlight for a liquid-crystal display panel.

The above-mentioned all light emitting devices wherein the light-emitting body emits an ultraviolet ray or visible light having a peak wavelength of 300~450 nm, and light of a white color or another color other than the white color is emitted by mixing light of a blue color or a green color emitted by the phosphor recited in claim 1 and light having the wavelength of 450 nm or longer emitted by another phosphor.

An image display device comprising: an excitation source and a phosphor wherein the phosphor includes at least one phosphor of the above-mentioned all phosphors.

The above-mentioned all image display devices wherein the image display device comprises any one of a fluorescent display (VFD), a field emission display (FED), a plasma display panel (PDP), a cathode-ray tube (CRT), or a liquid crystal display (LCD).

A pigment comprising at least one of the above-described all phosphors.

An ultraviolet absorber comprising at least one of the above-described all phosphors.

INDUSTRIAL APPLICABILITY

The nitride phosphor of the present invention has different emission characteristics (emission color and excitation characteristics, emission spectrum) from those of the conventional phosphor, exhibits high emission intensity in the case where it is combined with a LED of 470 nm or less, is chemically and thermally stable, and further has little degradation in the intensity of the phosphor when it is exposed to the excitation source such that it is a nitride phosphor to be used suitably for the VFD, the FED, the PDP, the CRT, and the white LED. It is expected that the phosphor of the present invention will be utilized in material design in various kinds of display devices in the future so as to contribute to the development of the industry.

EXPLANATION OF NUMERALS 1. bullet-type light-emitting diode lamp.
2, 3. lead wire.
4. light-emitting diode element.
5. gold thin wire.
6, 8. resin.
7. phosphor
11. chip-type white light-emitting diode lamp for board-mounting.
12, 13. lead wire.
14. light-emitting diode element.
15 gold thin wire.
16, 18. resin.
17. phosphor.
19. alumina ceramic board.
20. wall surface member.
31. blue phosphor.
32. green phosphor.
33. red phosphor.
34, 35, 36. ultraviolet ray emission cell.
37, 38, 39, 40. electrode.
41, 42. dielectric layer.
43. protective layer.
44, 45. glass substrate.
51 glass.
52 cathode.
53 anode.
54 gate.
55 emitter.
56 phosphor.
57 electrons.

What is claimed is:

1. A phosphor comprising: an inorganic compound in which an A element (wherein A comprises one or two or more kinds of elements selected from the group consisting of Mn, Ce, Pr, Nd, Sm, Eu, Tb, Dy, and Yb) is solid solved in an inorganic crystal including at least a metal element M and a non-metal element X and being represented by $M_nX_{n+1}$ (wherein n is a value in the range of $3 \leq n \leq 52$, wherein the metal element M comprises at least Al (aluminum), Si (silicon), and if necessary, an L element (wherein the L element comprises a metal element other than Al and Si), and wherein the non-metal element X comprises at least N (nitrogen), and if necessary, O (oxygen), and if necessary, an Z element (the Z element comprises a non-metal element other than N and O)), an inorganic crystal having a same crystal structure thereof, or an inorganic crystal comprising a solid solution of these crystals, wherein the inorganic crystal comprises a crystal in an orthorhombic crystal system and having a symmetry in a space group Cmcm, wherein the inorganic crystal represented by $M_nX_{n+1}$ comprises at least one selected from a group consisting of an inorganic crystal represented by $Si_xAl_{11-x}O_{3-x}N_{9+x}$ (wherein $0<x\leq3$), an inorganic crystal represented by $Si_xAl_{12-x}O_{3-x}N_{10+x}$ (wherein $0<x\leq3$), an inorganic crystal represented by $Si_xAl_{14-x}O_{3-x}N_{12+x}$ (wherein 0<x≤3), and an inorganic crystal represented by $Si_xAl_{15-x}O_{3-x}N_{13+x}$ (wherein 0<x≤3).

2. The phosphor according to claim 1 wherein:
the inorganic crystal represented by $M_nX_{n+1}$ comprises the inorganic crystal represented by $Si_xAl_{11-x}O_{3-x}N_{9+x}$, and
the inorganic crystal represented by $Si_xAl_{11-x}O_{3-x}N_{9+x}$, the inorganic crystal having a same crystal structure thereof, or the inorganic crystal comprising a solid solution of these crystals comprises lattice constants a1, b1 and c1 having values in ranges:
a1=0.30697±0.05 nm;
b1=1.86460±0.05 nm; and
c1=3.29300±0.05 nm.

3. The phosphor according to claim 1 wherein:
the inorganic crystal represented by $M_nX_{n+1}$ comprises the inorganic crystal represented by $Si_xAl_{12-x}O_{3-x}N_{10+x}$, and
the inorganic crystal represented by $Si_xAl_{12-x}O_{3-x}N_{10+x}$, the inorganic crystal having a same crystal structure thereof, or the inorganic crystal comprising a solid solution of these crystals comprises lattice constants a1, b1 and c1 having values in ranges:
a1=0.30745±0.05 nm;
b1=1.86919±0.05 nm; and
c1=3.57830±0.05 nm.

4. The phosphor according to claim 1 wherein:
the inorganic crystal represented by $M_nX_{n+1}$ comprises the inorganic crystal represented by $Si_xAl_{14-x}O_{3-x}N_{12+x}$, and
the inorganic crystal represented by $Si_xAl_{14-x}O_{3-x}N_{12+x}$, the inorganic crystal having a same crystal structure thereof, or the inorganic crystal comprising a solid solution of these crystals comprises lattice constants a1, b1 and c1 having values in ranges:
a1=0.30722±0.05 nm;
b1=1.87210±0.05 nm; and
c1=4.14890±0.05 nm.

5. The phosphor according to claim 1 wherein:
the inorganic crystal represented by $M_nX_{n+1}$ comprises the inorganic crystal represented by $Si_xAl_{15-x}O_{3-x}N_{13+x}$, and
the inorganic crystal represented by $Si_xAl_{15-x}O_{3-x}N_{13+x}$, the inorganic crystal having a same crystal structure thereof, or the inorganic crystal comprising a solid solution of these crystals comprises lattice constants a1, b1 and c1 having values in ranges:
a1=0.30810±0.05 nm;
b1=1.87354±0.05 nm; and
c1=4.41775±0.05 nm.

6. A method of manufacturing a phosphor as recited in claim 1 comprises the step of:
firing a raw material mixture comprising a mixture of metal compounds and being capable of constituting the phosphor as recited in claim 1 by firing, in an inert atmosphere including nitrogen at a temperature range of at least 1200° C. and not exceeding 2200° C.

7. A light emitting device comprising at least a light-emitting body and a phosphor wherein the phosphor as recited in claim 1 is utilized.

8. An image display device comprising an excitation source and a phosphor wherein the phosphor comprising a phosphor as recited in claim 1.

9. A pigment comprising a phosphor as recited in claim 1.

10. An ultraviolet absorber comprising a phosphor as recited in claim 1.

* * * * *